US010217665B2

(12) United States Patent
Masuoka et al.

(10) Patent No.: US 10,217,665 B2
(45) Date of Patent: Feb. 26, 2019

(54) SEMICONDUCTOR DEVICE AND METHOD FOR PRODUCING SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/743,612

(22) Filed: Jun. 18, 2015

(65) Prior Publication Data

US 2016/0064508 A1    Mar. 3, 2016

(30) Foreign Application Priority Data

Aug. 28, 2014  (WO) .................. PCT/JP2014/072563

(51) Int. Cl.
*H01L 29/51*     (2006.01)
*H01L 27/115*    (2017.01)
(Continued)

(52) U.S. Cl.
CPC .. *H01L 21/76883* (2013.01); *H01L 21/76897* (2013.01); *H01L 29/66666* (2013.01); *H01L 29/7827* (2013.01)

(58) Field of Classification Search
CPC ......... H01L 21/76883; H01L 21/76897; H01L 29/6666; H01L 29/7827; H01L 27/0207;
(Continued)

(56) References Cited

U.S. PATENT DOCUMENTS 5,208,172 A  *  5/1993  Fitch ............... H01L 21/823487
                                                      257/E21.41
5,252,849 A  *  10/1993  Fitch .................. H01L 21/8221
                                                      257/329
(Continued)

FOREIGN PATENT DOCUMENTS

EP     1804286 A1  *  7/2007  ............. B82Y 10/00
JP     H02-071556 A     3/1990
(Continued)

OTHER PUBLICATIONS

English language translation of International Preliminary Report on Patentability in corresponding International Application No. PCT/JP2014/072563, dated Mar. 9, 2017, 10 pages.

*Primary Examiner* — Cuong Q Nguyen
*Assistant Examiner* — Ernest Allen, III
(74) *Attorney, Agent, or Firm* — Brinks Gilson & Lione

(57) ABSTRACT

A semiconductor device includes a first pillar-shaped semiconductor layer formed on a semiconductor substrate; a first first-conductivity-type semiconductor layer formed in the first pillar-shaped semiconductor layer; a third first-conductivity-type semiconductor layer formed in the first pillar-shaped semiconductor layer and located at a higher position than the first first-conductivity-type semiconductor layer; a first gate insulating film formed so as to surround a region of the first pillar-shaped semiconductor layer sandwiched between the first first-conductivity-type semiconductor layer and the third first-conductivity-type semiconductor layer; a first gate formed so as to surround the first gate insulating film; a second gate insulating film formed so as to surround a region of the first pillar-shaped semiconductor layer sandwiched between the first first-conductivity-type semiconductor layer and the third first-conductivity-type semiconductor layer; and a second gate formed so as to surround the (Continued)

second gate insulating film, wherein the first gate and the second gate are mutually connected.

6 Claims, 60 Drawing Sheets

(51) Int. Cl.
    *H01L 21/768* (2006.01)
    *H01L 29/66* (2006.01)
    *H01L 29/78* (2006.01)

(58) Field of Classification Search
    CPC . H01L 27/115; H01L 29/42392; H01L 29/511
    See application file for complete search history.

(56) References Cited

U.S. PATENT DOCUMENTS

| | | | | |
|---|---|---|---|---|
| 5,308,778 A | * | 5/1994 | Fitch | H01L 21/8221 |
| | | | | 257/E21.41 |
| 5,612,563 A | * | 3/1997 | Fitch | H01L 21/76897 |
| | | | | 257/329 |
| 5,912,474 A | | 6/1999 | Yamazaki | |
| 2008/0067495 A1 | * | 3/2008 | Verhulst | B82Y 10/00 |
| | | | | 257/12 |
| 2008/0067607 A1 | * | 3/2008 | Verhulst | B82Y 10/00 |
| | | | | 257/371 |

FOREIGN PATENT DOCUMENTS

| | | |
|---|---|---|
| JP | H02-188966 A | 7/1990 |
| JP | H03-145761 A | 6/1991 |
| JP | 06-013623 A | 1/1994 |
| JP | 08-213477 A | 8/1996 |
| JP | 10-112543 A | 4/1998 |
| JP | 2000-91578 A | 3/2000 |
| JP | 2001-44279 A | 2/2001 |
| JP | 2005-268438 A | 9/2005 |
| JP | 2007-525004 A | 8/2007 |
| JP | 2007-250652 A | 9/2007 |
| JP | 2008-300558 A | 12/2008 |
| JP | 2009-117843 A | 5/2009 |
| JP | 2011-023543 A | 2/2011 |
| JP | 2014-057068 A | 3/2014 |

* cited by examiner

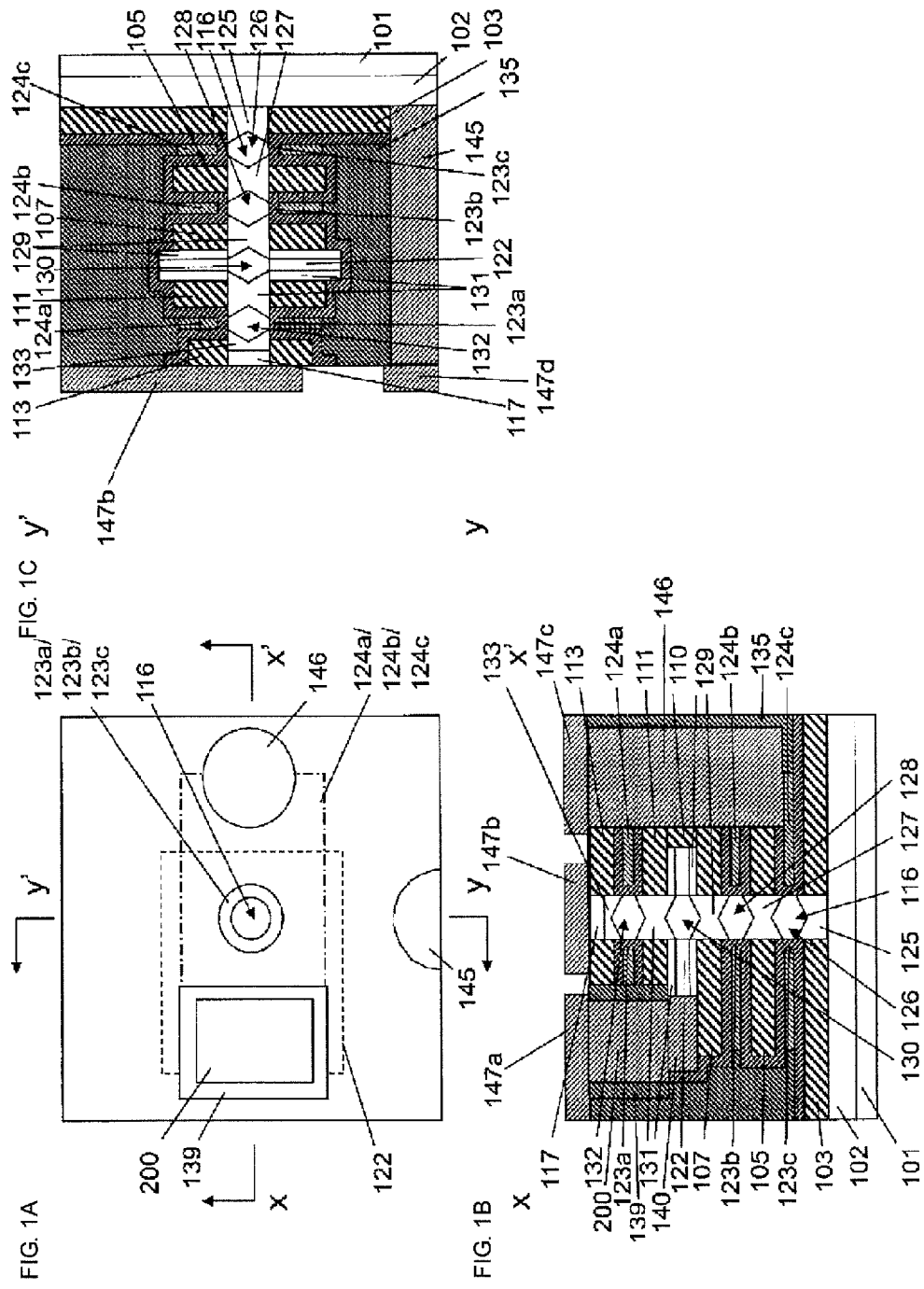

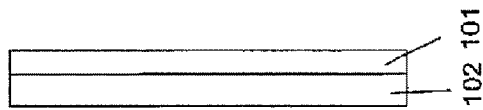
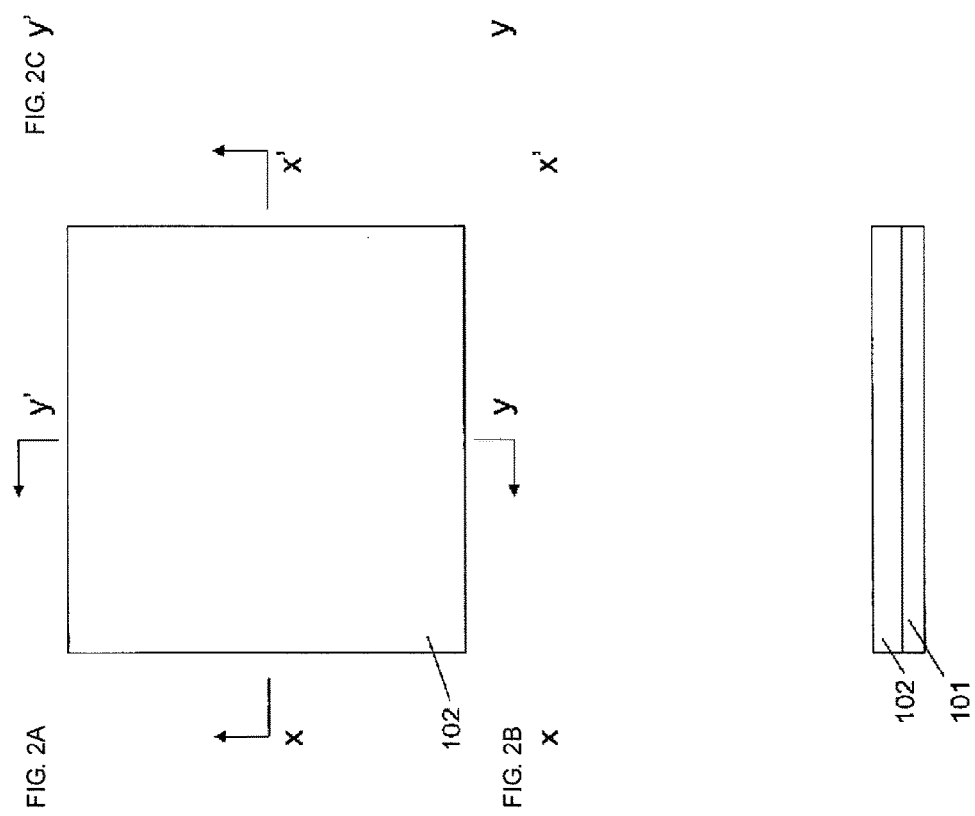

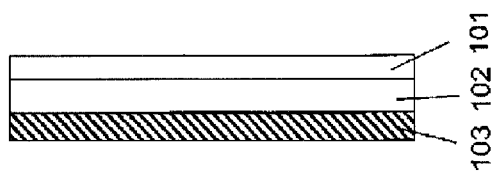
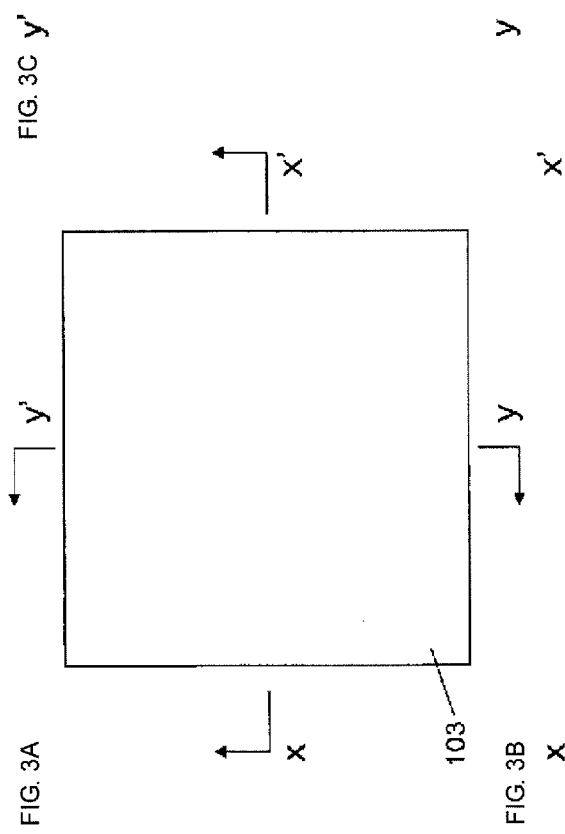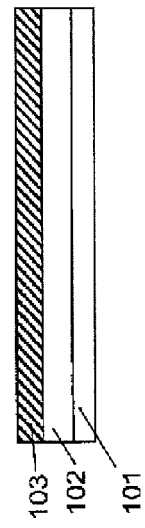

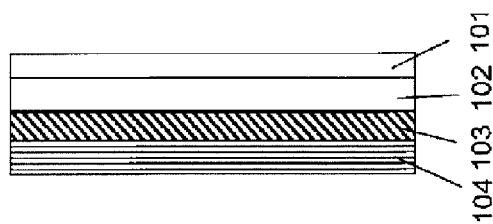
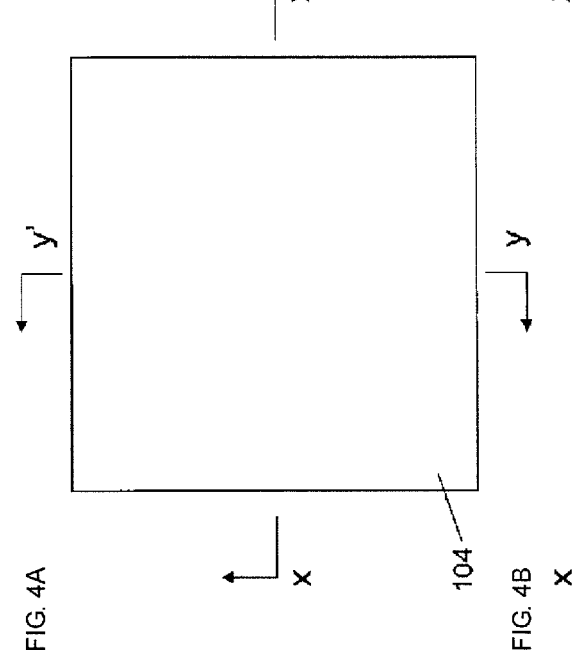
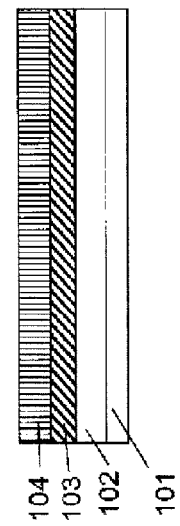

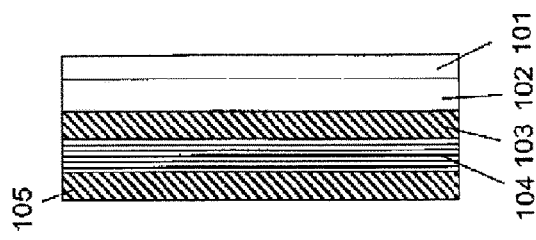
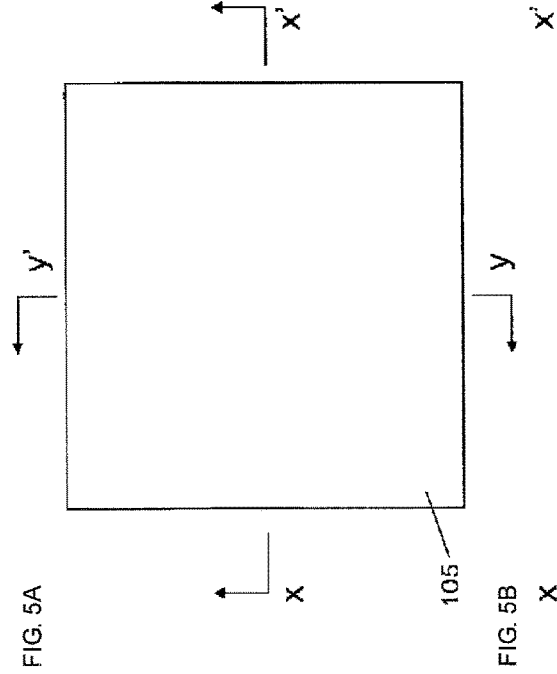
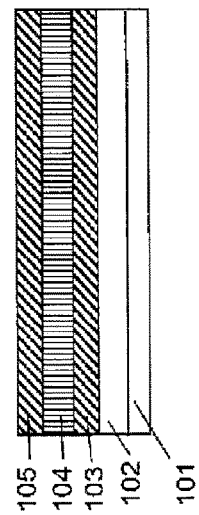

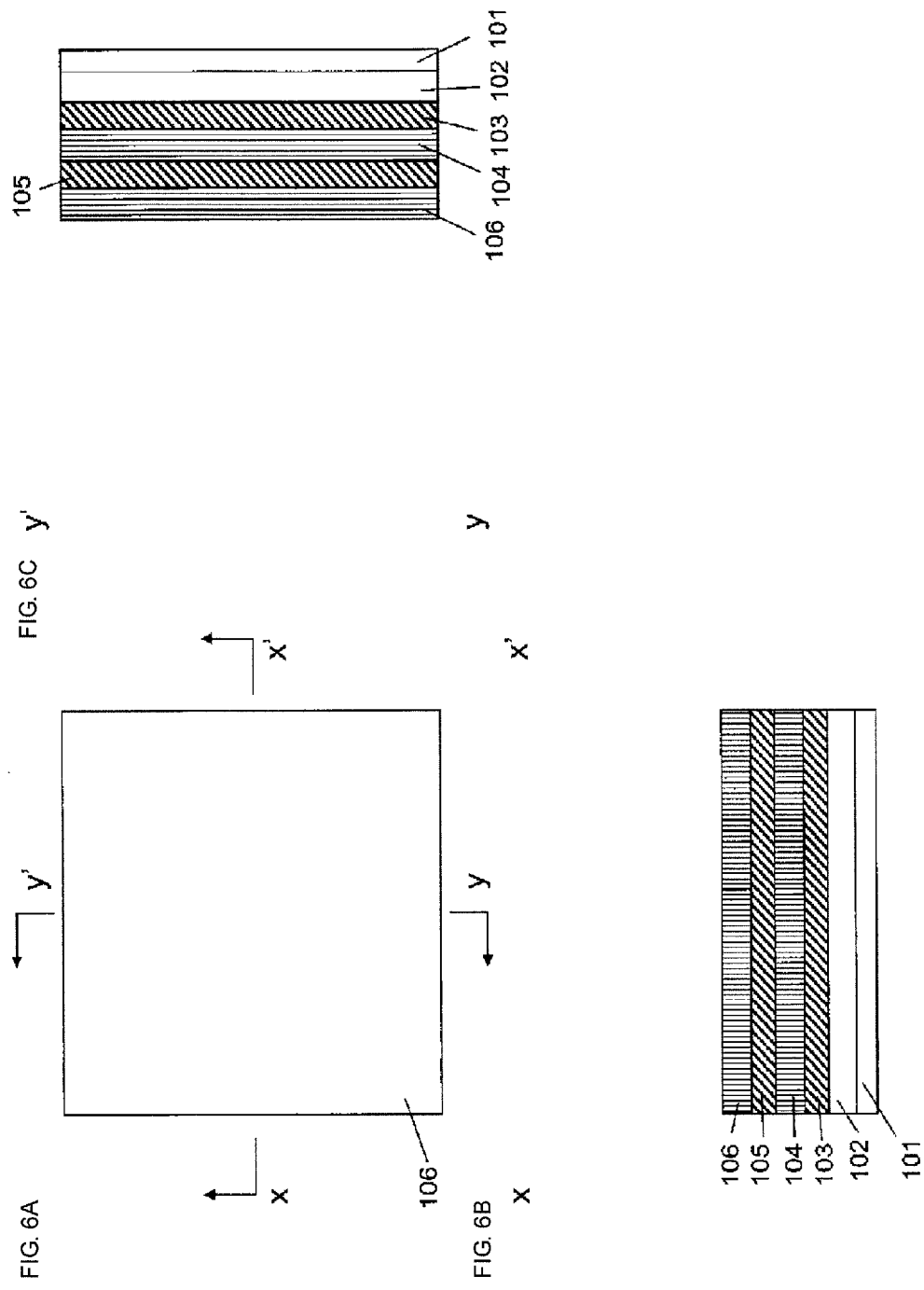

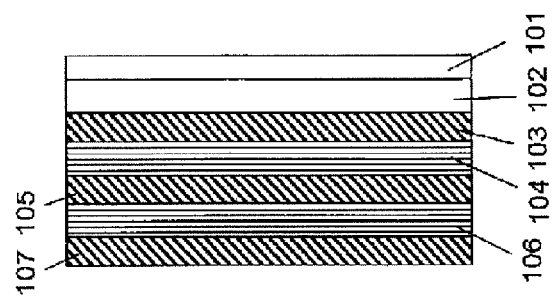
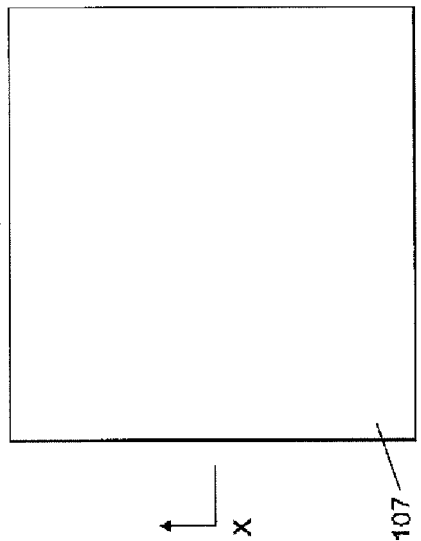
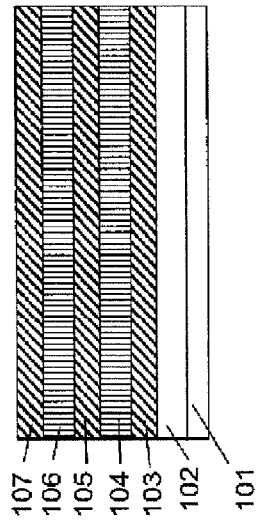
FIG. 7A
FIG. 7B
FIG. 7C

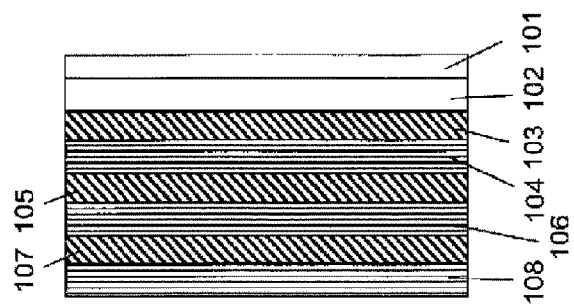
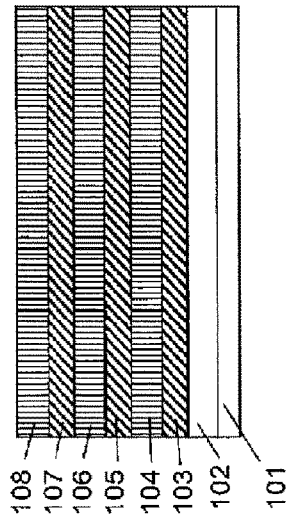
FIG. 8A
FIG. 8B
FIG. 8C

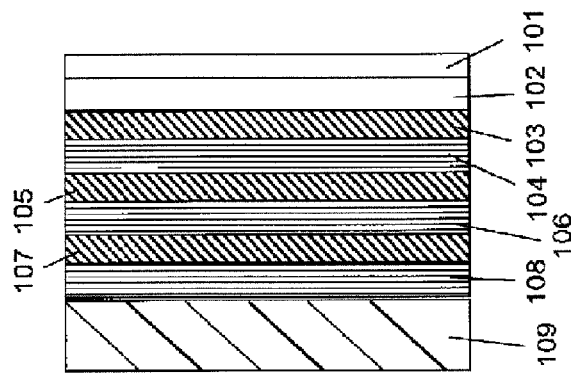
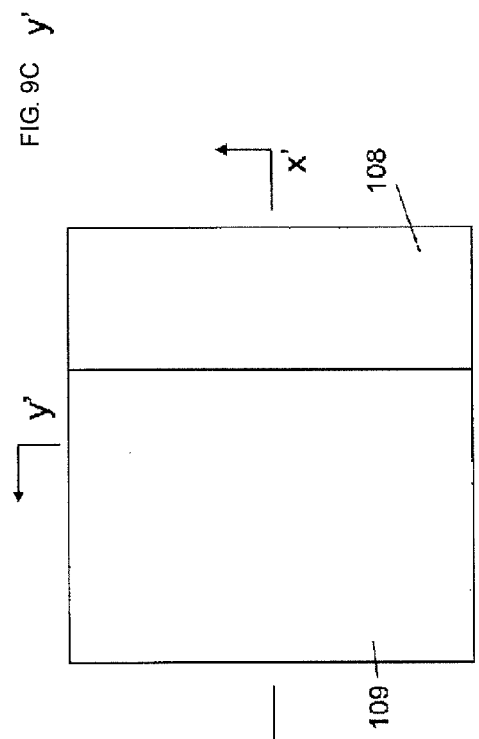
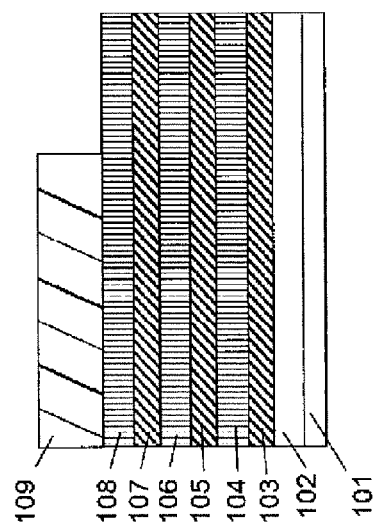
FIG. 9A
FIG. 9B
FIG. 9C

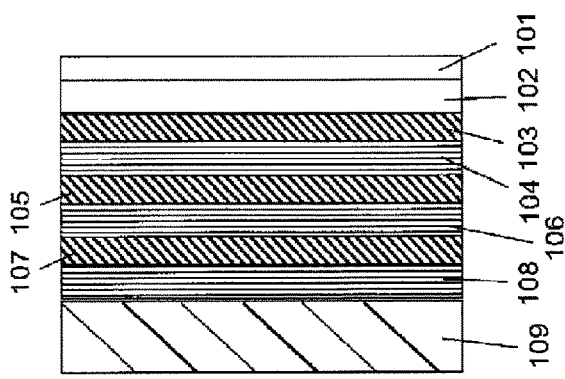
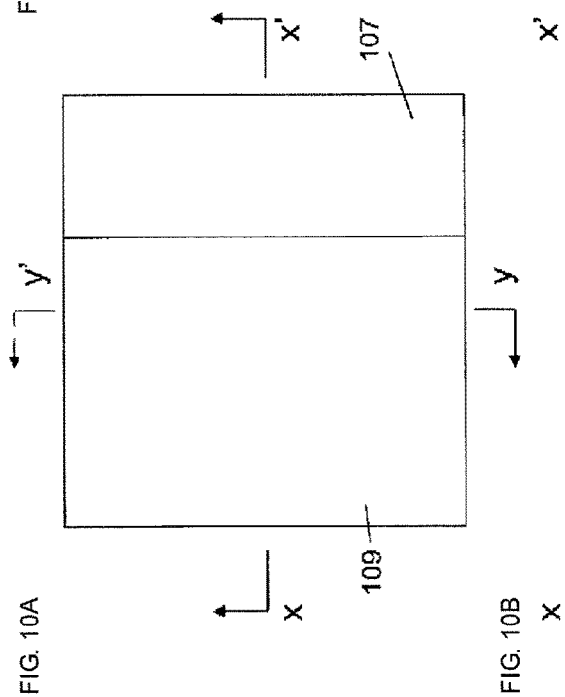
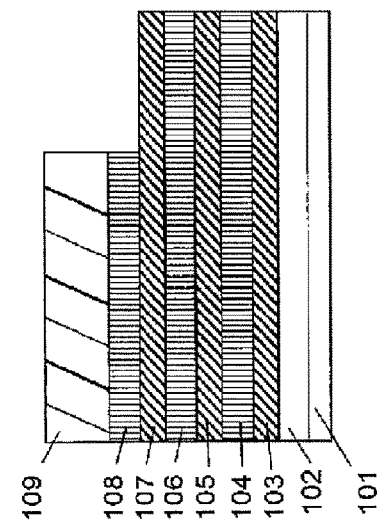
FIG. 10C
FIG. 10A
FIG. 10B

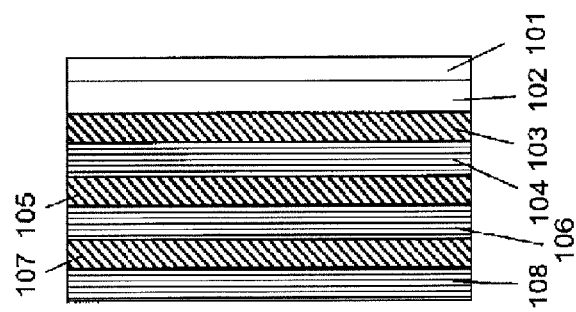
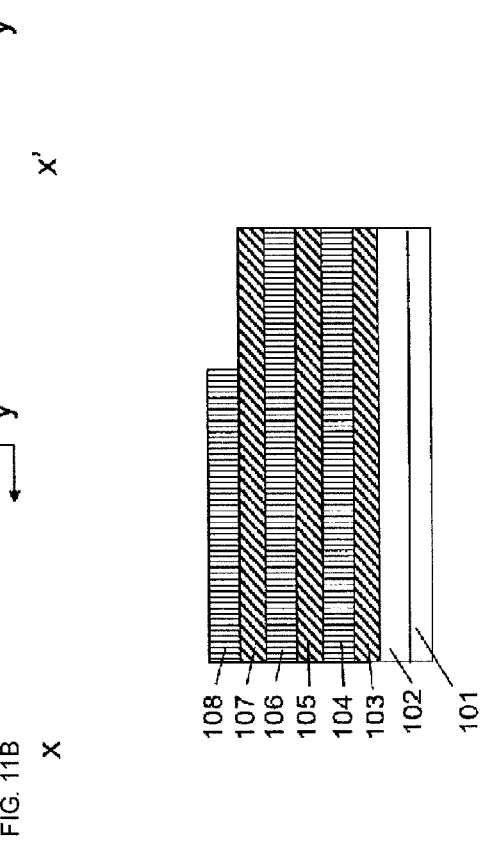
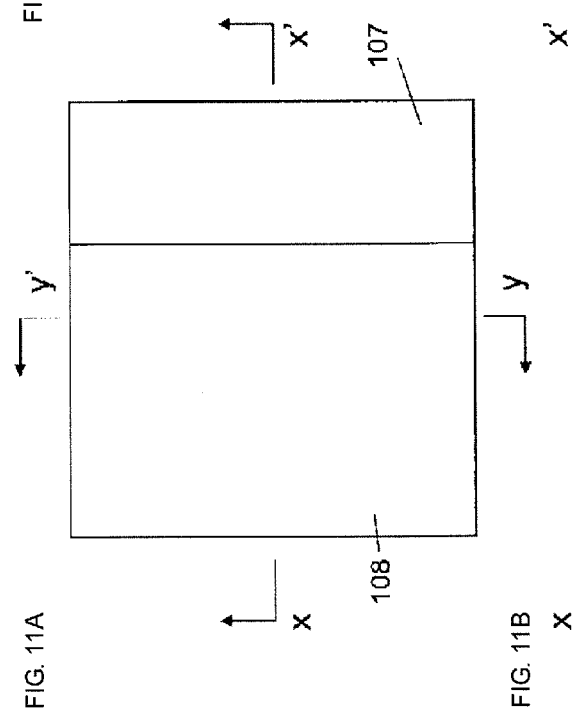
FIG. 11A
FIG. 11B
FIG. 11C

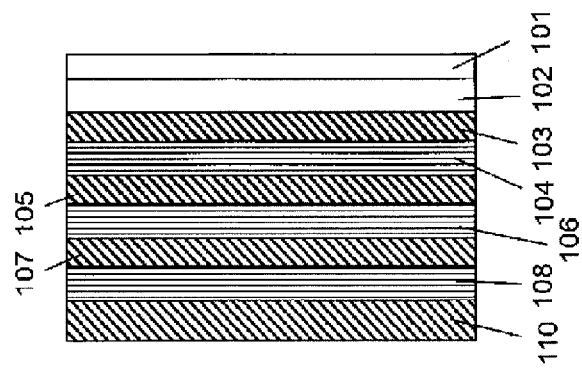
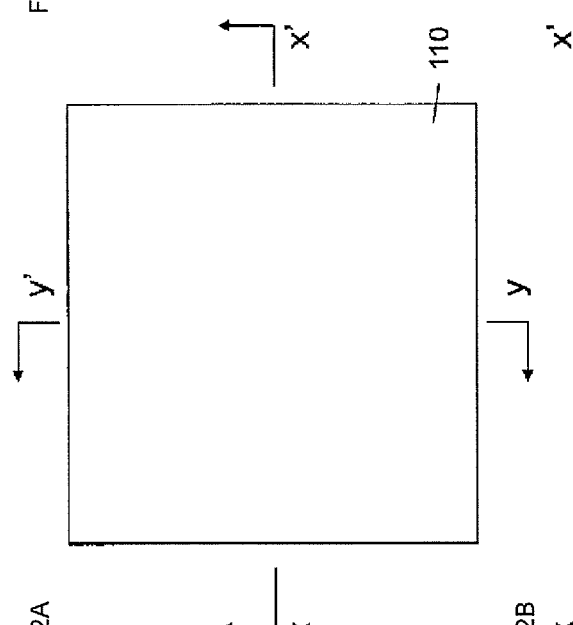
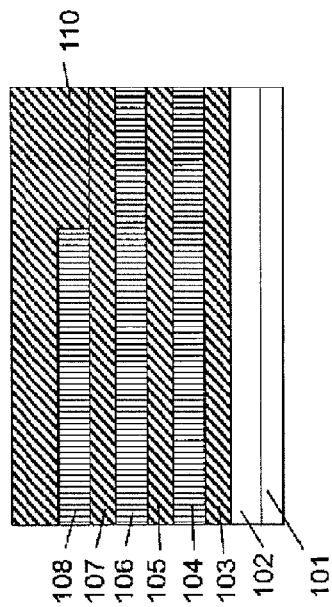
FIG. 12A
FIG. 12B
FIG. 12C

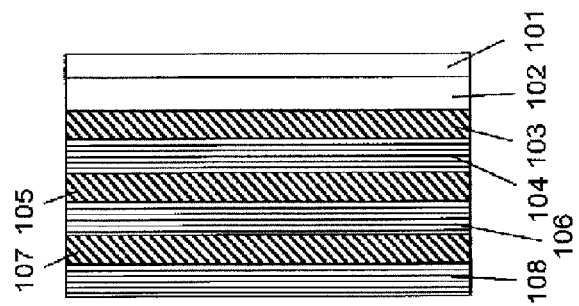
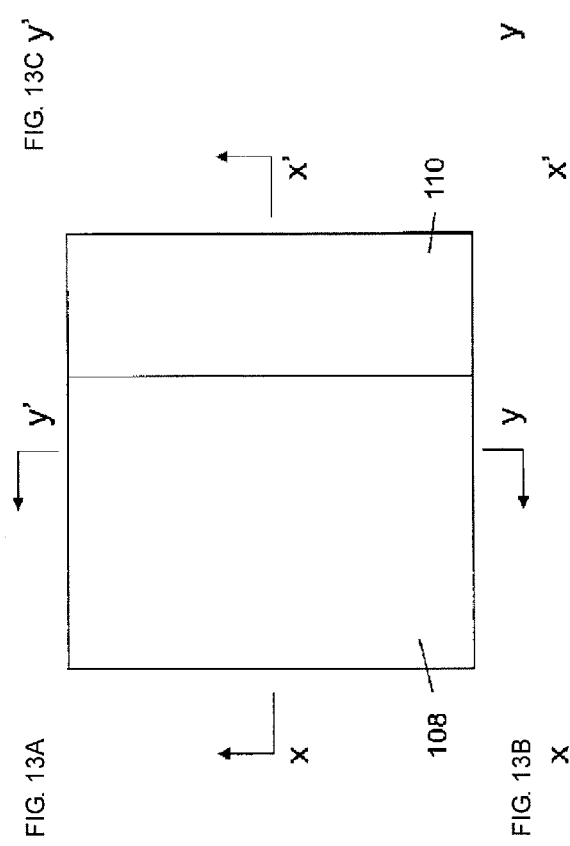
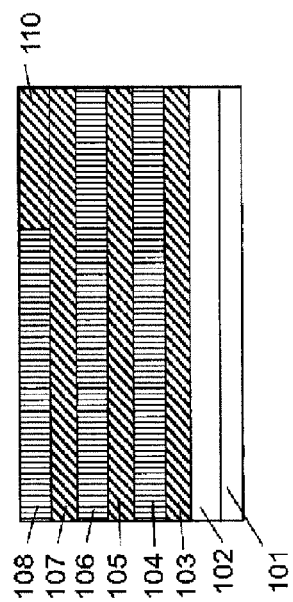
FIG. 13A
FIG. 13B
FIG. 13C

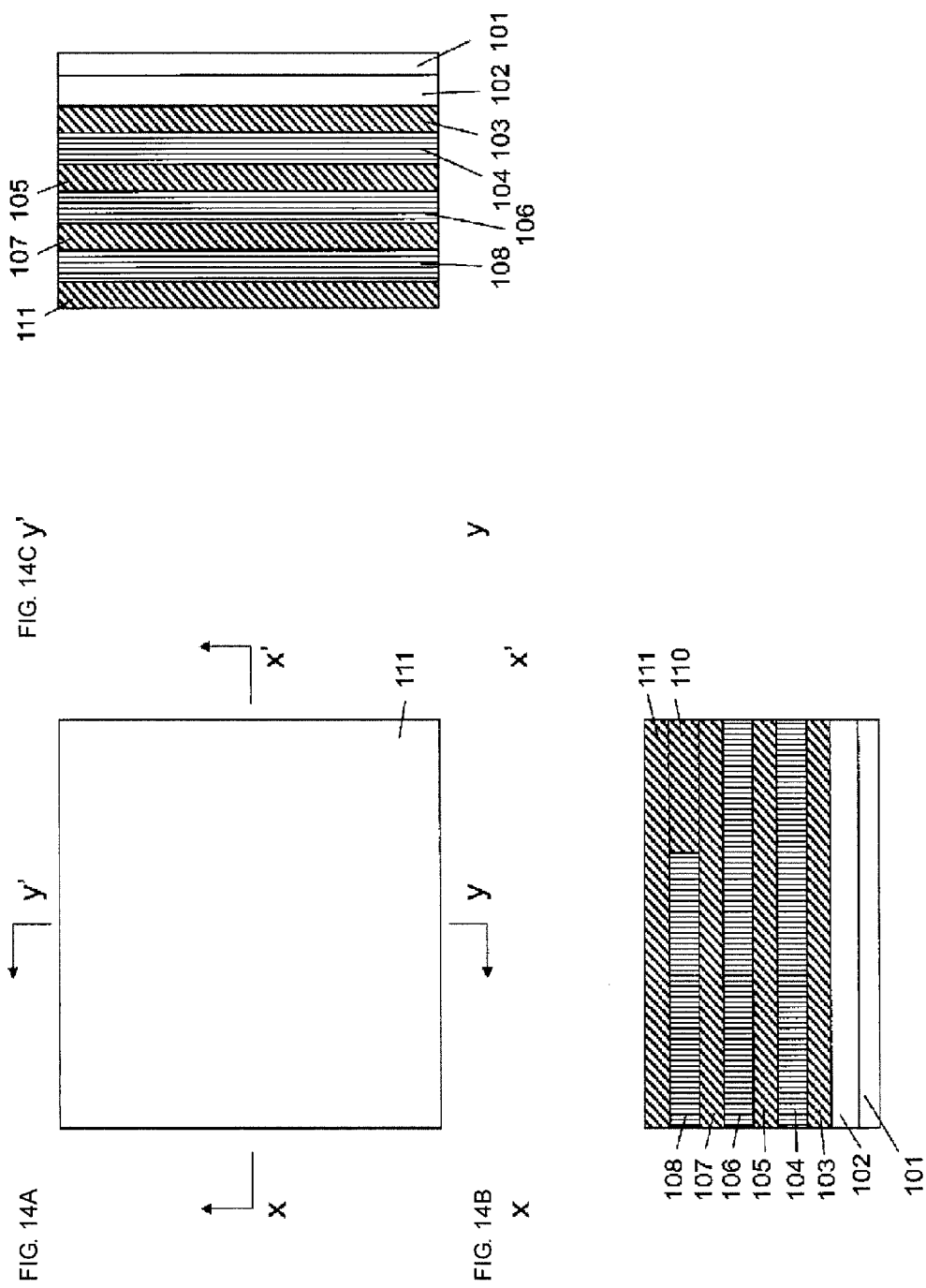

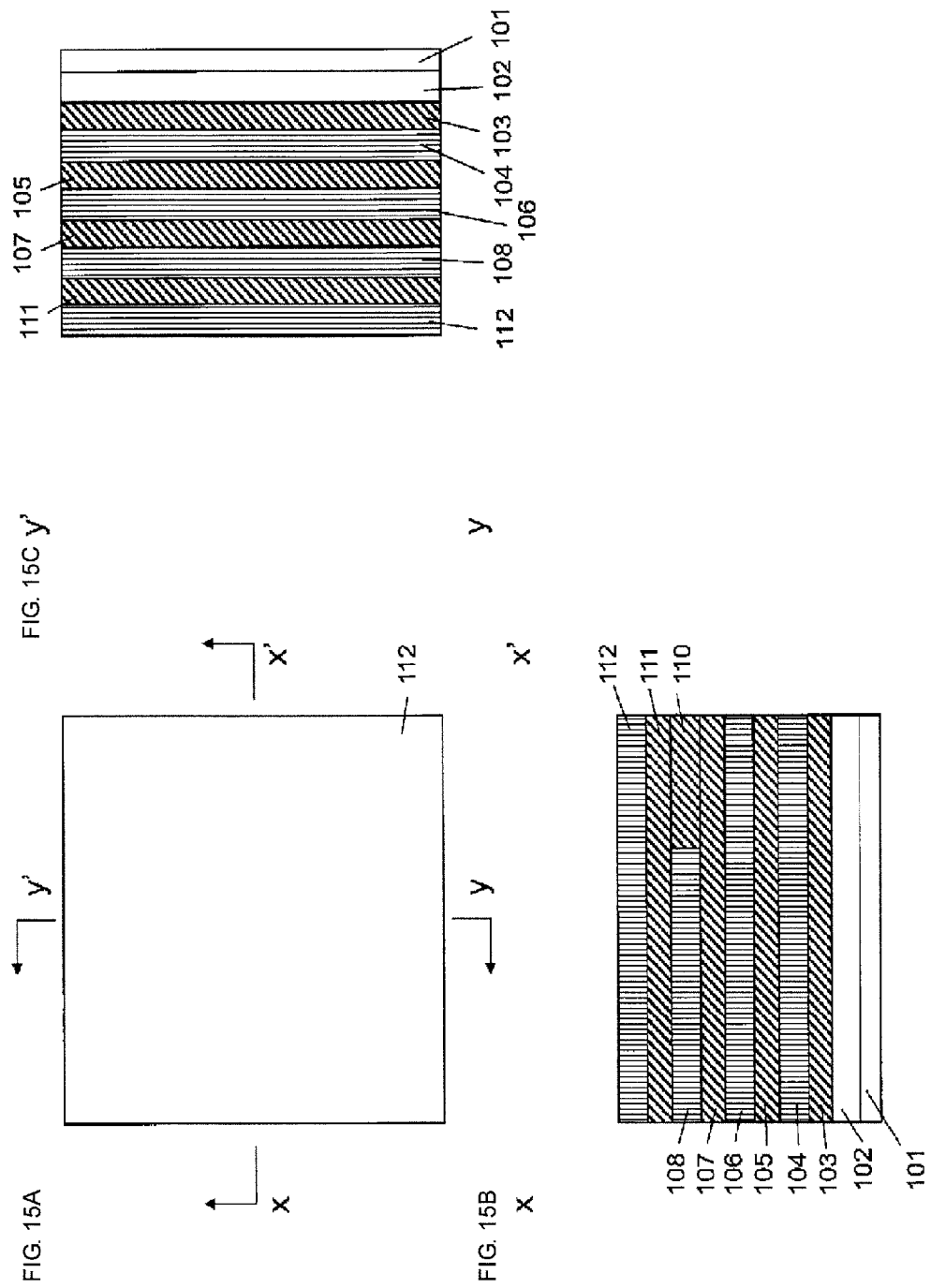

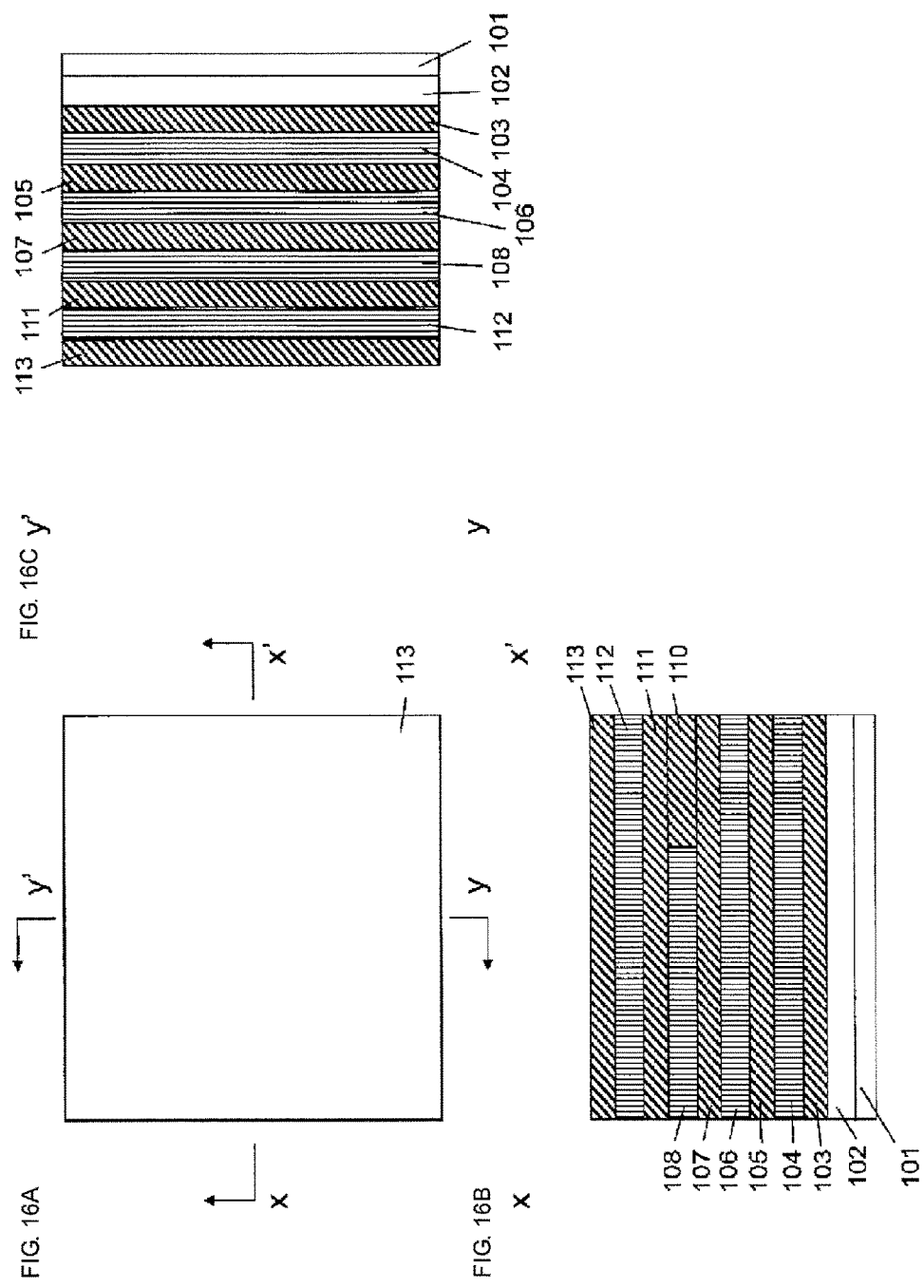

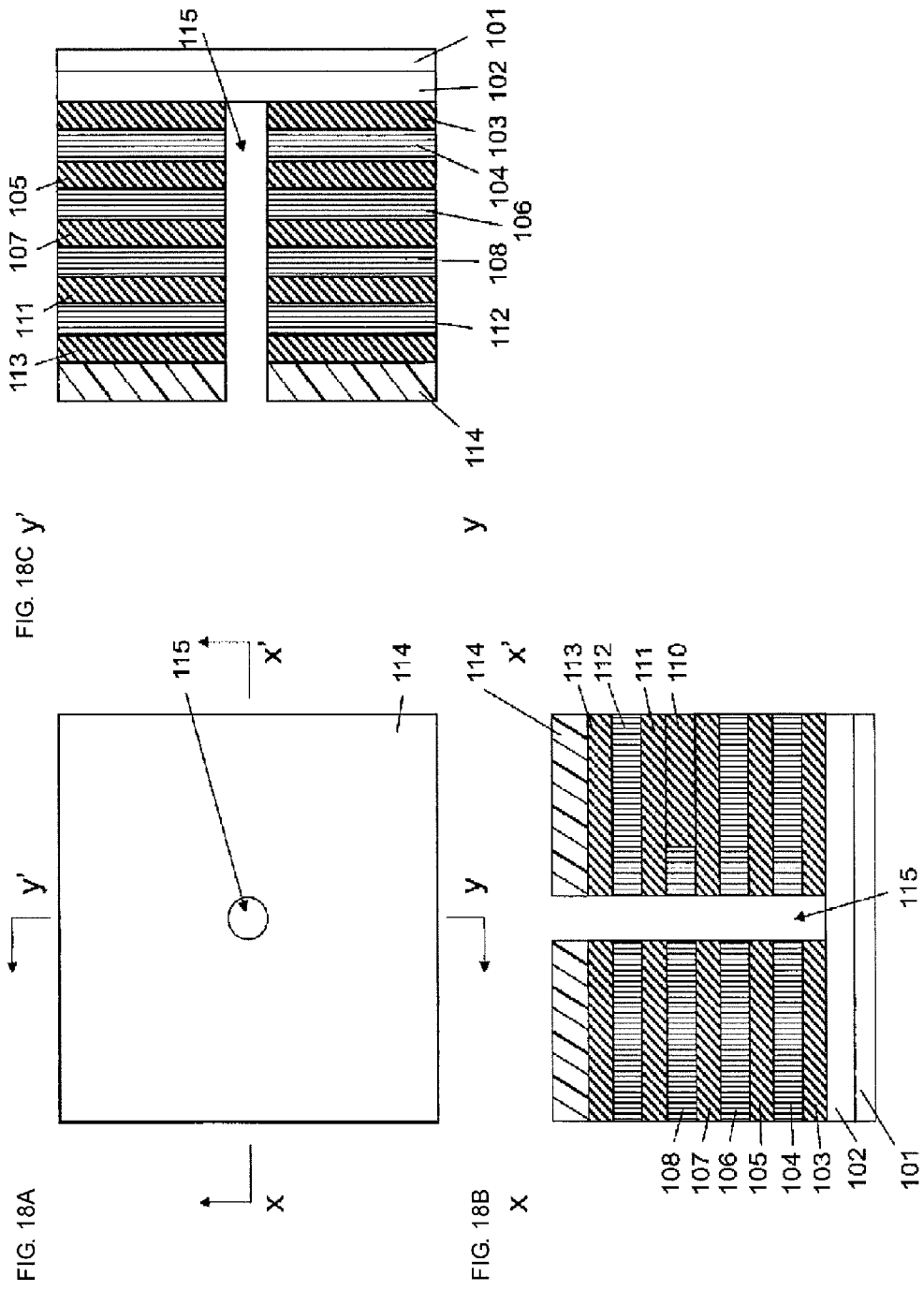

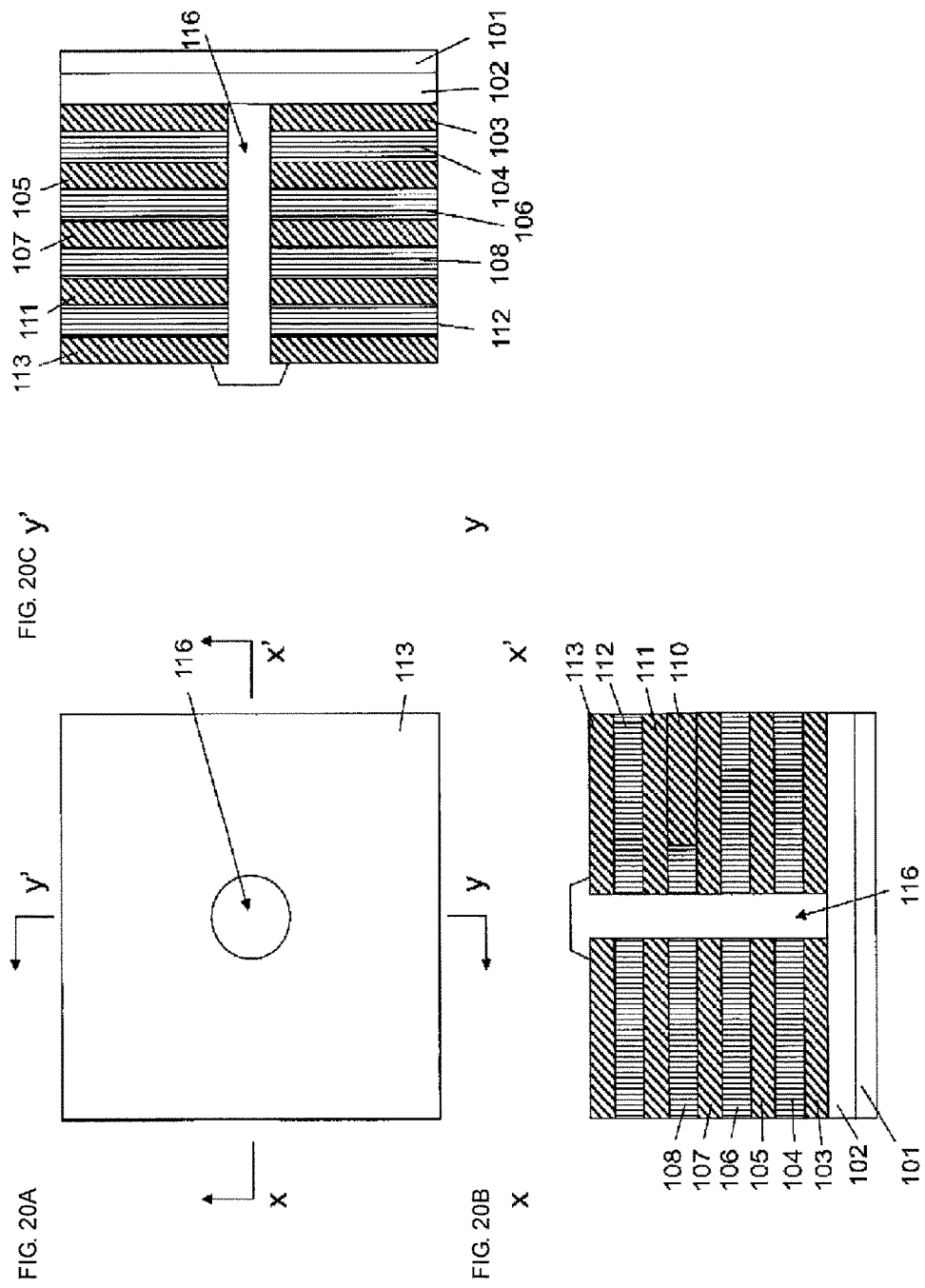

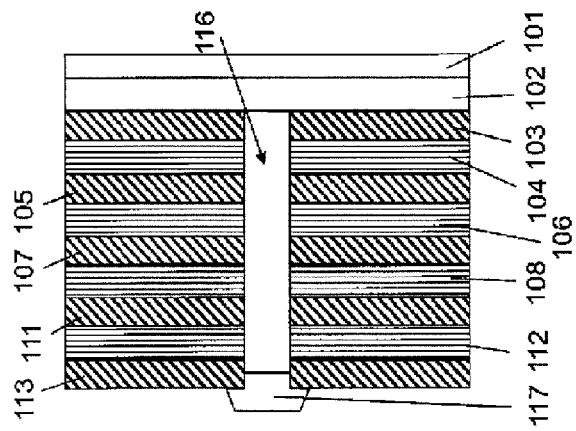
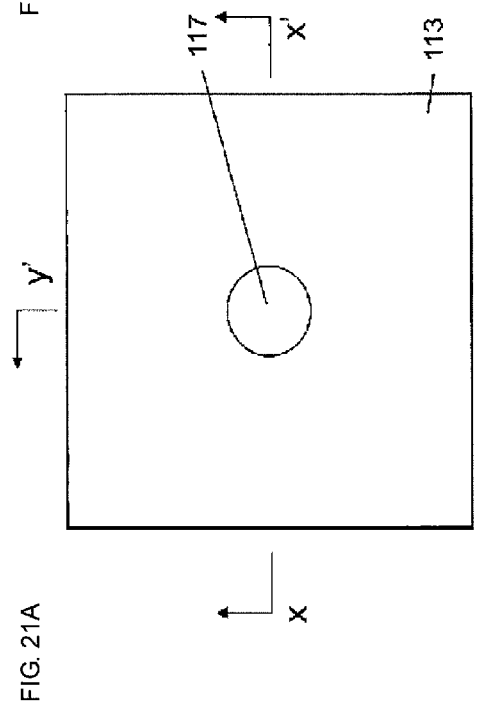
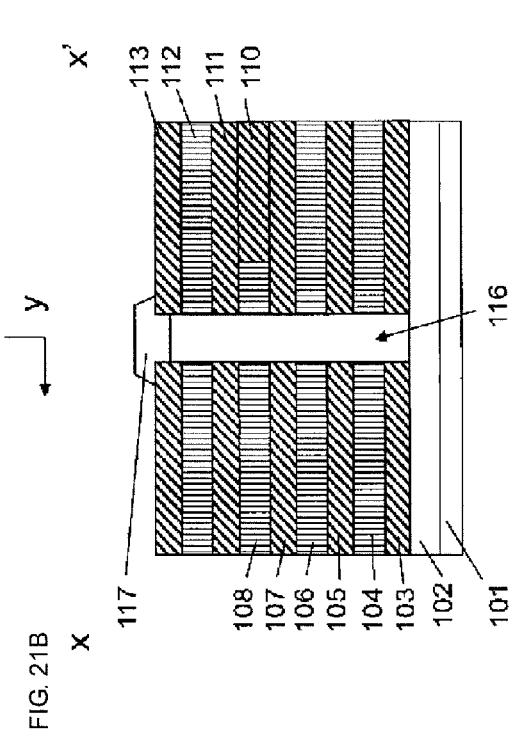

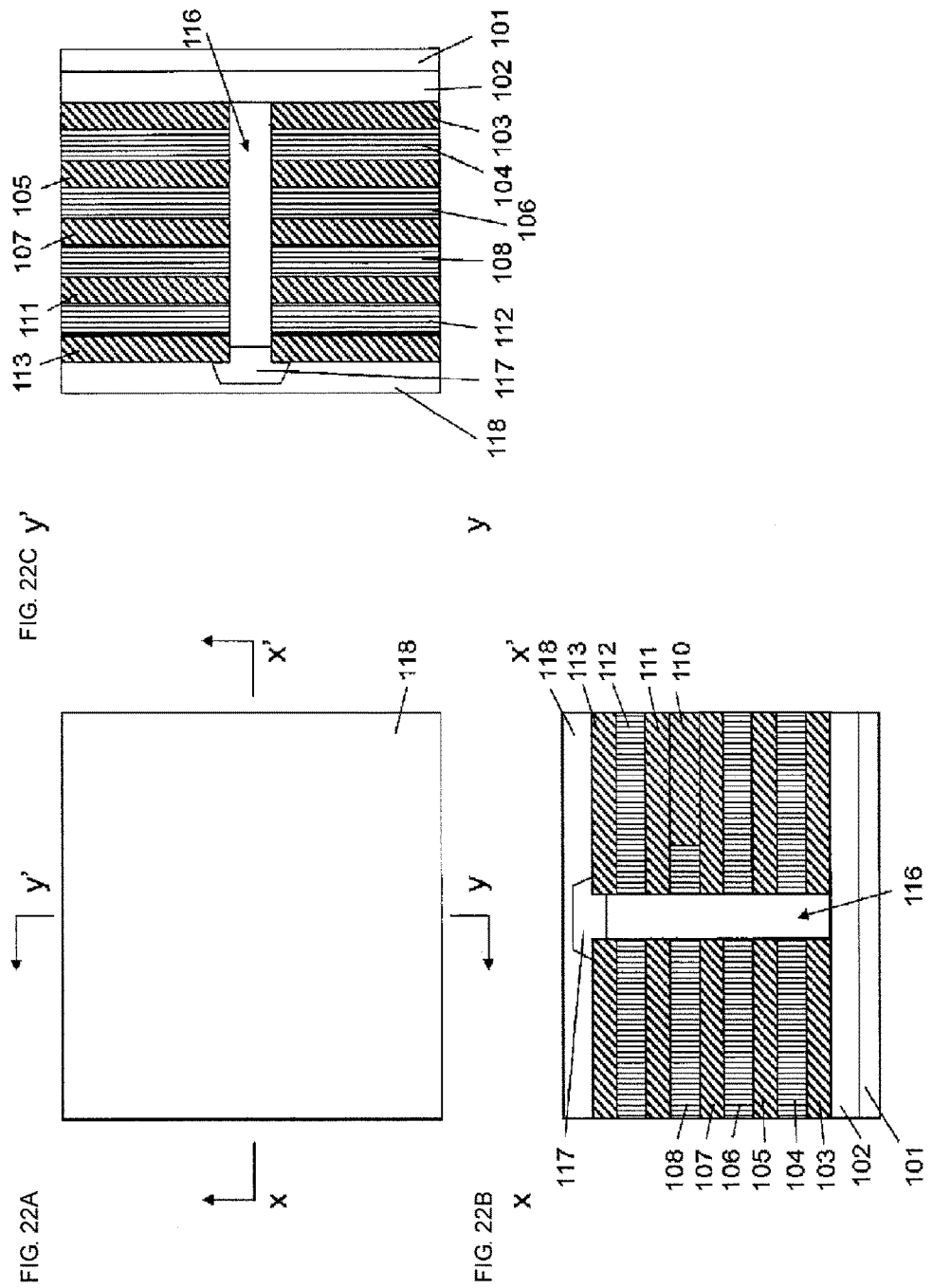

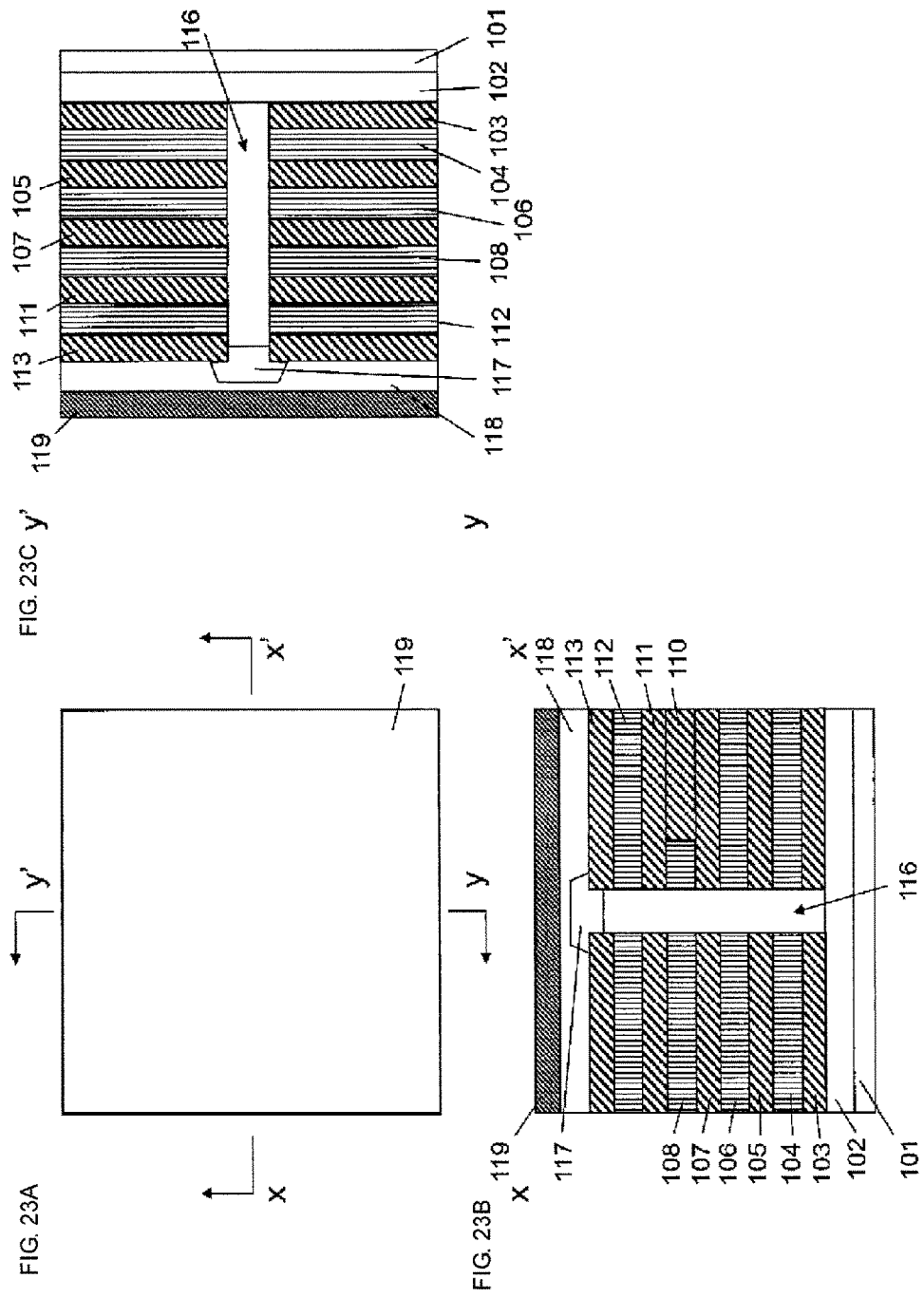

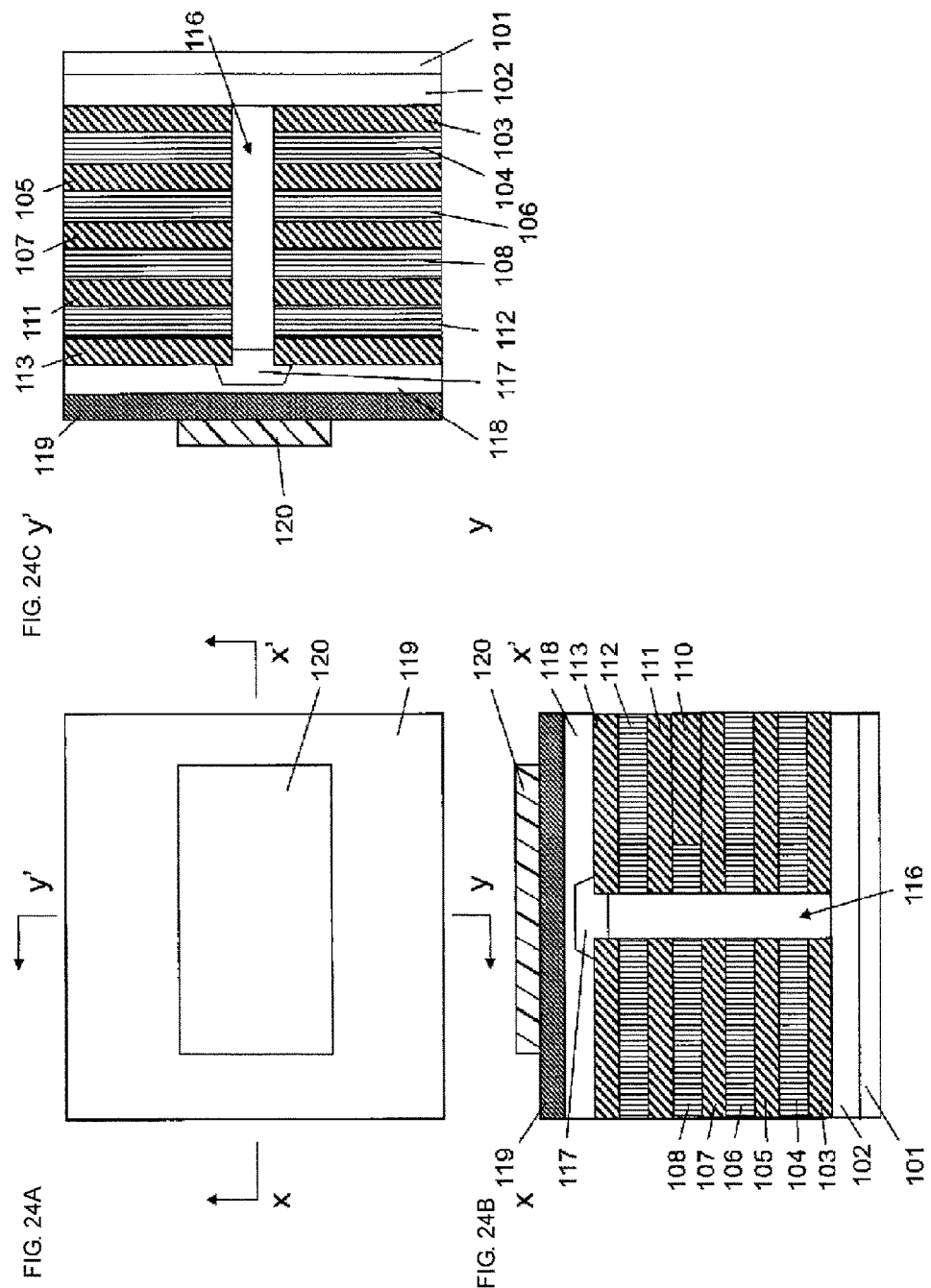

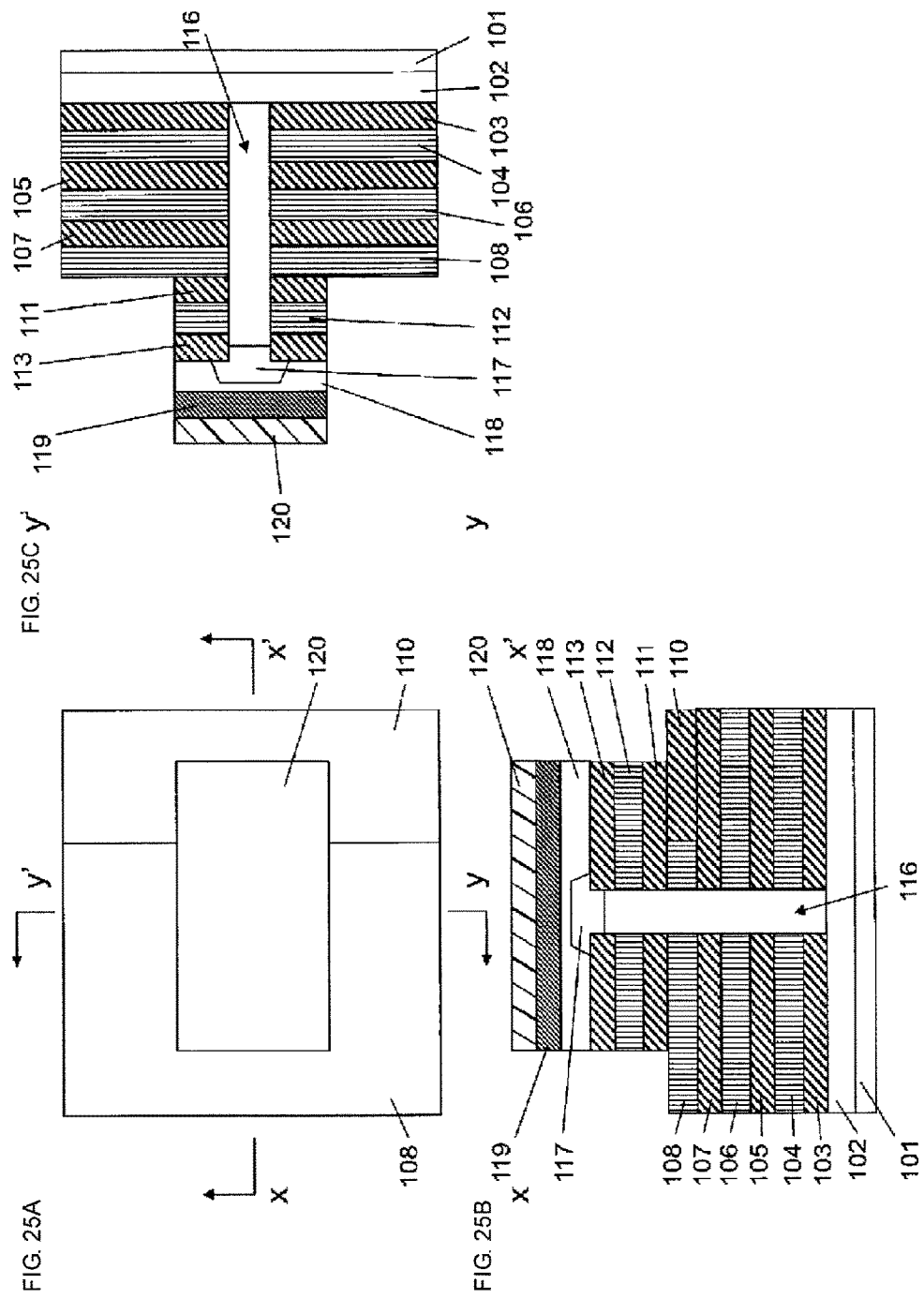

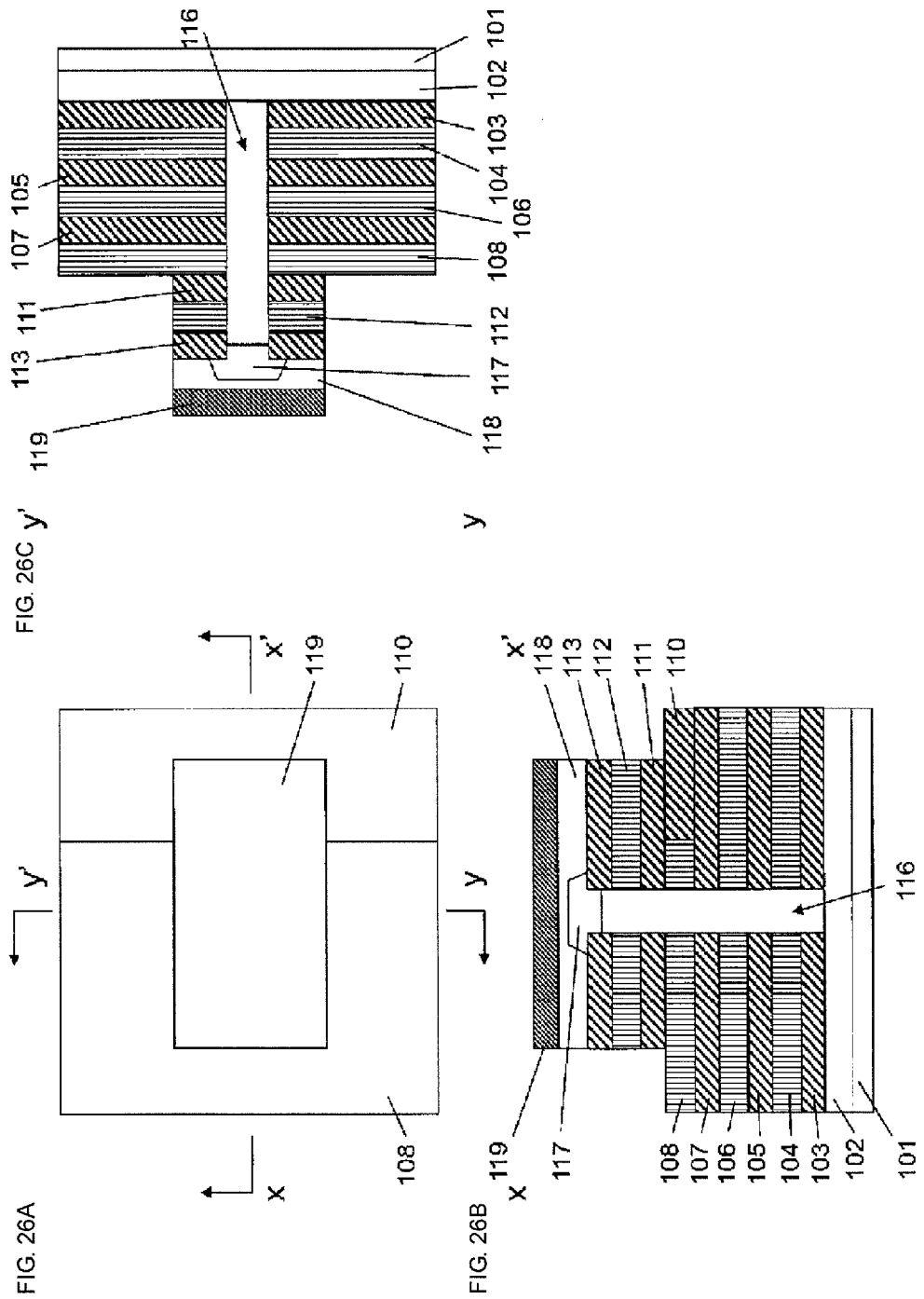

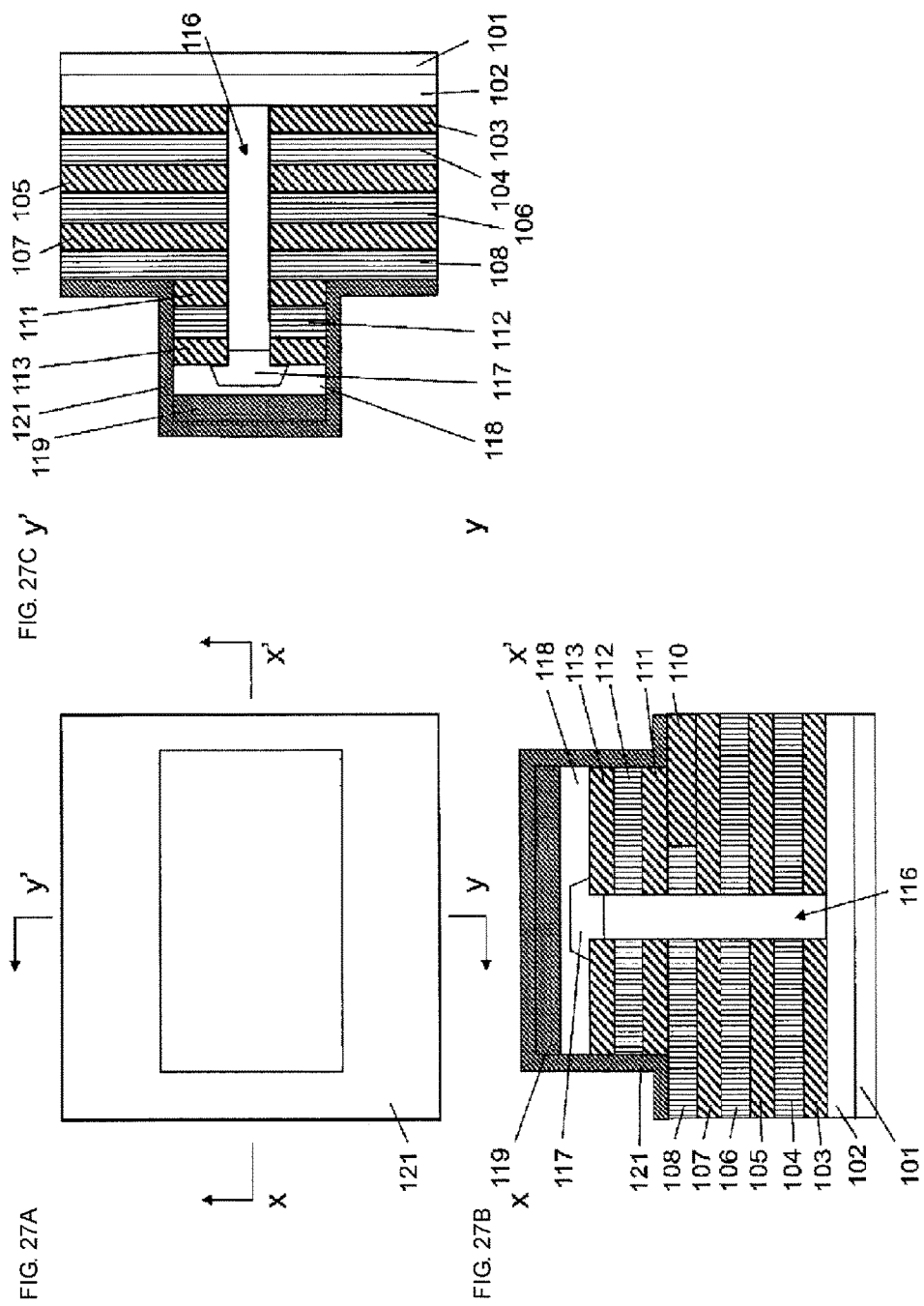

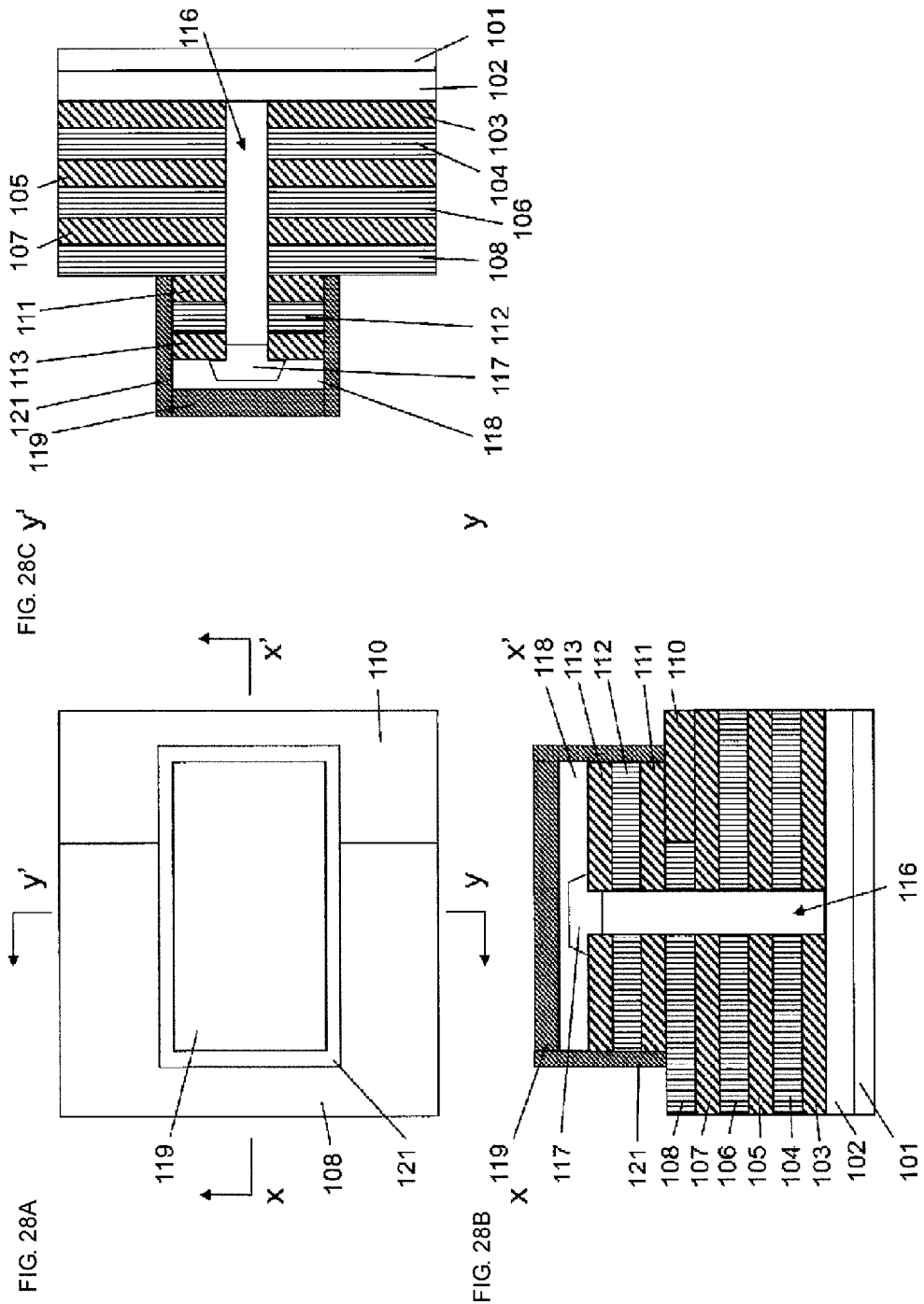

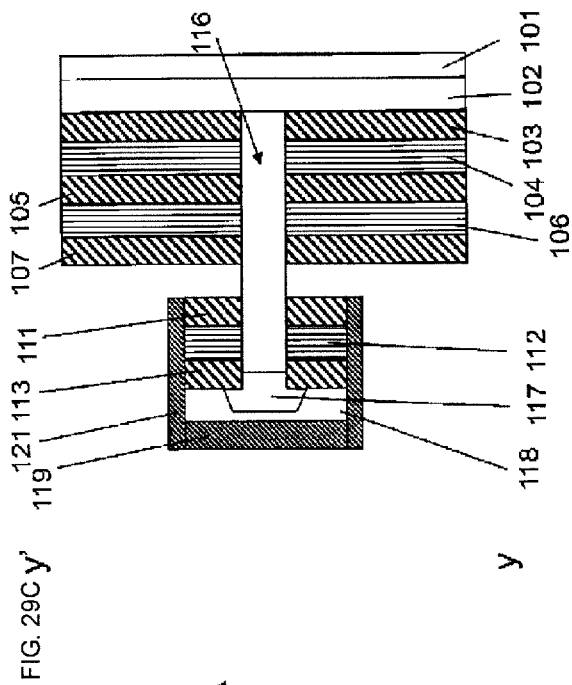
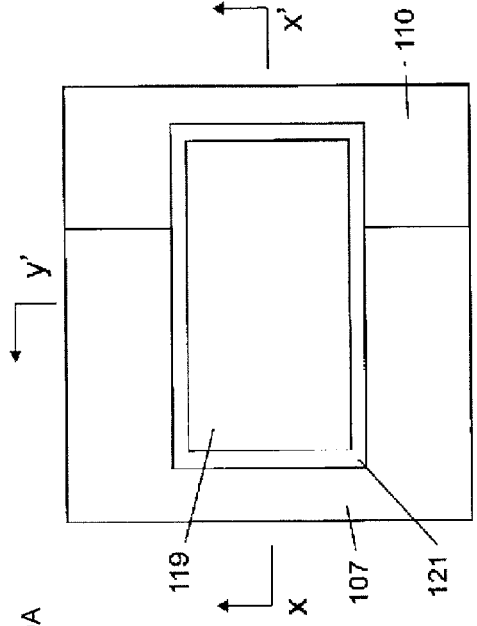
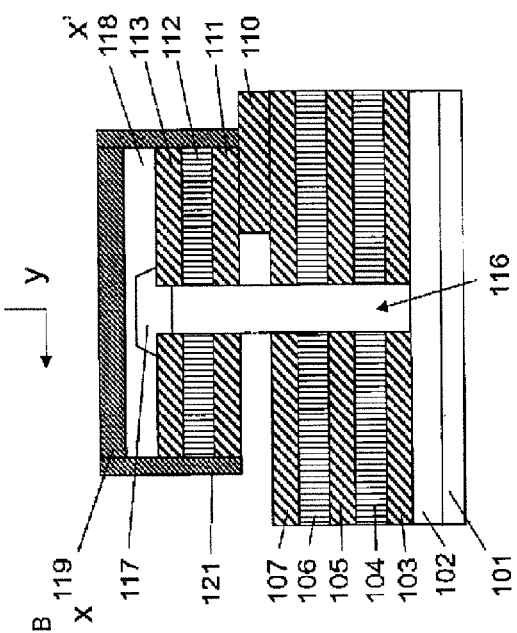
FIG. 29A
FIG. 29B
FIG. 29C

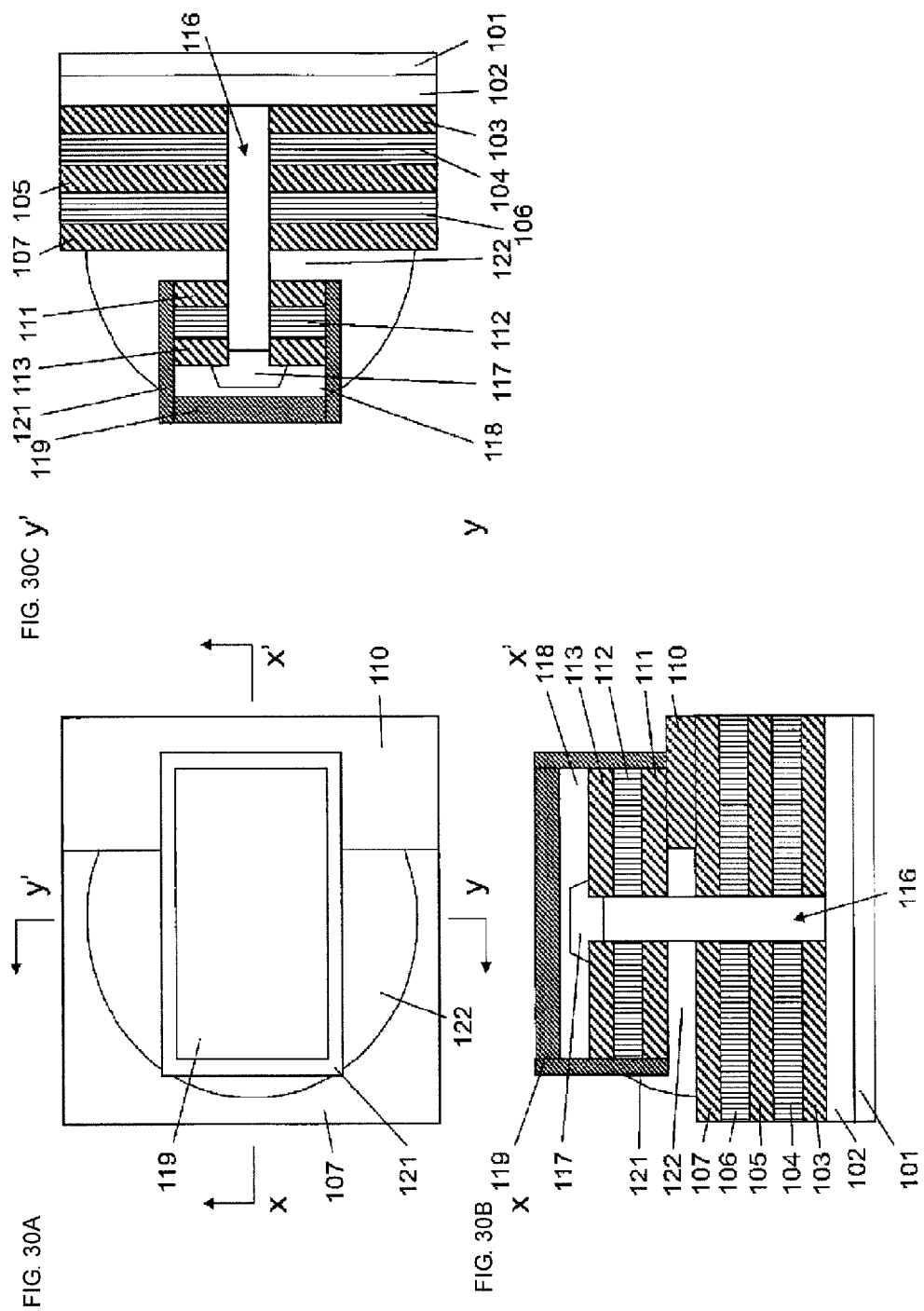

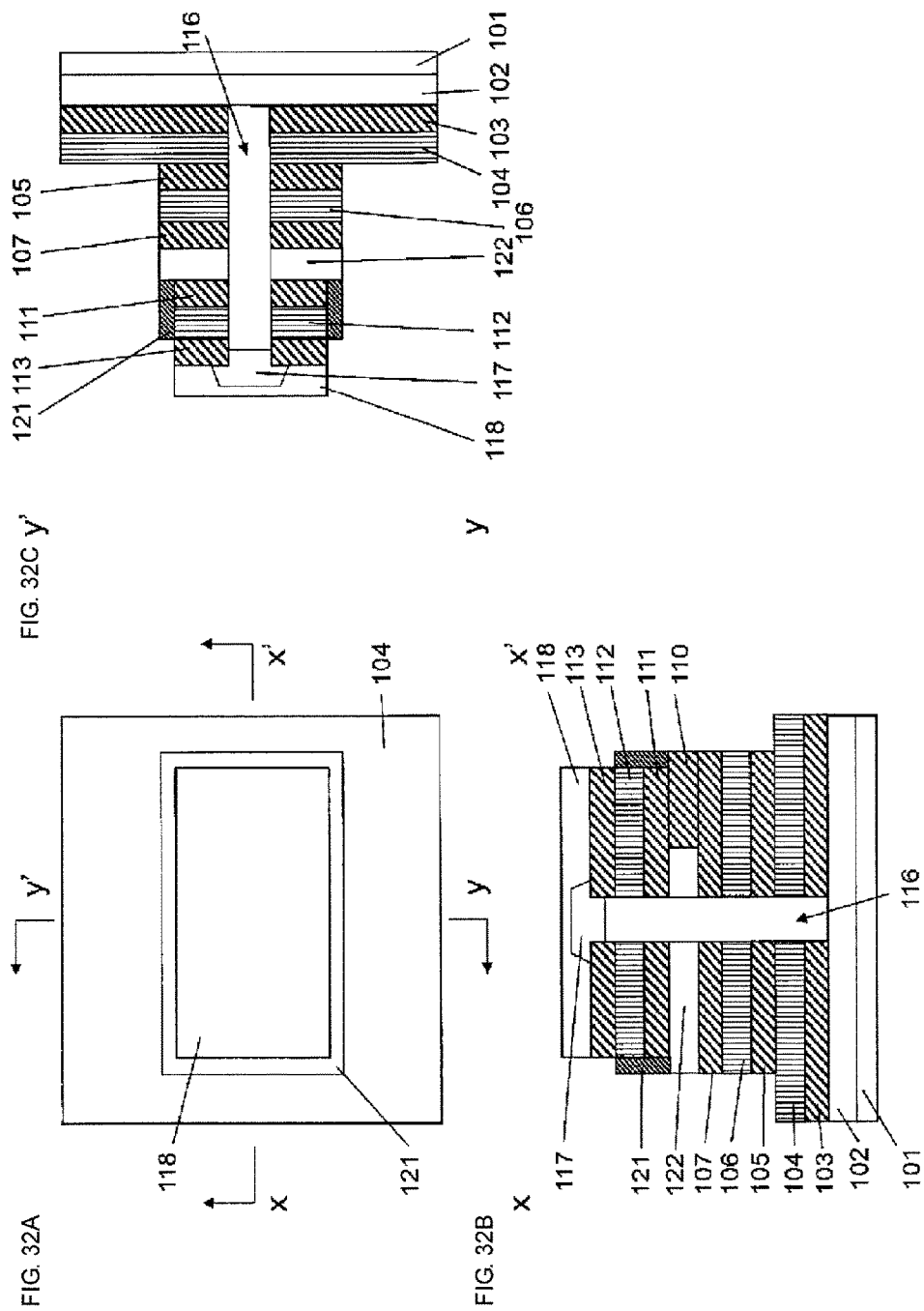

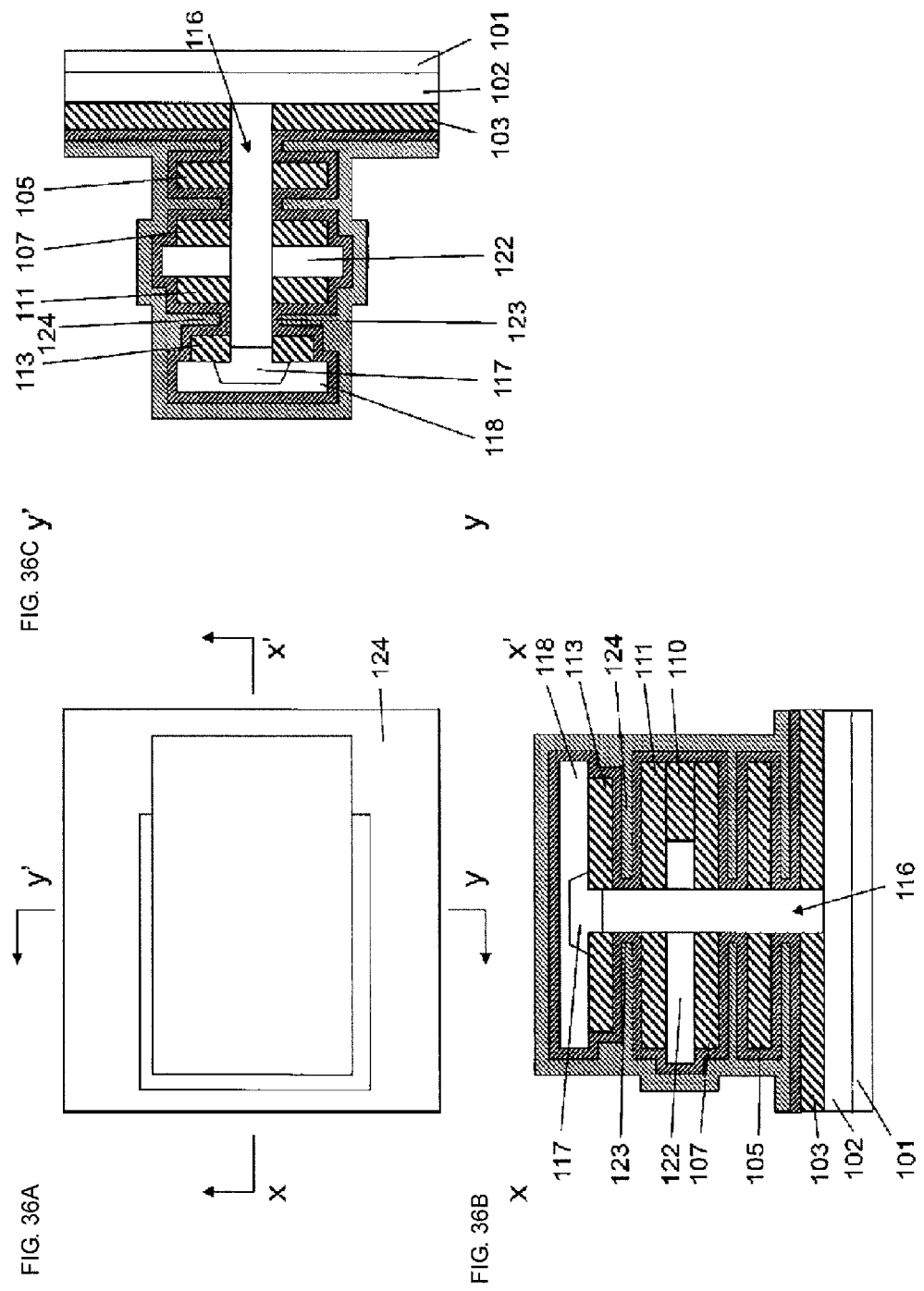

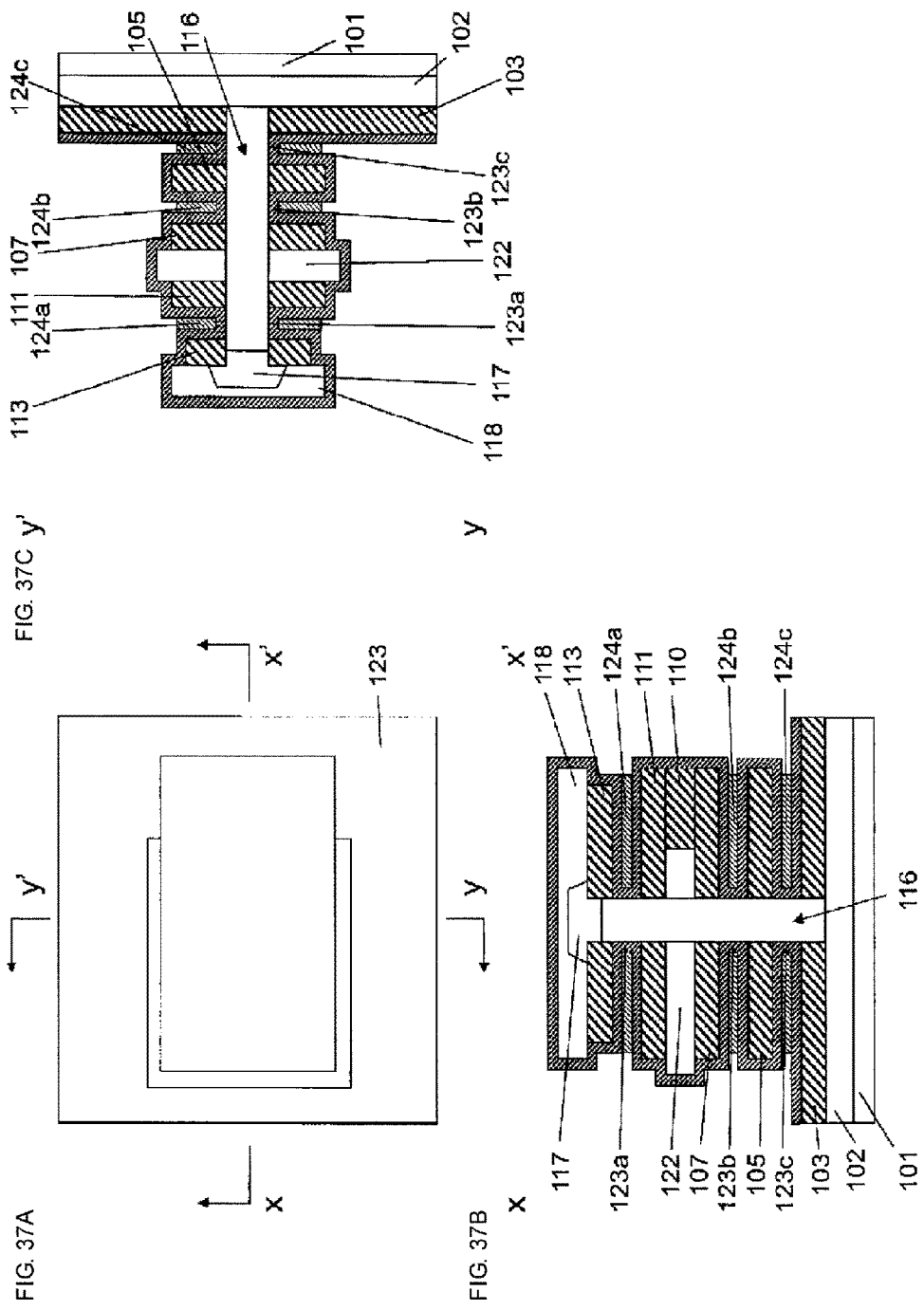

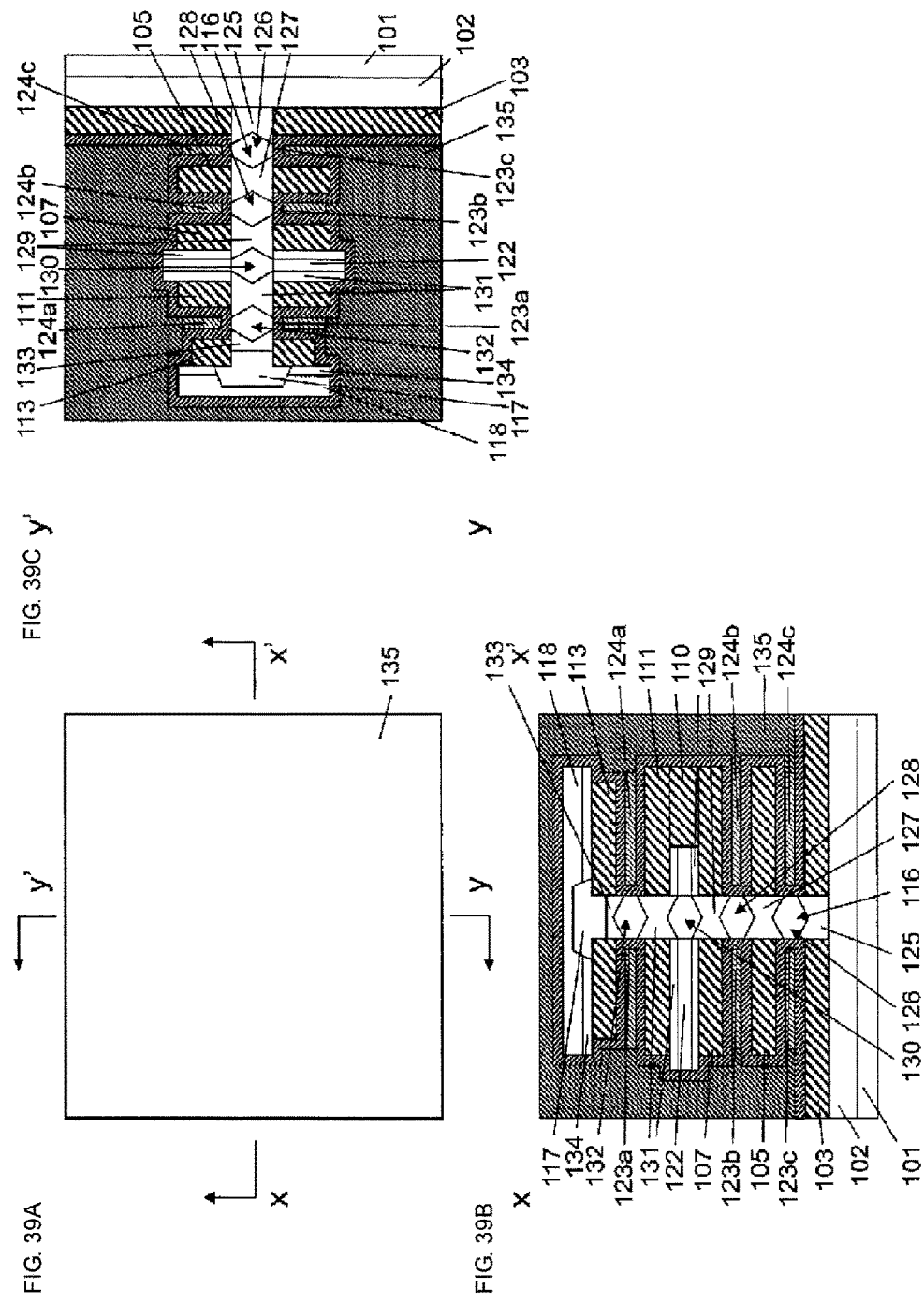

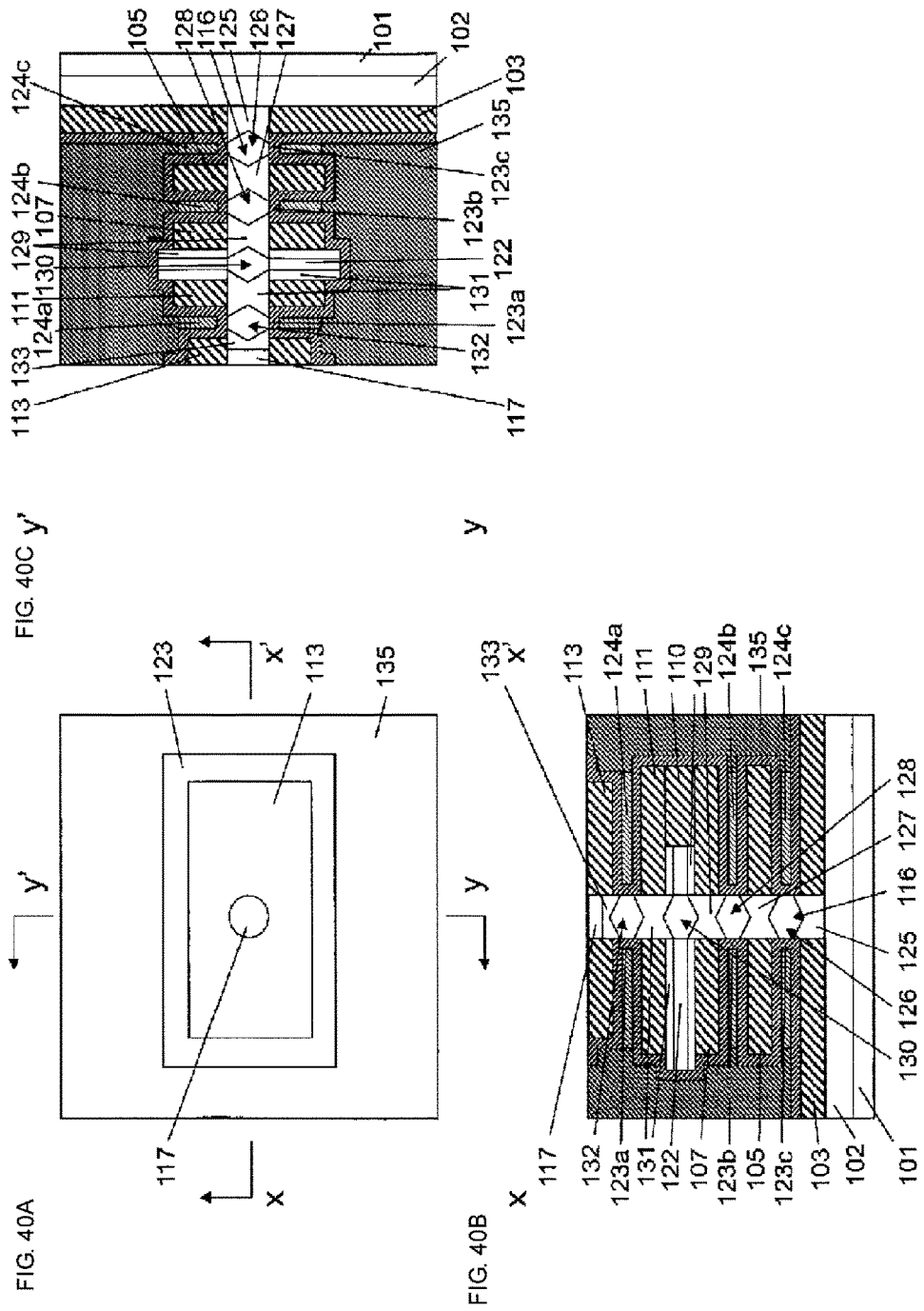

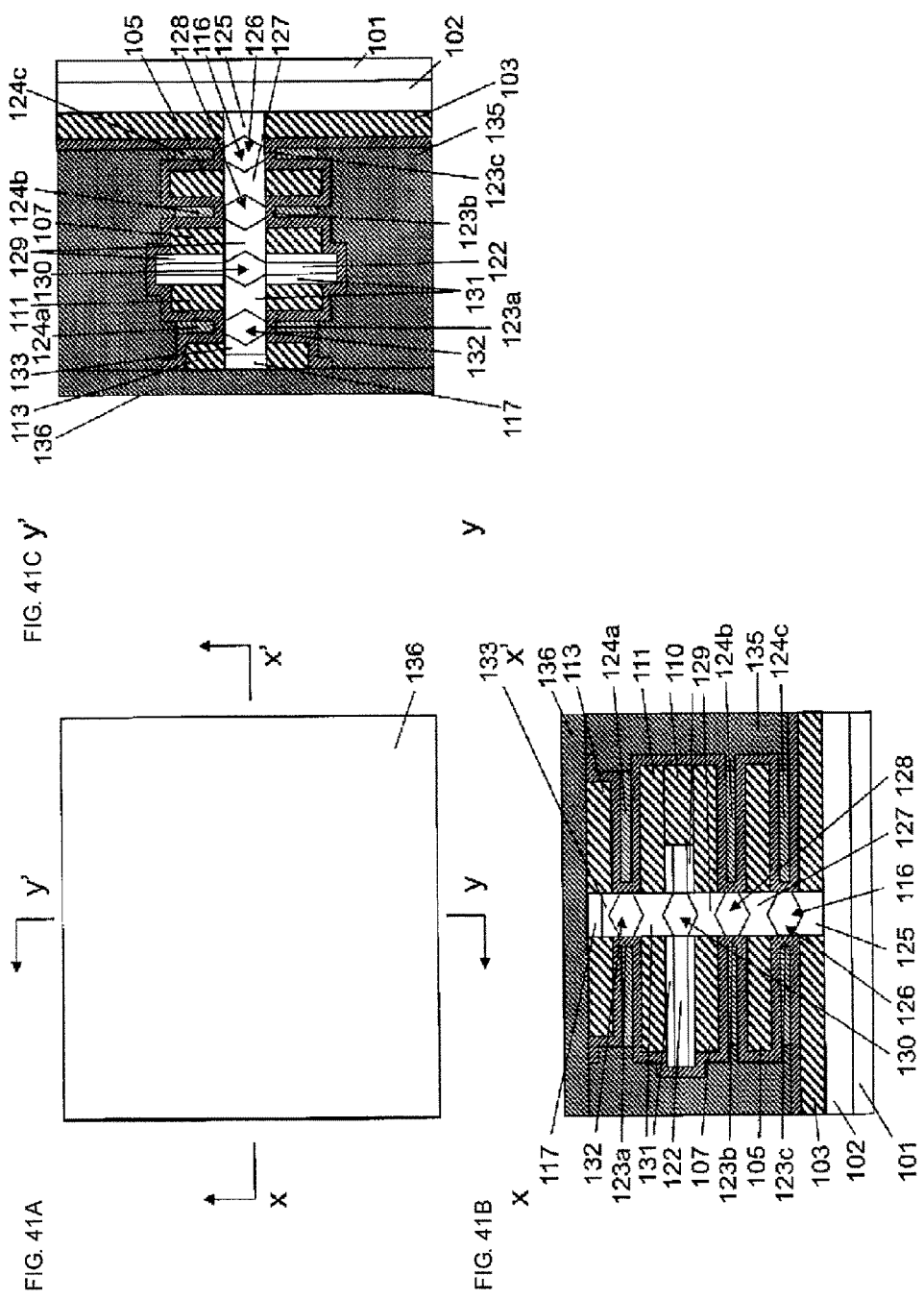

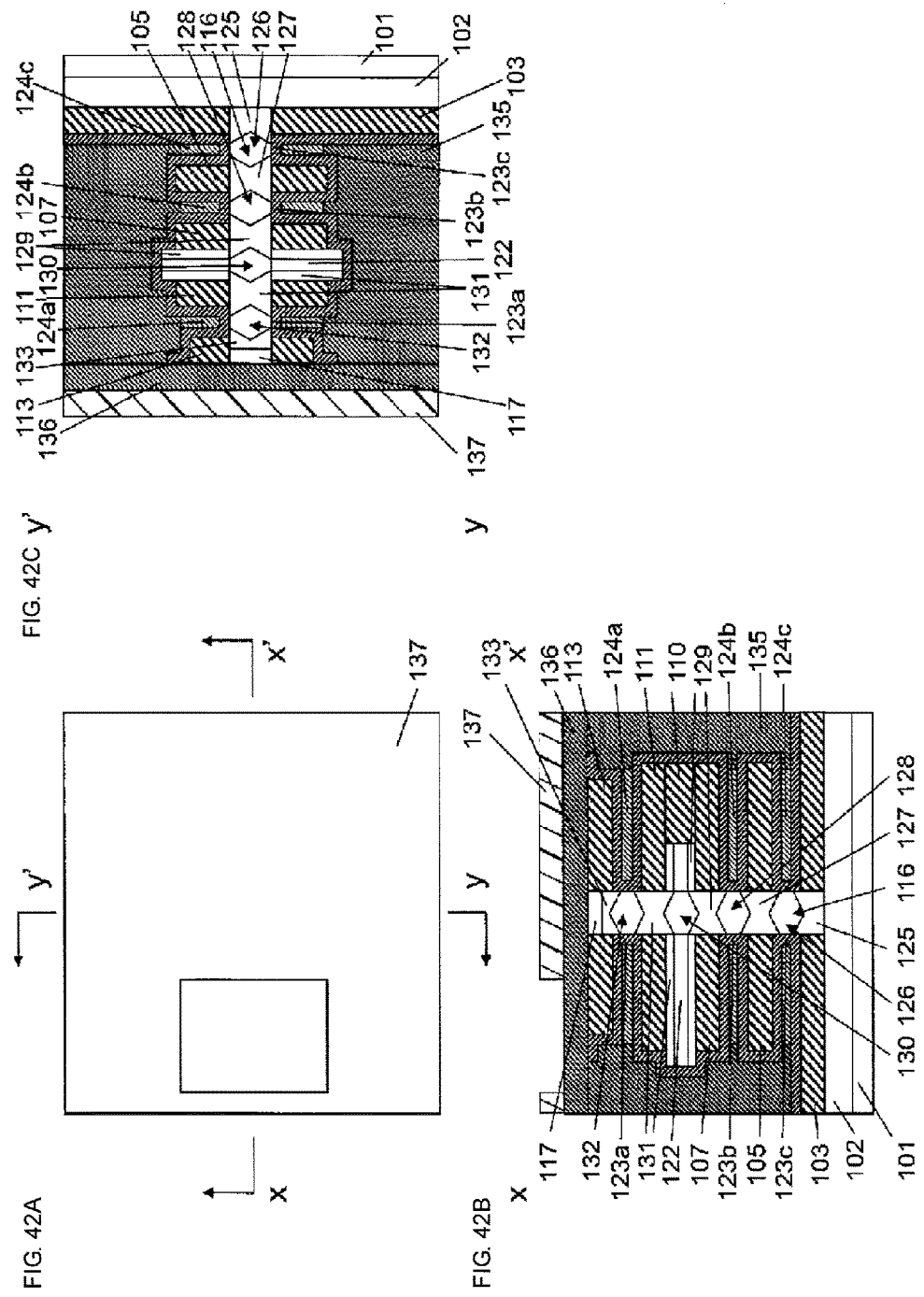

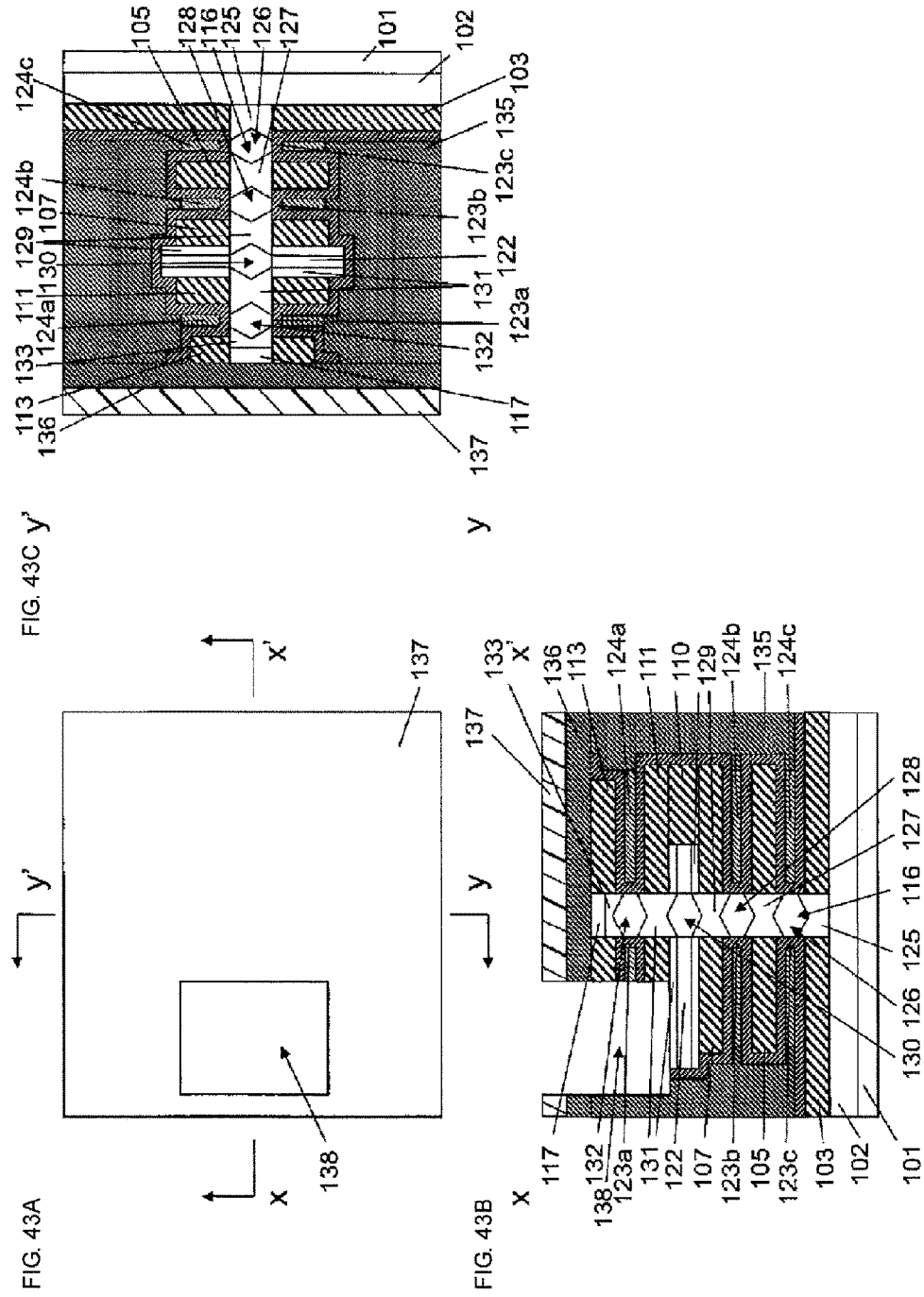

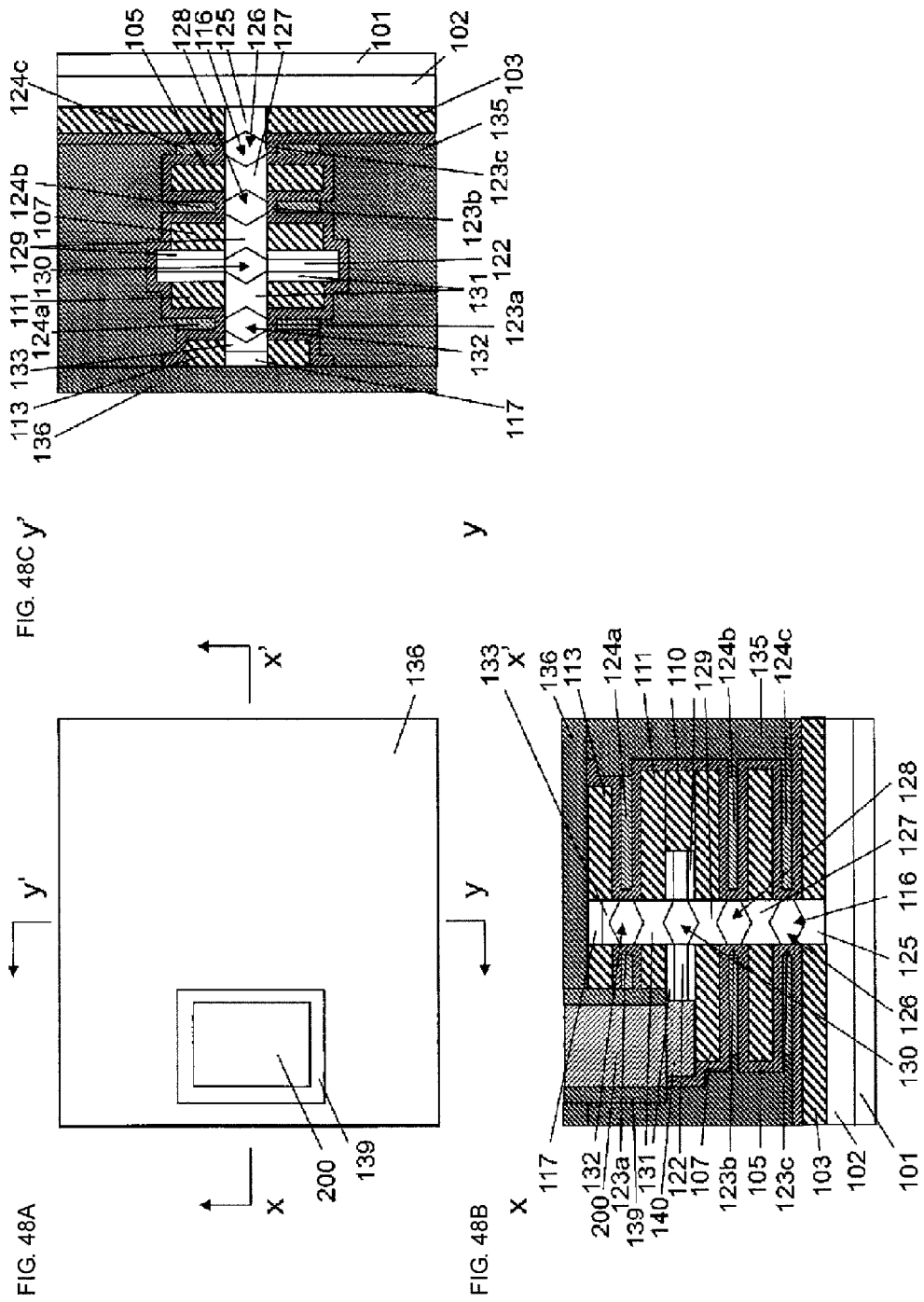

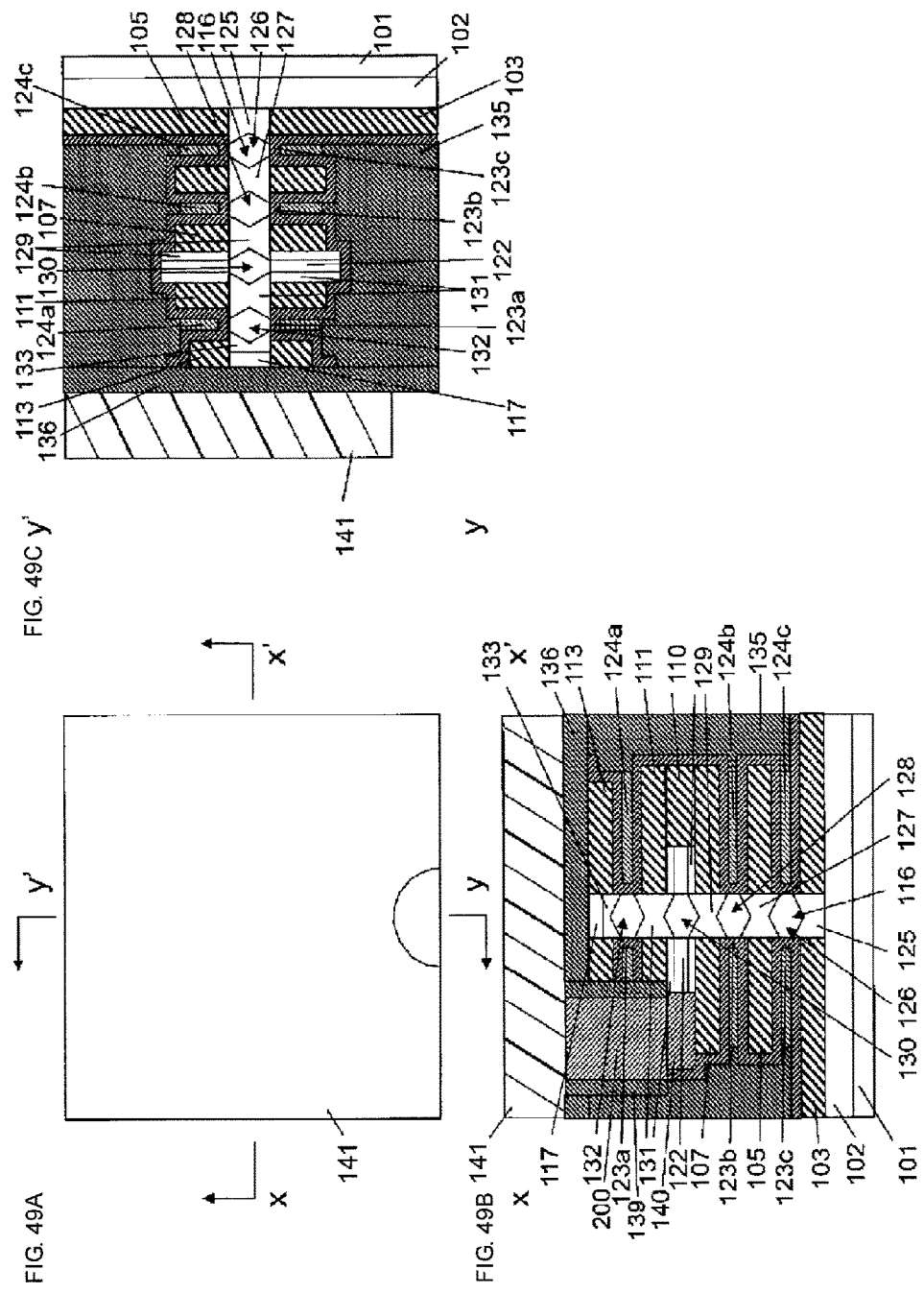

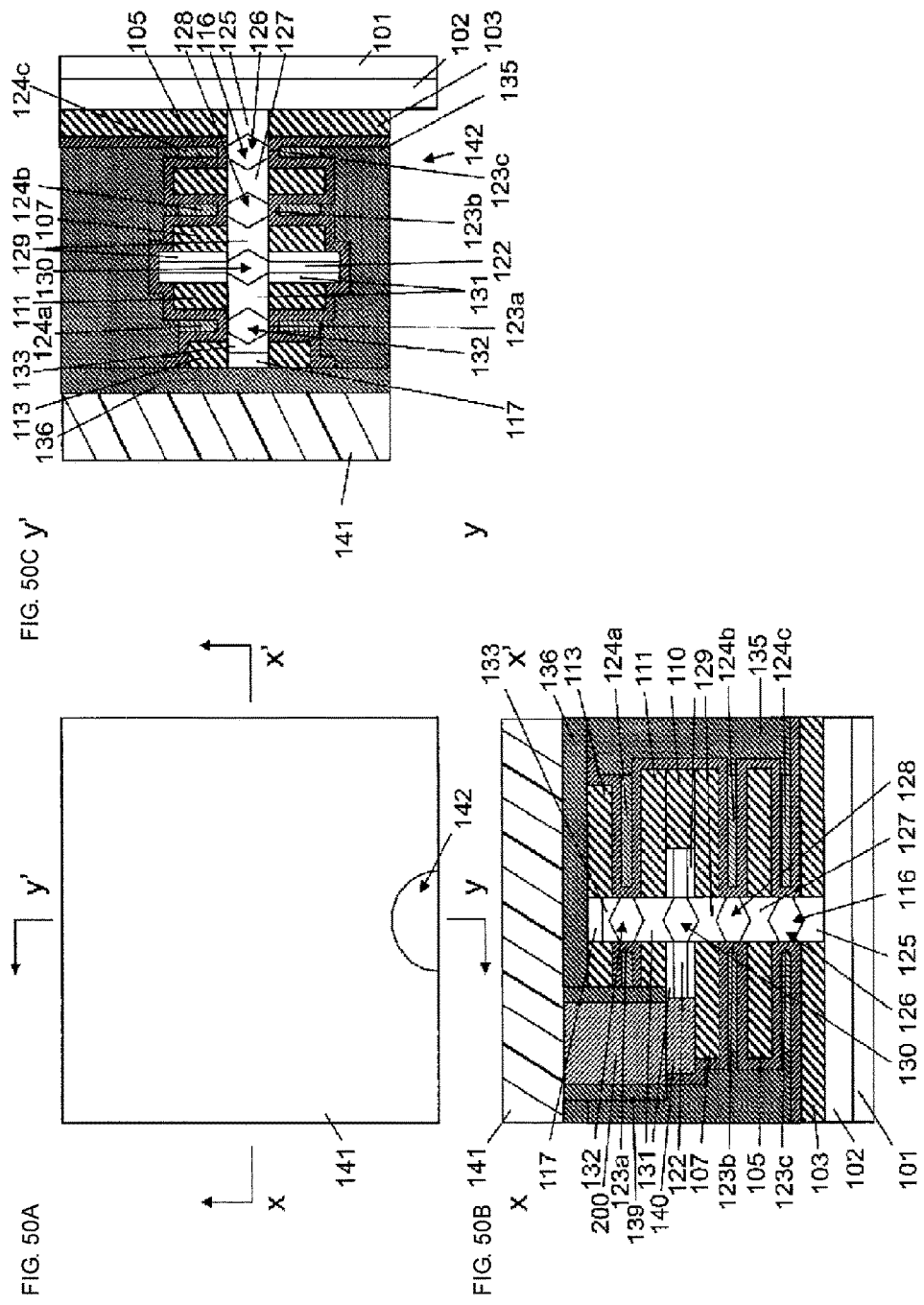

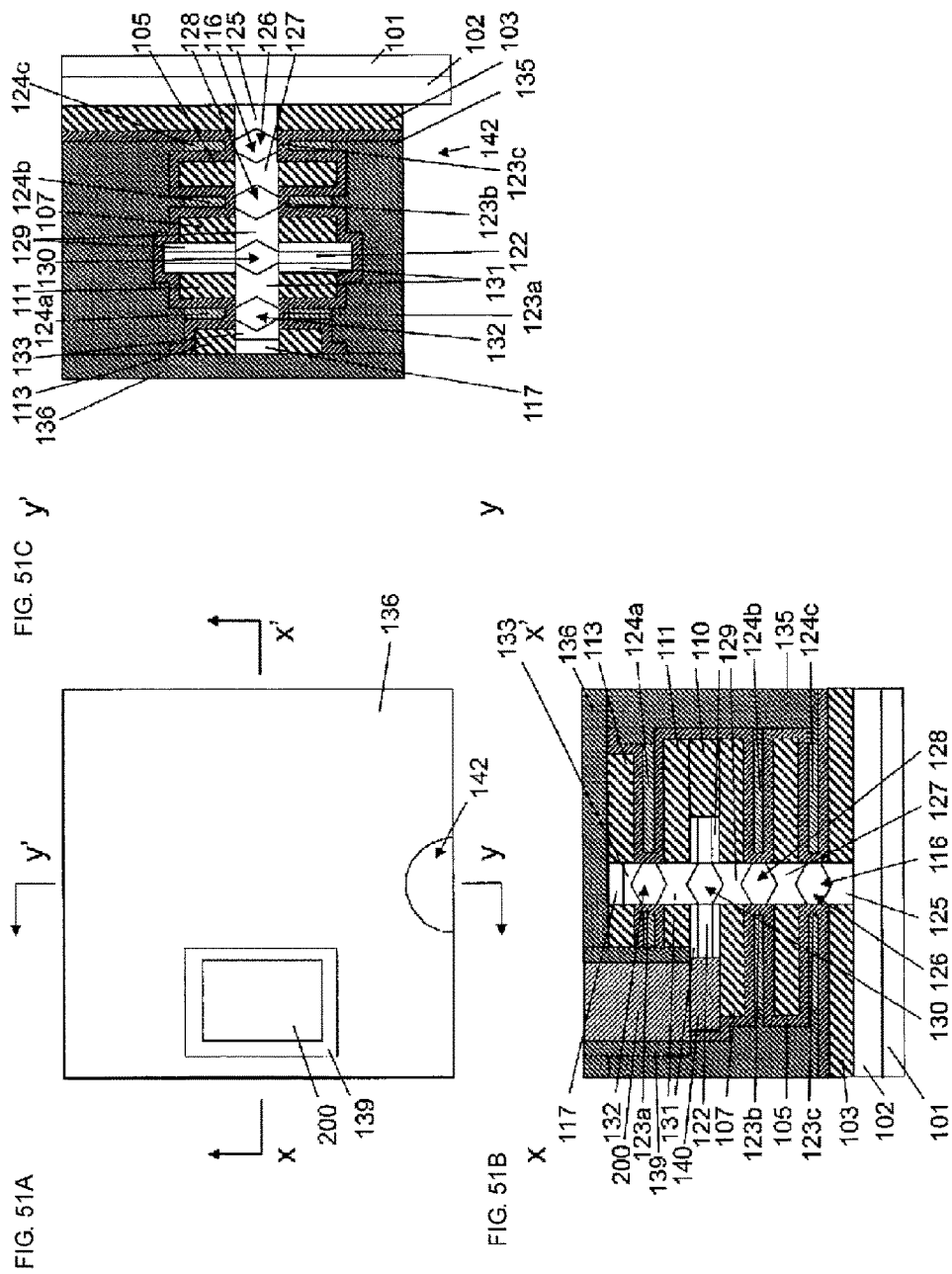

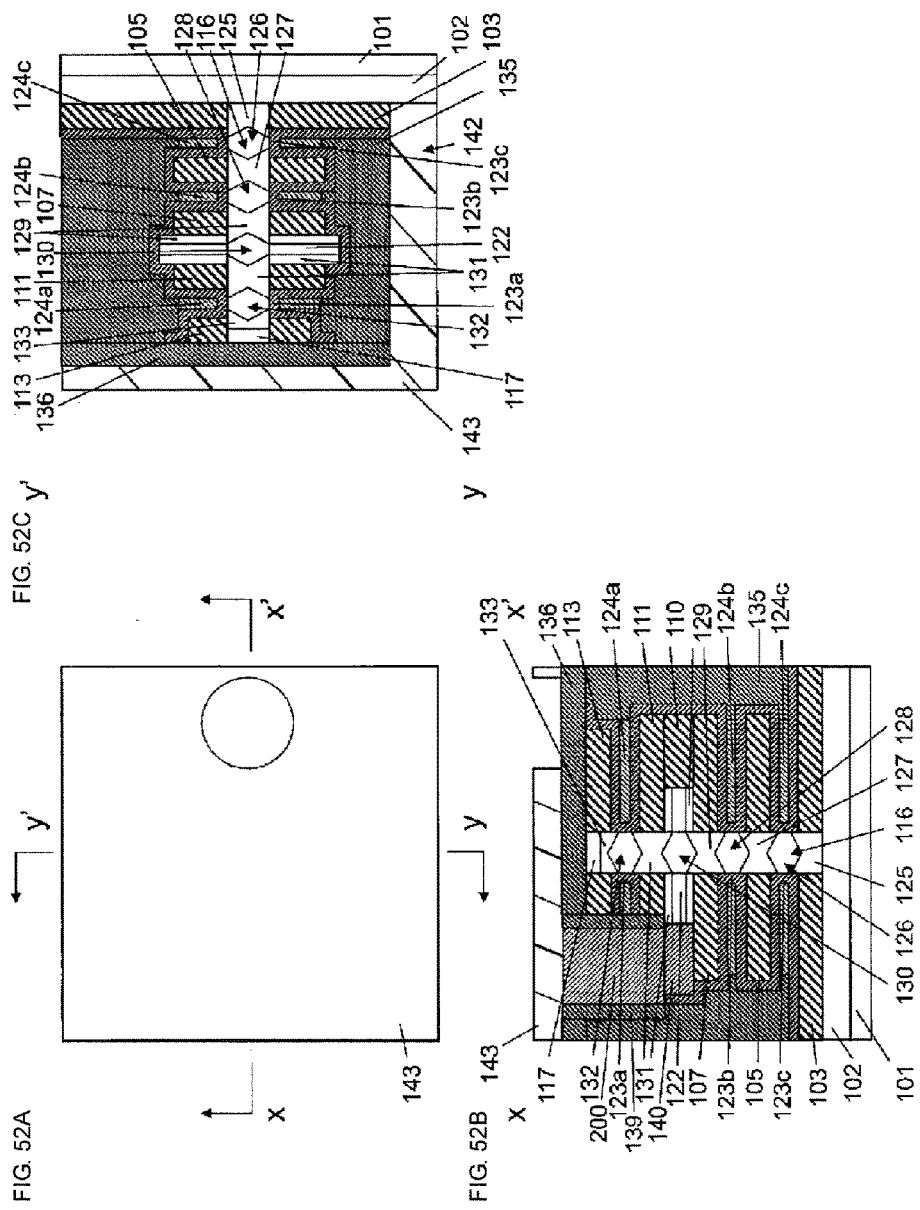

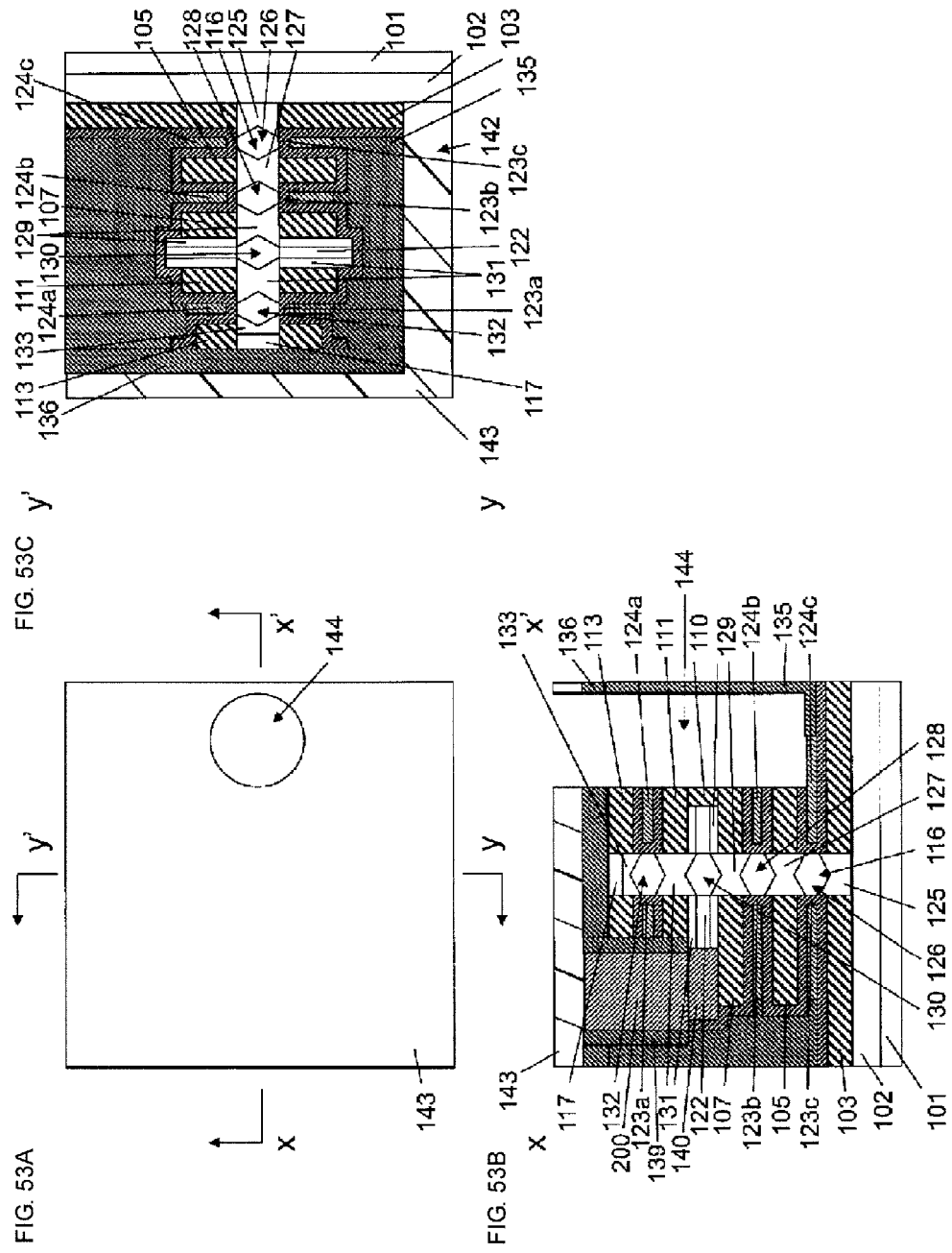

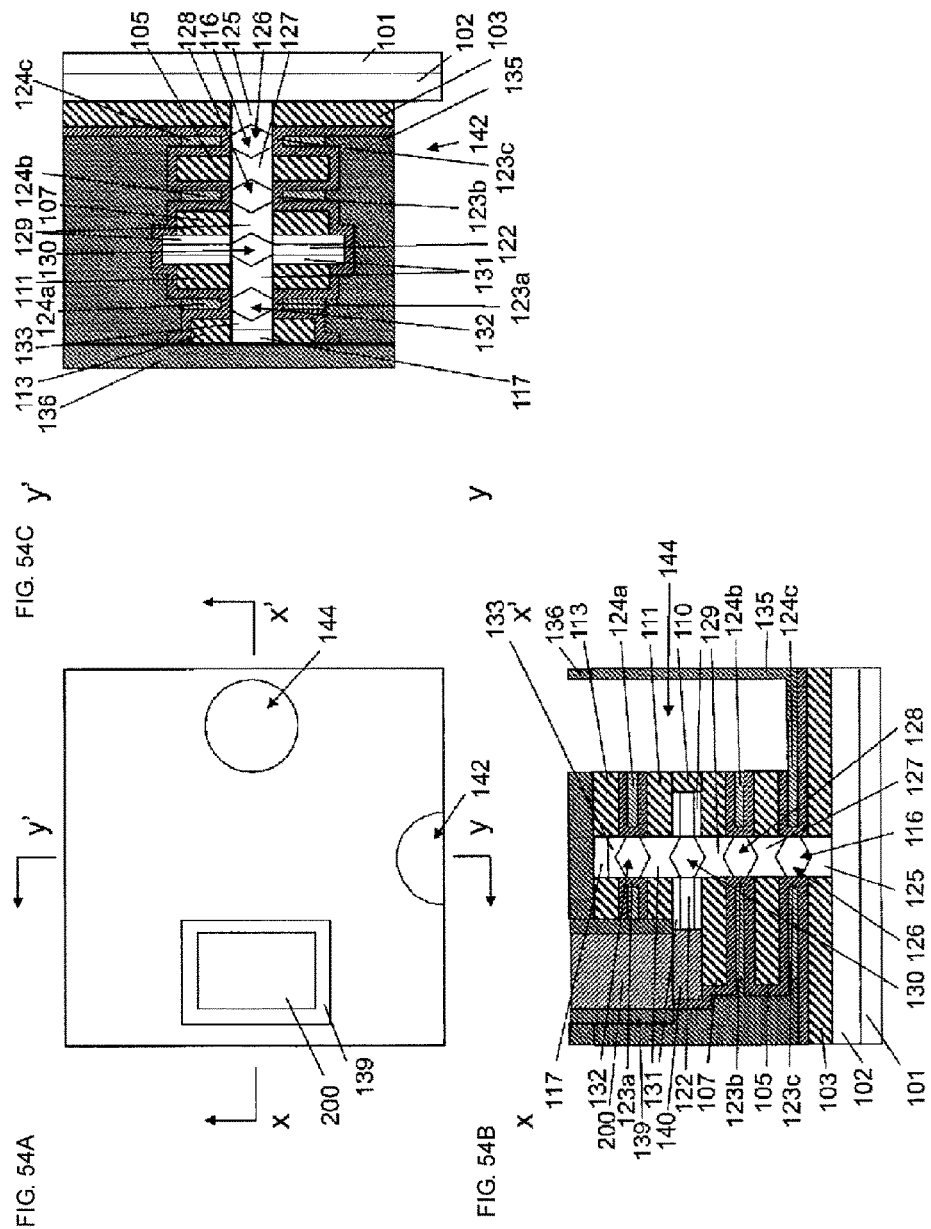

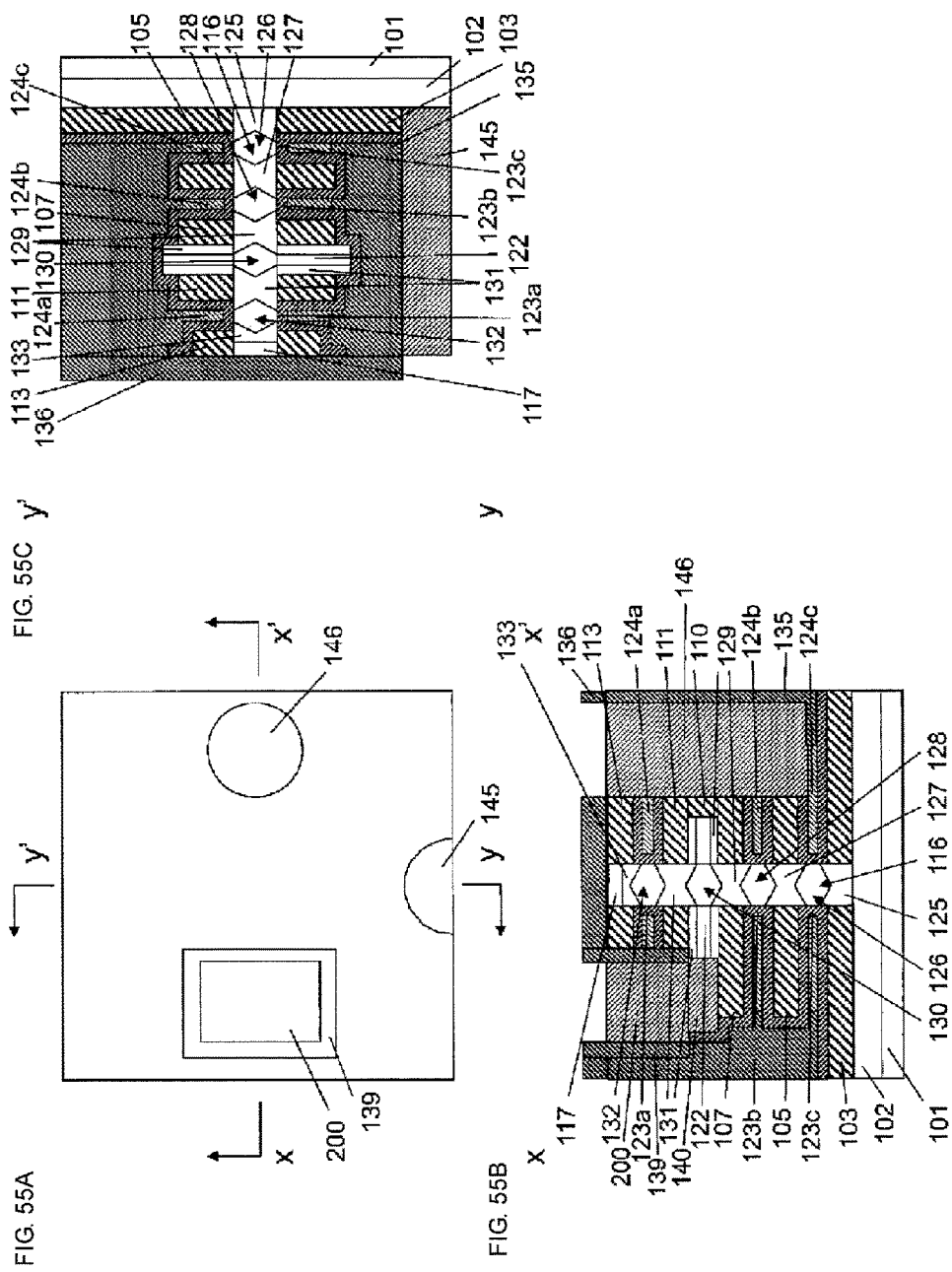

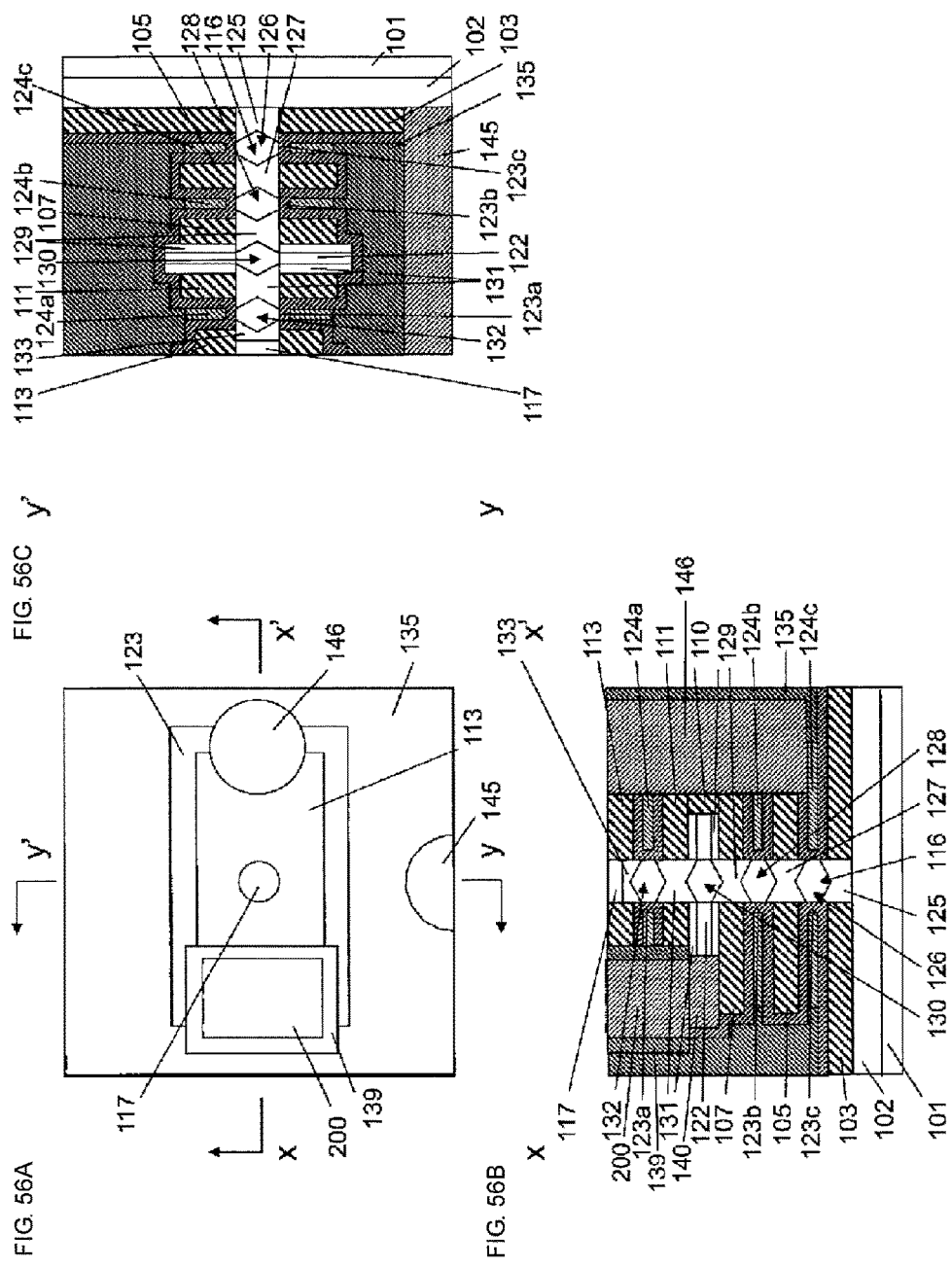

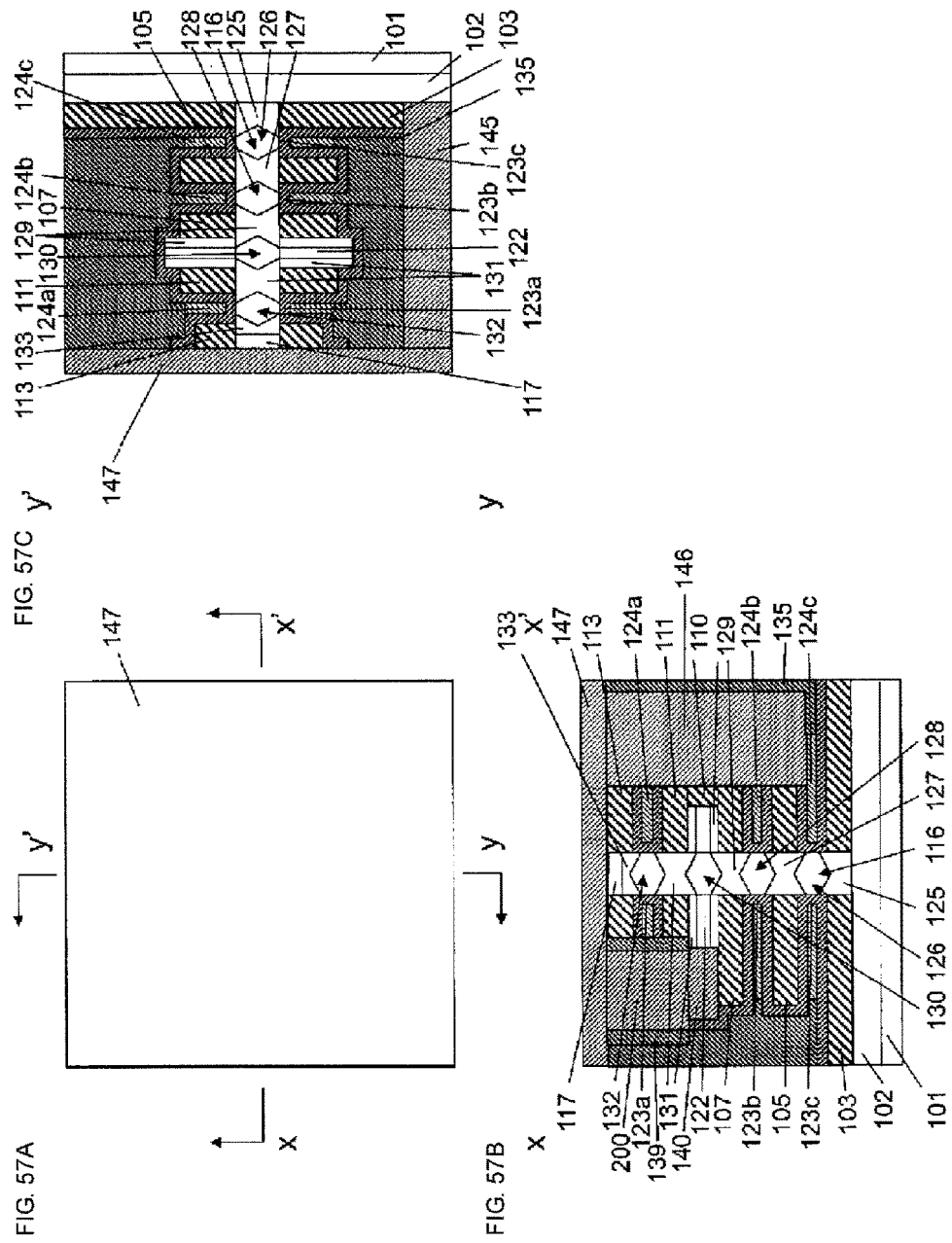

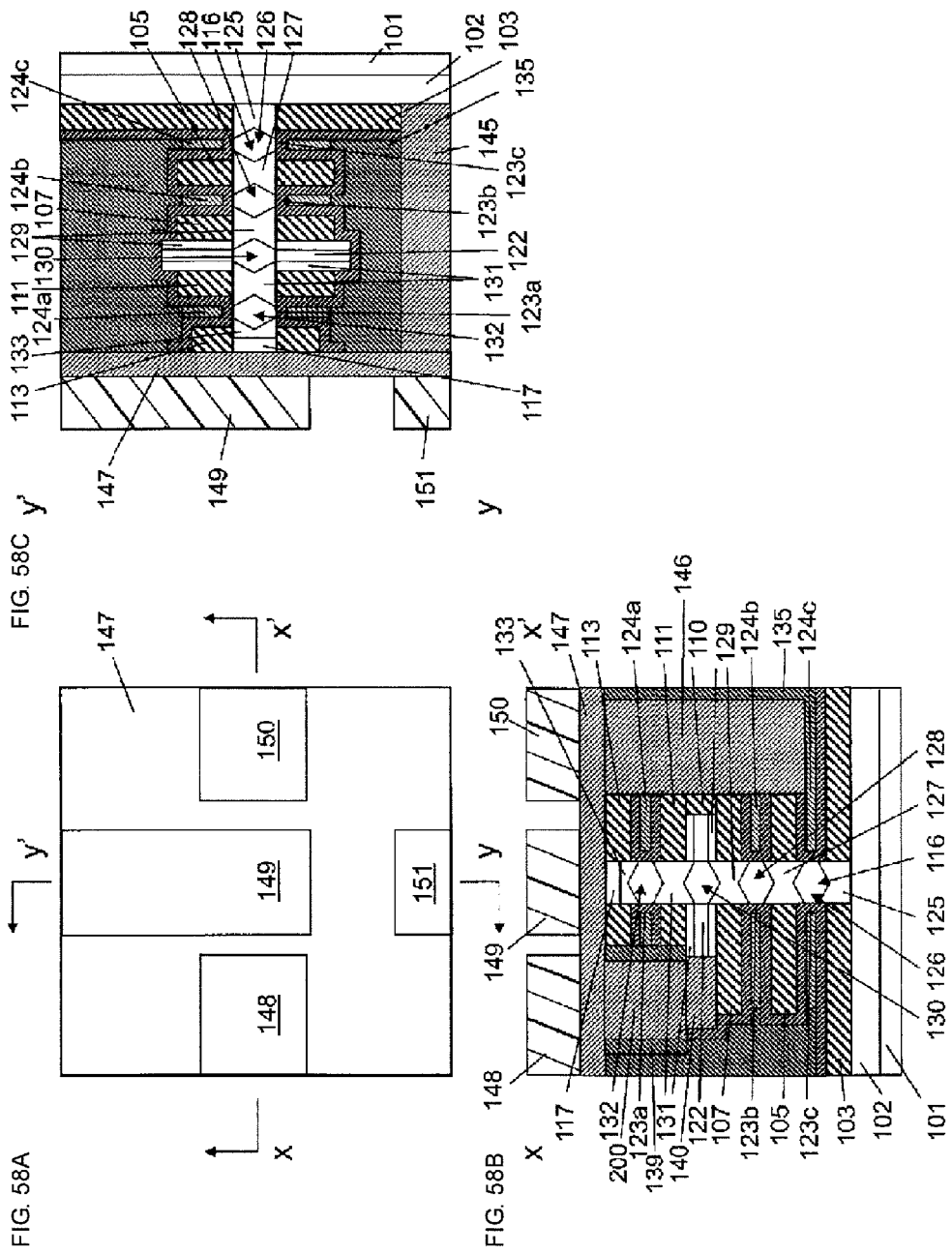

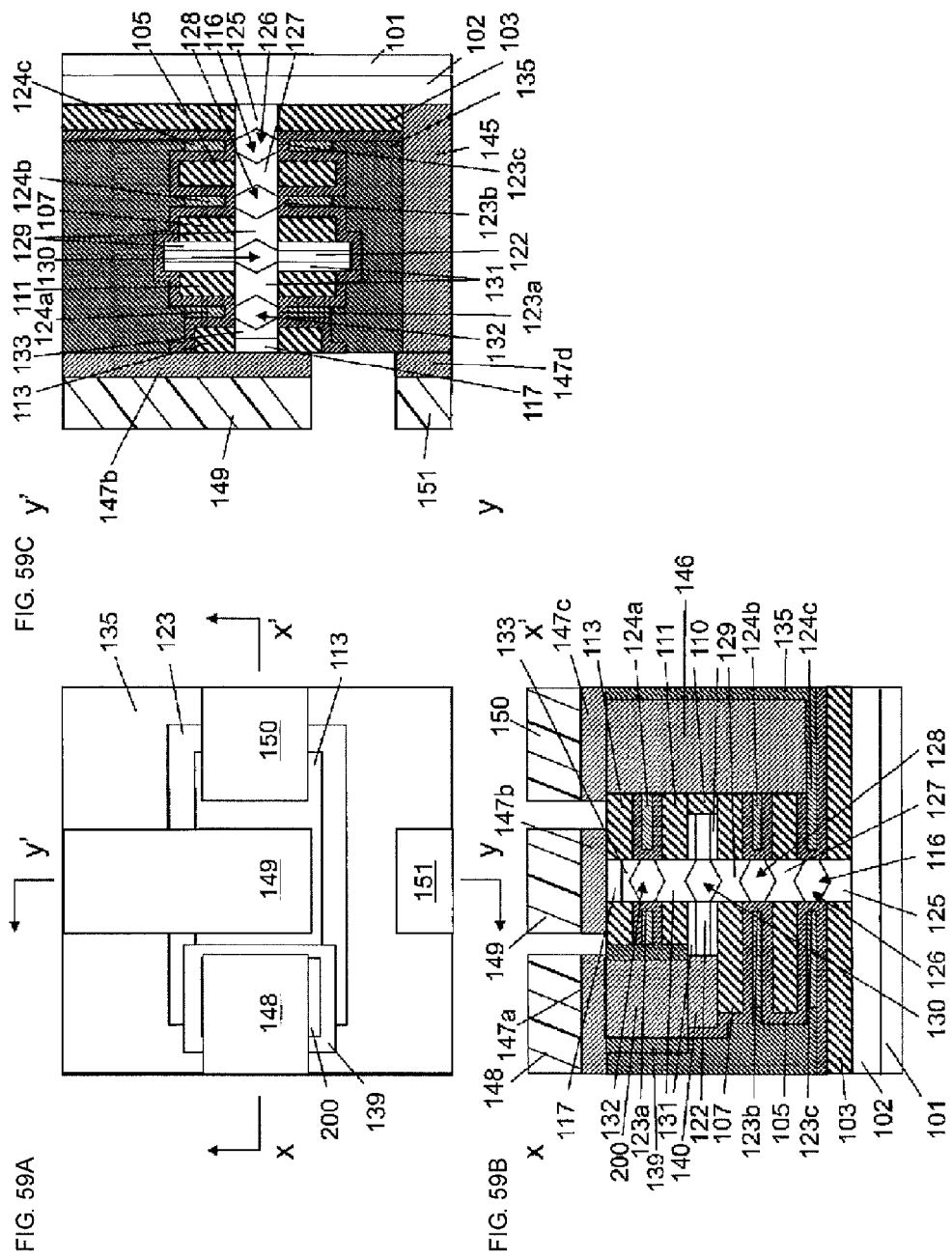

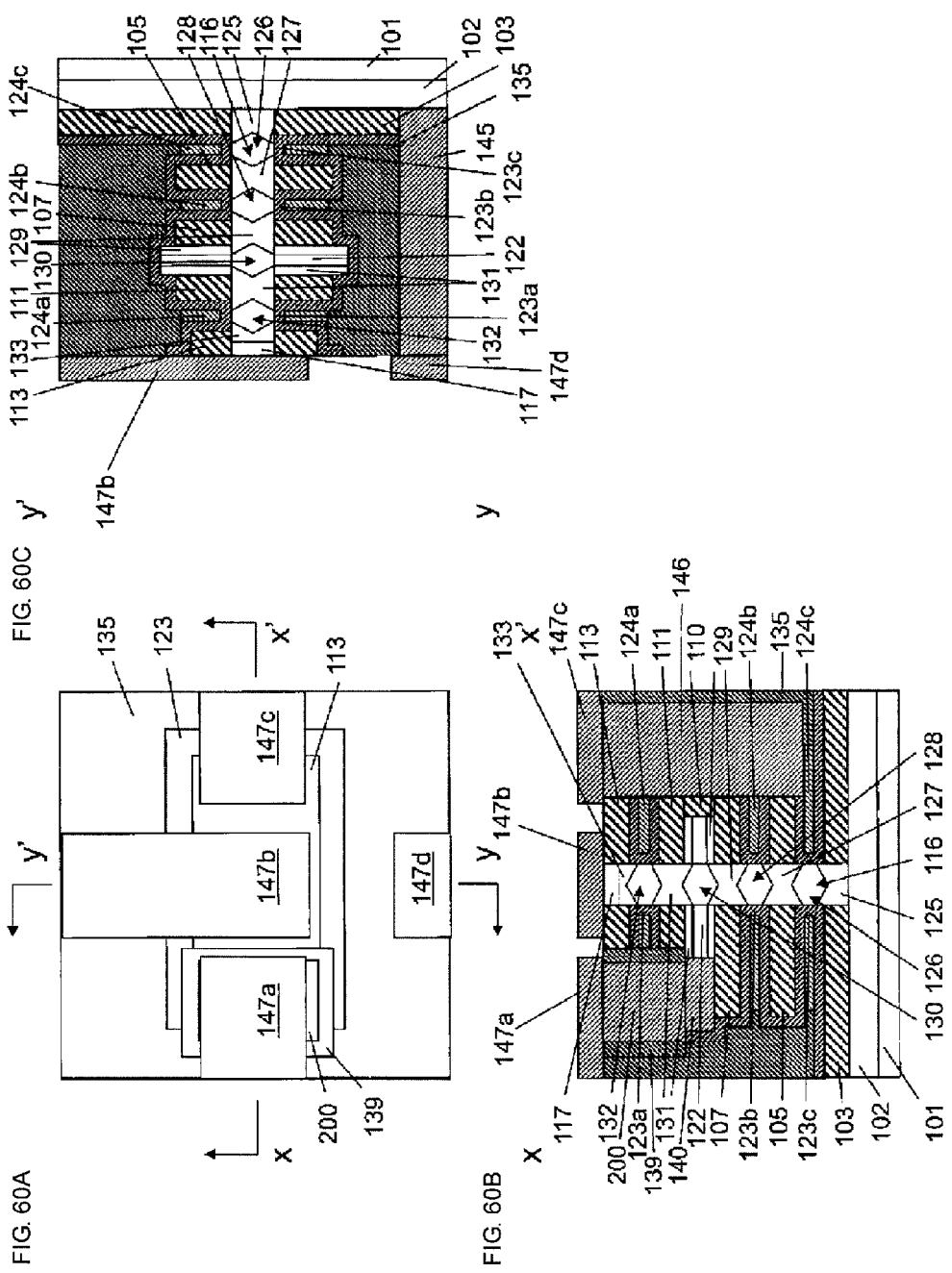

SEMICONDUCTOR DEVICE AND METHOD FOR PRODUCING SEMICONDUCTOR DEVICE

CROSS REFERENCES TO RELATED APPLICATION

The present application claims priority to PCT/JP2014/072563, filed Aug. 28, 2014. The contents of the application are incorporated herein by reference in their entirety.

BACKGROUND OF THE INVENTION

1. Field of the Invention

The present invention relates to a semiconductor device and a method for producing a semiconductor device.

2. Description of the Related Art

In semiconductor integrated circuits, in particular, integrated circuits including MOS transistors, the integration degree has been continuously increased. With this increase in the integration degree, the size of MOS transistors used in integrated circuits has been reduced to the order of nanometers. As reduction in the size of MOS transistors proceeds, leakage current is difficult to suppress. Accordingly, from the standpoint of providing a necessary current, reduction in circuit area is difficult to achieve, which has been problematic. In order to address such a problem, a surrounding gate transistor (hereafter referred to as an "SGT") having the following configuration has been proposed: a source, a gate, and a drain are disposed in a direction perpendicular to a substrate, and a gate electrode is disposed so as to surround a pillar-shaped semiconductor layer (for example, refer to Japanese Unexamined Patent Application Publication Nos. 2-71556, 2-188966, and 3-145761).

An existing inverter including SGTs has the following configuration: a single transistor is formed with respect to a single silicon pillar; accordingly, an nMOS transistor constituted by a single silicon pillar and a pMOS transistor constituted by a single silicon pillar are formed on a surface (for example, refer to Japanese Unexamined Patent Application Publication No. 2008-300558). In this configuration, since at least two silicon pillars are formed on a surface, an area corresponding to at least two silicon pillars is necessary.

An existing nonvolatile memory has a configuration in which a plurality of gates are formed with respect to a single silicon pillar (for example, refer to Japanese Unexamined Patent Application Publication No. 2014-57068). A gate insulating film is formed on the side wall of the silicon pillar. The silicon pillar is connected, at the upper end and the lower end, to a source line and a bit line.

SUMMARY OF THE INVENTION

Accordingly, an object is to provide a semiconductor device having a high integration degree.

A semiconductor device according to an embodiment of the present invention includes a first pillar-shaped semiconductor layer formed on a semiconductor substrate; a first first-conductivity-type semiconductor layer formed in the first pillar-shaped semiconductor layer; a third first-conductivity-type semiconductor layer formed in the first pillar-shaped semiconductor layer and located at a higher position than the first first-conductivity-type semiconductor layer; a first gate insulating film formed so as to surround a region of the first pillar-shaped semiconductor layer, the region being sandwiched between the first first-conductivity-type semiconductor layer and the third first-conductivity-type semiconductor layer; a first gate formed so as to surround the first gate insulating film; a second gate insulating film formed so as to surround a region of the first pillar-shaped semiconductor layer, the region being sandwiched between the first first-conductivity-type semiconductor layer and the third first-conductivity-type semiconductor layer; and a second gate formed so as to surround the second gate insulating film, wherein the first gate and the second gate are mutually connected.

The semiconductor device may include a fourth first-conductivity-type semiconductor layer formed on the semiconductor substrate; the first pillar-shaped semiconductor layer formed on the semiconductor substrate and including the first first-conductivity-type semiconductor layer, a first body region, a second first-conductivity-type semiconductor layer, a second body region, the third first-conductivity-type semiconductor layer, a first second-conductivity-type semiconductor layer, a third body region, a second second-conductivity-type semiconductor layer, and a third second-conductivity-type semiconductor layer formed in this order on the substrate; the first gate insulating film formed so as to surround the first body region; the first gate formed so as to surround the first gate insulating film; the second gate insulating film formed so as to surround the second body region; the second gate formed so as to surround the second gate insulating film; a third gate insulating film formed so as to surround the third body region; a third gate formed so as to surround the third gate insulating film; an output terminal connected to the third first-conductivity-type semiconductor layer and the first second-conductivity-type semiconductor layer; and a first contact connecting the first gate, the second gate, and the third gate.

The output terminal may be formed of a semiconductor and, in the output terminal, the third first-conductivity-type semiconductor layer and the first second-conductivity-type semiconductor layer may be further formed.

The first gate insulating film may be further formed on an upper surface and a lower surface of the first gate, the second gate insulating film may be further formed on an upper surface and a lower surface of the second gate, and the third gate insulating film may be further formed on an upper surface and a lower surface of the third gate.

The semiconductor device may include a first connection region formed between the third first-conductivity-type semiconductor layer and the first second-conductivity-type semiconductor layer.

The semiconductor device may include a first insulating film surrounding the first first-conductivity-type semiconductor layer, a second insulating film surrounding the second first-conductivity-type semiconductor layer, and a third insulating film surrounding the third first-conductivity-type semiconductor layer, the first insulating film containing the same impurity as the first first-conductivity-type semiconductor layer, the second insulating film containing the same impurity as the second first-conductivity-type semiconductor layer, the third insulating film containing the same impurity as the third first-conductivity-type semiconductor layer; and a fourth insulating film surrounding the first second-conductivity-type semiconductor layer and a fifth insulating film surrounding the second second-conductivity-type semiconductor layer, the fourth insulating film containing the same impurity as the first second-conductivity-type semiconductor layer, the fifth insulating film containing the same impurity as the second second-conductivity-type semiconductor layer.

A method for producing a semiconductor device according to an embodiment of the present invention includes depositing a first insulating film that is an oxide film containing an impurity of a first conductivity type on a fourth first-conductivity-type semiconductor layer formed on a substrate; depositing a sixth insulating film that is a nitride film; depositing a second insulating film that is an oxide film containing an impurity of the first conductivity type; depositing a seventh insulating film that is a nitride film; depositing a third insulating film that is an oxide film containing an impurity of the first conductivity type; etching the first insulating film, the sixth insulating film, the second insulating film, and the seventh insulating film to form a contact hole; forming a first pillar-shaped silicon layer in the contact hole by epitaxial growth; removing the sixth insulating film and the seventh insulating film; forming a first gate and a second gate; and forming a contact connecting the first gate and the second gate.

In the method for producing a semiconductor device, after the first pillar-shaped silicon layer is formed in the contact hole by epitaxial growth, heat treatment may be carried out to form, in the first pillar-shaped silicon layer, a first first-conductivity-type semiconductor layer, a second first-conductivity-type semiconductor layer, and a third first-conductivity-type semiconductor layer.

The present invention can provide a semiconductor device having a high integration degree.

As described above, a semiconductor device includes a first pillar-shaped semiconductor layer formed on a semiconductor substrate; a first first-conductivity-type semiconductor layer formed in the first pillar-shaped semiconductor layer; a third first-conductivity-type semiconductor layer formed in the first pillar-shaped semiconductor layer and located at a higher position than the first first-conductivity-type semiconductor layer; a first gate insulating film formed so as to surround a region of the first pillar-shaped semiconductor layer, the region being sandwiched between the first first-conductivity-type semiconductor layer and the third first-conductivity-type semiconductor layer; a first gate formed so as to surround the first gate insulating film; a second gate insulating film formed so as to surround a region of the first pillar-shaped semiconductor layer, the region being sandwiched between the first first-conductivity-type semiconductor layer and the third first-conductivity-type semiconductor layer; and a second gate formed so as to surround the second gate insulating film, wherein the first gate and the second gate are mutually connected. This configuration can provide a semiconductor device in which the gate length is doubled. In general, in order to provide a gate having a large gate length, metal needs to be deposited to a large thickness by atomic layer deposition to fill a recess region having a height corresponding to the gate length; atomic layer deposition of depositing atom layer by atom layer to a large thickness requires long deposition time, which results in an increased production time. In contrast, according to the present invention, the recess regions for gates can be designed so as to have relatively low heights. Thus, deposition of metal to a small thickness by atomic layer deposition will suffice, and the deposition time for atomic layer deposition can be shortened, which results in a decreased production time.

As described above, the semiconductor device may include a fourth first-conductivity-type semiconductor layer formed on the semiconductor substrate; the first pillar-shaped semiconductor layer formed on the semiconductor substrate and including the first first-conductivity-type semiconductor layer, a first body region, a second first-conductivity-type semiconductor layer, a second body region, the third first-conductivity-type semiconductor layer, a first second-conductivity-type semiconductor layer, a third body region, a second second-conductivity-type semiconductor layer, and a third second-conductivity-type semiconductor layer formed in this order on the substrate; the first gate insulating film formed so as to surround the first body region; the first gate formed so as to surround the first gate insulating film; the second gate insulating film formed so as to surround the second body region; the second gate formed so as to surround the second gate insulating film; a third gate insulating film formed so as to surround the third body region; a third gate formed so as to surround the third gate insulating film; an output terminal connected to the third first-conductivity-type semiconductor layer and the first second-conductivity-type semiconductor layer; and a first contact connecting the first gate, the second gate, and the third gate. In this configuration, an inverter constituted by a single semiconductor pillar is formed. Accordingly, an inverter can be provided in an area corresponding to a single semiconductor pillar. In a case where the first conductivity type is an n type and the second conductivity type is a p type, a current in the n-type transistors including the first gate and the second gate can be made equal to a current in the p-type transistor including the third gate, and the circuit threshold can be set to the half of the voltage of the power supply.

In a case where the output terminal is formed of a semiconductor such as silicon, silicon is not etched off by hot phosphoric acid used for removing nitride films and hence the first gate, the second gate, and the third gate can be simultaneously formed. In the output terminal, silicide can be formed.

The first gate insulating film may be further formed on an upper surface and a lower surface of the first gate, the second gate insulating film may be further formed on an upper surface and a lower surface of the second gate, and the third gate insulating film may be further formed on an upper surface and a lower surface of the third gate. This configuration can further enhance the certainty of insulation of the first gate in a direction perpendicular to the upper and lower surfaces, insulation of the second gate in a direction perpendicular to the upper and lower surfaces, and insulation of the third gate in a direction perpendicular to the upper and lower surfaces.

The semiconductor device may include a first connection region formed between the third first-conductivity-type semiconductor layer and the first second-conductivity-type semiconductor layer. In this configuration, the third first-conductivity-type semiconductor layer and the first second-conductivity-type semiconductor layer can be isolated from each other; and the third first-conductivity-type semiconductor layer and the first second-conductivity-type semiconductor layer, which extend to the connection region, can be connected to the output terminal.

The semiconductor device may include a first insulating film surrounding the first first-conductivity-type semiconductor layer, a second insulating film surrounding the second first-conductivity-type semiconductor layer, and a third insulating film surrounding the third first-conductivity-type semiconductor layer, the first insulating film containing the same impurity as the first first-conductivity-type semiconductor layer, the second insulating film containing the same impurity as the second first-conductivity-type semiconductor layer, the third insulating film containing the same impurity as the third first-conductivity-type semiconductor layer; and a fourth insulating film surrounding the first second-conductivity-type semiconductor layer and a fifth insulating film surrounding the second second-conductivity-type semiconductor layer, the fourth insulating film containing the same impurity as the first second-conductivity-type semiconductor layer, the fifth insulating film containing the same impurity as the second second-conductivity-type semiconductor layer. In this configuration, solid-phase diffusion allows formation of semiconductor layers of different conductivity types in a single pillar-shaped semiconductor layer.

BRIEF DESCRIPTION OF THE DRAWINGS

FIG. 1A is a plan view of a semiconductor device according to an embodiment of the present invention; FIG. 1B is a sectional view taken along line x-x' in FIG. 1A; and FIG. 1C is a sectional view taken along line y-y' in FIG. 1A.

FIG. 2A is a plan view relating to a method for producing a semiconductor device according to an embodiment of the present invention;

FIG. 2B is a sectional view taken along line x-x' in FIG. 2A; and FIG. 2C is a sectional view taken along line y-y' in FIG. 2A.

FIG. 3A is a plan view relating to a method for producing a semiconductor device according to an embodiment of the present invention;

FIG. 3B is a sectional view taken along line x-x' in FIG. 3A; and FIG. 3C is a sectional view taken along line y-y' in FIG. 3A.

FIG. 4A is a plan view relating to a method for producing a semiconductor device according to an embodiment of the present invention;

FIG. 4B is a sectional view taken along line x-x' in FIG. 4A; and FIG. 4C is a sectional view taken along line y-y' in FIG. 4A.

FIG. 5A is a plan view relating to a method for producing a semiconductor device according to an embodiment of the present invention;

FIG. 5B is a sectional view taken along line x-x' in FIG. 5A; and FIG. 5C is a sectional view taken along line y-y' in FIG. 5A.

FIG. 6A is a plan view relating to a method for producing a semiconductor device according to an embodiment of the present invention;

FIG. 6B is a sectional view taken along line x-x' in FIG. 6A; and FIG. 6C is a sectional view taken along line y-y' in FIG. 6A.

FIG. 7A is a plan view relating to a method for producing a semiconductor device according to an embodiment of the present invention;

FIG. 7B is a sectional view taken along line x-x' in FIG. 7A; and FIG. 7C is a sectional view taken along line y-y' in FIG. 7A.

FIG. 8A is a plan view relating to a method for producing a semiconductor device according to an embodiment of the present invention;

FIG. 8B is a sectional view taken along line x-x' in FIG. 8A; and FIG. 8C is a sectional view taken along line y-y' in FIG. 8A.

FIG. 9A is a plan view relating to a method for producing a semiconductor device according to an embodiment of the present invention;

FIG. 9B is a sectional view taken along line x-x' in FIG. 9A; and FIG. 9C is a sectional view taken along line y-y' in FIG. 9A.

FIG. 10A is a plan view relating to a method for producing a semiconductor device according to an embodiment of the present invention;

FIG. 10B is a sectional view taken along line x-x' in FIG. 10A; and FIG. 10C is a sectional view taken along line y-y' in FIG. 10A.

FIG. 11A is a plan view relating to a method for producing a semiconductor device according to an embodiment of the present invention;

FIG. 11B is a sectional view taken along line x-x' in FIG. 11A; and FIG. 11C is a sectional view taken along line y-y' in FIG. 11A.

FIG. 12A is a plan view relating to a method for producing a semiconductor device according to an embodiment of the present invention;

FIG. 12B is a sectional view taken along line x-x' in FIG. 12A; and FIG. 12C is a sectional view taken along line y-y' in FIG. 12A.

FIG. 13A is a plan view relating to a method for producing a semiconductor device according to an embodiment of the present invention;

FIG. 13B is a sectional view taken along line x-x' in FIG. 13A; and FIG. 13C is a sectional view taken along line y-y' in FIG. 13A.

FIG. 14A is a plan view relating to a method for producing a semiconductor device according to an embodiment of the present invention;

FIG. 14B is a sectional view taken along line x-x' in FIG. 14A; and FIG. 14C is a sectional view taken along line y-y' in FIG. 14A.

FIG. 15A is a plan view relating to a method for producing a semiconductor device according to an embodiment of the present invention;

FIG. 15B is a sectional view taken along line x-x' in FIG. 15A; and FIG. 15C is a sectional view taken along line y-y' in FIG. 15A.

FIG. 16A is a plan view relating to a method for producing a semiconductor device according to an embodiment of the present invention;

FIG. 16B is a sectional view taken along line x-x' in FIG. 16A; and FIG. 16C is a sectional view taken along line y-y' in FIG. 16A.

FIG. 18A is a plan view relating to a method for producing a semiconductor device according to an embodiment of the present invention;

FIG. 18B is a sectional view taken along line x-x' in FIG. 18A; and FIG. 18C is a sectional view taken along line y-y' in FIG. 18A.

FIG. 20A is a plan view relating to a method for producing a semiconductor device according to an embodiment of the present invention;

FIG. 20B is a sectional view taken along line x-x' in FIG. 20A; and FIG. 20C is a sectional view taken along line y-y' in FIG. 20A.

FIG. 21A is a plan view relating to a method for producing a semiconductor device according to an embodiment of the present invention;

FIG. 21B is a sectional view taken along line x-x' in FIG. 21A; and FIG. 21C is a sectional view taken along line y-y' in FIG. 21A.

FIG. 22A is a plan view relating to a method for producing a semiconductor device according to an embodiment of the present invention;

FIG. 22B is a sectional view taken along line x-x' in FIG. 22A; and FIG. 22C is a sectional view taken along line y-y' in FIG. 22A.

FIG. 23A is a plan view relating to a method for producing a semiconductor device according to an embodiment of the present invention;

FIG. 23B is a sectional view taken along line x-x' in FIG. 23A; and FIG. 23C is a sectional view taken along line y-y' in FIG. 23A.

FIG. 24A is a plan view relating to a method for producing a semiconductor device according to an embodiment of the present invention;

FIG. 24B is a sectional view taken along line x-x' in FIG. 24A; and FIG. 24C is a sectional view taken along line y-y' in FIG. 24A.

FIG. 25A is a plan view relating to a method for producing a semiconductor device according to an embodiment of the present invention;

FIG. 25B is a sectional view taken along line x-x' in FIG. 25A; and FIG. 25C is a sectional view taken along line y-y' in FIG. 25A.

FIG. 26A is a plan view relating to a method for producing a semiconductor device according to an embodiment of the present invention;

FIG. 26B is a sectional view taken along line x-x' in FIG. 26A; and FIG. 26C is a sectional view taken along line y-y' in FIG. 26A.

FIG. 27A is a plan view relating to a method for producing a semiconductor device according to an embodiment of the present invention;

FIG. 27B is a sectional view taken along line x-x' in FIG. 27A; and FIG. 27C is a sectional view taken along line y-y' in FIG. 27A.

FIG. 28A is a plan view relating to a method for producing a semiconductor device according to an embodiment of the present invention;

FIG. 28B is a sectional view taken along line x-x' in FIG. 28A; and FIG. 28C is a sectional view taken along line y-y' in FIG. 28A.

FIG. 29A is a plan view relating to a method for producing a semiconductor device according to an embodiment of the present invention;

FIG. 29B is a sectional view taken along line x-x' in FIG. 29A; and FIG. 29C is a sectional view taken along line y-y' in FIG. 29A.

FIG. 30A is a plan view relating to a method for producing a semiconductor device according to an embodiment of the present invention;

FIG. 30B is a sectional view taken along line x-x' in FIG. 30A; and FIG. 30C is a sectional view taken along line y-y' in FIG. 30A.

FIG. 32A is a plan view relating to a method for producing a semiconductor device according to an embodiment of the present invention;

FIG. 32B is a sectional view taken along line x-x' in FIG. 32A; and FIG. 32C is a sectional view taken along line y-y' in FIG. 32A.

FIG. 36A is a plan view relating to a method for producing a semiconductor device according to an embodiment of the present invention;

FIG. 36B is a sectional view taken along line x-x' in FIG. 36A; and FIG. 36C is a sectional view taken along line y-y' in FIG. 36A.

FIG. 37A is a plan view relating to a method for producing a semiconductor device according to an embodiment of the present invention;

FIG. 37B is a sectional view taken along line x-x' in FIG. 37A; and FIG. 37C is a sectional view taken along line y-y' in FIG. 37A.

FIG. 39A is a plan view relating to a method for producing a semiconductor device according to an embodiment of the present invention;

FIG. 39B is a sectional view taken along line x-x' in FIG. 39A; and FIG. 39C is a sectional view taken along line y-y' in FIG. 39A.

FIG. 40A is a plan view relating to a method for producing a semiconductor device according to an embodiment of the present invention;

FIG. 40B is a sectional view taken along line x-x' in FIG. 40A; and FIG. 40C is a sectional view taken along line y-y' in FIG. 40A.

FIG. 41A is a plan view relating to a method for producing a semiconductor device according to an embodiment of the present invention;

FIG. 41B is a sectional view taken along line x-x' in FIG. 41A; and FIG. 41C is a sectional view taken along line y-y' in FIG. 41A.

FIG. 42A is a plan view relating to a method for producing a semiconductor device according to an embodiment of the present invention;

FIG. 42B is a sectional view taken along line x-x' in FIG. 42A; and FIG. 42C is a sectional view taken along line y-y' in FIG. 42A.

FIG. 43A is a plan view relating to a method for producing a semiconductor device according to an embodiment of the present invention;

FIG. 43B is a sectional view taken along line x-x' in FIG. 43A; and FIG. 43C is a sectional view taken along line y-y' in FIG. 43A.

FIG. 48A is a plan view relating to a method for producing a semiconductor device according to an embodiment of the present invention;

FIG. 48B is a sectional view taken along line x-x' in FIG. 48A; and FIG. 48C is a sectional view taken along line y-y' in FIG. 48A.

FIG. 49A is a plan view relating to a method for producing a semiconductor device according to an embodiment of the present invention;

FIG. 49B is a sectional view taken along line x-x' in FIG. 49A; and FIG. 49C is a sectional view taken along line y-y' in FIG. 49A.

FIG. 50A is a plan view relating to a method for producing a semiconductor device according to an embodiment of the present invention;

FIG. 50B is a sectional view taken along line x-x' in FIG. 50A; and FIG. 50C is a sectional view taken along line y-y' in FIG. 50A.

FIG. 51A is a plan view relating to a method for producing a semiconductor device according to an embodiment of the present invention;

FIG. 51B is a sectional view taken along line x-x' in FIG. 51A; and FIG. 51C is a sectional view taken along line y-y' in FIG. 51A.

FIG. 52A is a plan view relating to a method for producing a semiconductor device according to an embodiment of the present invention;

FIG. 52B is a sectional view taken along line x-x' in FIG. 52A; and FIG. 52C is a sectional view taken along line y-y' in FIG. 52A.

FIG. 53A is a plan view relating to a method for producing a semiconductor device according to an embodiment of the present invention;

FIG. 53B is a sectional view taken along line x-x' in FIG. 53A; and FIG. 53C is a sectional view taken along line y-y' in FIG. 53A.

FIG. 54A is a plan view relating to a method for producing a semiconductor device according to an embodiment of the present invention;

FIG. 54B is a sectional view taken along line x-x' in FIG. 54A; and FIG. 54C is a sectional view taken along line y-y' in FIG. 54A.

FIG. 55A is a plan view relating to a method for producing a semiconductor device according to an embodiment of the present invention;

FIG. 55B is a sectional view taken along line x-x' in FIG. 55A; and FIG. 55C is a sectional view taken along line y-y' in FIG. 55A.

FIG. 56A is a plan view relating to a method for producing a semiconductor device according to an embodiment of the present invention;

FIG. 56B is a sectional view taken along line x-x' in FIG. 56A; and FIG. 56C is a sectional view taken along line y-y' in FIG. 56A.

FIG. 57A is a plan view relating to a method for producing a semiconductor device according to an embodiment of the present invention;

FIG. 57B is a sectional view taken along line x-x' in FIG. 57A; and FIG. 57C is a sectional view taken along line y-y' in FIG. 57A.

FIG. 58A is a plan view relating to a method for producing a semiconductor device according to an embodiment of the present invention;

FIG. 58B is a sectional view taken along line x-x' in FIG. 58A; and FIG. 58C is a sectional view taken along line y-y' in FIG. 58A.

FIG. 59A is a plan view relating to a method for producing a semiconductor device according to an embodiment of the present invention;

FIG. 59B is a sectional view taken along line x-x' in FIG. 59A; and FIG. 59C is a sectional view taken along line y-y' in FIG. 59A.

FIG. 60A is a plan view relating to a method for producing a semiconductor device according to an embodiment of the present invention;

FIG. 60B is a sectional view taken along line x-x' in FIG. 60A; and FIG. 60C is a sectional view taken along line y-y' in FIG. 60A.

DETAILED DESCRIPTION OF THE PREFERRED EMBODIMENTS

Figure 17C:
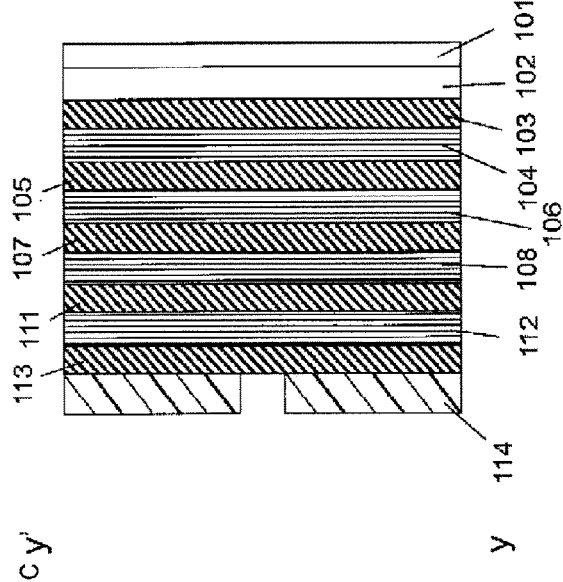
FIG. 17C is a sectional view taken along line y-y' in FIG. 17A.

Hereinafter, an embodiment according to the present invention will be described. FIGS. 1A to 1C illustrate the structure of a semiconductor device according to an embodiment of the present invention. In this embodiment, silicon is used as the semiconductor. Alternatively, a semiconductor other than silicon may be used.

The semiconductor device includes a first pillar-shaped silicon layer 116 formed on a silicon substrate 101; a first first-conductivity-type silicon layer 125 formed in the first pillar-shaped silicon layer 116; a third first-conductivity-type silicon layer 129 formed in the first pillar-shaped silicon layer 116 and located at a higher position than the first first-conductivity-type silicon layer 125; a first gate insulating film 123c formed so as to surround a region of the first pillar-shaped silicon layer 116, the region being sandwiched between the first first-conductivity-type silicon layer 125 and the third first-conductivity-type silicon layer 129; a first gate 124c formed so as to surround the first gate insulating film 123c; a second gate insulating film 123b formed so as to surround a region of the first pillar-shaped silicon layer 116, the region being sandwiched between the first first-conductivity-type silicon layer 125 and the third first-conductivity-type silicon layer 129; and a second gate 124b formed so as to surround the second gate insulating film 123b, wherein the first gate 124c and the second gate 124b are mutually connected.

The semiconductor device includes a fourth first-conductivity-type silicon layer 102 formed on the silicon substrate 101; the first pillar-shaped silicon layer 116 formed on the silicon substrate 101 and including the first first-conductivity-type silicon layer 125, a first body region 126, a second first-conductivity-type silicon layer 127, a second body region 128, the third first-conductivity-type silicon layer 129, a first second-conductivity-type silicon layer 131, a third body region 132, a second second-conductivity-type silicon layer 133, and a third second-conductivity-type silicon layer 117 formed in this order on the substrate; the first gate insulating film 123c formed so as to surround the first body region 126; the first gate 124c formed so as to surround the first gate insulating film 123c; the second gate insulating film 123b formed so as to surround the second body region 128; the second gate 124b formed so as to surround the second gate insulating film 123b; a third gate insulating film 123a formed so as to surround the third body region 132; a third gate 124a formed so as to surround the third gate insulating film 132a; an output terminal 122 connected to the third first-conductivity-type silicon layer 129 and the first second-conductivity-type silicon layer 131; and a first contact 146 connecting the first gate 124c, the second gate 124b, and the third gate 124a.

The output terminal 122 is formed of silicon and, in the output terminal 122, the third first-conductivity-type silicon layer 129 and the first second-conductivity-type silicon layer 131 are further formed.

The output terminal 122 includes a silicide 140, which connects the third first-conductivity-type silicon layer 129 and the first second-conductivity-type silicon layer 131. A contact may be formed to connect the third first-conductivity-type silicon layer 129 and the first second-conductivity-type silicon layer 131.

The first gate 124c, the second gate 124b, and the third gate 124a are preferably formed of metal in order to adjust the thresholds of the transistors. The metal is preferably titanium nitride or titanium aluminum nitride. The first gate insulating film 123c, the second gate insulating film 123b, and the third gate insulating film 123a are preferably an oxide film, an oxynitride film, and a high-dielectric film.

The first gate insulating film 123c is further formed on an upper surface and a lower surface of the first gate 124c, the second gate insulating film 123b is further formed on an upper surface and a lower surface of the second gate 124b, and the third gate insulating film 123a is further formed on an upper surface and a lower surface of the third gate 124a.

The semiconductor device includes a first connection region 130 formed between the third first-conductivity-type silicon layer 129 and the first second-conductivity-type silicon layer 131.

The semiconductor device includes a first insulating film 103 surrounding the first first-conductivity-type silicon layer 125, a second insulating film 105 surrounding the second first-conductivity-type silicon layer 127, a third insulating film 107 surrounding the third first-conductivity-type silicon layer 129, the first insulating film 103 containing the same impurity as the first first-conductivity-type silicon layer 125, the second insulating film 105 containing the same impurity as the second first-conductivity-type silicon layer 127, the third insulating film 107 containing the same impurity as the third first-conductivity-type silicon layer 129; and a fourth insulating film 111 surrounding the first second-conductivity-type silicon layer 131 and a fifth insulating film 113 surrounding the second second-conductivity-type silicon layer 133, the fourth insulating film 111 containing the same impurity as the first second-conductivity-type silicon layer 131, the fifth insulating film 113 containing the same impurity as the second second-conductivity-type silicon layer 133.

In a case where lower transistors are nMOS transistors, the first insulating film 103, the second insulating film 105, and the third insulating film 107 are preferably oxide films that have high concentrations of phosphorus or arsenic. In a case where an upper transistor is a pMOS transistor, the fourth insulating film 111 and the fifth insulating film 113 are preferably oxide films that have high concentrations of boron. In a case where lower transistors are pMOS transistors, the first insulating film 103, the second insulating film 105, and the third insulating film 107 are preferably oxide films that have high concentrations of boron. In a case where an upper transistor is an nMOS transistor, the fourth insulating film 111 and the fifth insulating film 113 are preferably oxide films that have high concentrations of phosphorus or arsenic. In this embodiment, two nMOS transistors are disposed in series in the lower portion and one pMOS transistor is disposed in the upper portion. Alternatively, another configuration may be employed in which one pMOS transistor is disposed in a lower portion and two nMOS transistors are disposed in series in an upper portion. A plurality of nMOS transistors may be disposed in series. A plurality of pMOS transistors may be disposed in series.

Production steps for forming an SGT structure according to an embodiment of the present invention will be described with reference to FIG. 2A to FIG. 60C. In this embodiment, the substrate is formed of silicon. Alternatively, the substrate may be formed of another semiconductor. This embodiment employs steps of forming nMOS transistors in a lower portion of a pillar-shaped semiconductor layer and a pMOS transistor in an upper portion of the pillar-shaped semiconductor layer. Alternatively, pMOS transistors may be formed in a lower portion of a pillar-shaped semiconductor layer and an nMOS transistor may be formed in an upper portion of the pillar-shaped semiconductor layer.

As illustrated in FIGS. 2A to 2C, impurity is introduced into a silicon substrate 101 to form a fourth first-conductivity-type silicon layer 102.

As illustrated in FIGS. 3A to 3C, a first insulating film 103 is formed. The first insulating film 103 is preferably an oxide film, and is preferably an oxide film that has a high concentration of phosphorus or arsenic. This oxide film that has a high concentration of phosphorus or arsenic may be formed by forming the first insulating film 103 and subsequently implanting impurity into the first insulating film 103.

As illustrated in FIGS. 4A to 4C, a sixth insulating film 104 is formed. The sixth insulating film 104 is preferably a nitride film.

As illustrated in FIGS. 5A to 5C, a second insulating film 105 is formed. The second insulating film 105 is preferably an oxide film, and is preferably an oxide film that has a high concentration of phosphorus or arsenic. This oxide film that has a high concentration of phosphorus or arsenic may be formed by forming the second insulating film 105 and subsequently implanting impurity into the second insulating film 105.

As illustrated in FIGS. 6A to 6C, a seventh insulating film 106 is formed. The seventh insulating film 106 is preferably a nitride film.

As illustrated in FIGS. 7A to 7C, a third insulating film 107 is formed. The third insulating film 107 is preferably an oxide film, and is preferably an oxide film that has a high concentration of phosphorus or arsenic. This oxide film that has a high concentration of phosphorus or arsenic may be formed by forming the third insulating film 107 and subsequently implanting impurity into the third insulating film 107.

As illustrated in FIGS. 8A to 8C, an eighth insulating film 108 is formed. The eighth insulating film 108 is preferably a nitride film.

As illustrated in FIGS. 9A to 9C, a first resist 109 is formed.

As illustrated in FIGS. 10A to 10C, the eighth insulating film 108 is etched.

As illustrated in FIGS. 11A to 11C, the first resist 109 is removed.

As illustrated in FIGS. 12A to 12C, a ninth insulating film 110 is formed and planarized. The ninth insulating film 110 is preferably an oxide film.

As illustrated in FIGS. 13A to 13C, the ninth insulating film 110 is subjected to etch back to thereby expose the eighth insulating film 108.

As illustrated in FIGS. 14A to 14C, a fourth insulating film 111 is formed. The fourth insulating film 111 is preferably an oxide film, and is preferably an oxide film that has a high concentration of boron. This oxide film that has a high concentration of boron may be formed by forming the fourth insulating film 111 and subsequently implanting impurity into the fourth insulating film 111.

As illustrated in FIGS. 15A to 15C, a tenth insulating film 112 is formed. The tenth insulating film 112 is preferably a nitride film.

As illustrated in FIGS. 16A to 16C, a fifth insulating film 113 is formed. The fifth insulating film 113 is preferably an oxide film, and is preferably an oxide film that has a high concentration of boron. This oxide film that has a high concentration of boron may be formed by forming the fifth insulating film 113 and subsequently implanting impurity into the fifth insulating film 113.

Figure 17A:
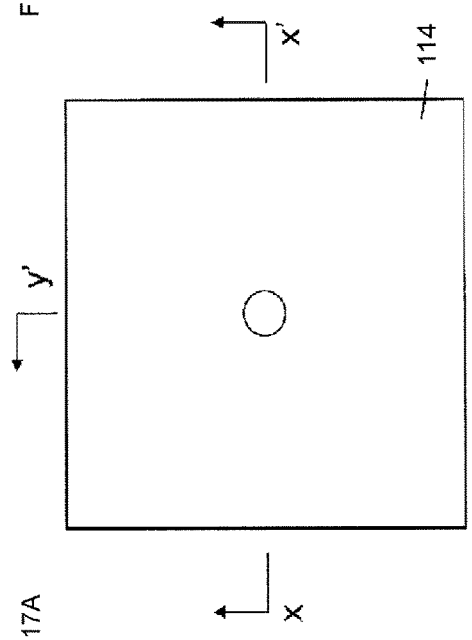
FIG. 17A is a plan view relating to a method for producing a semiconductor device according to an embodiment of the present invention.
Figure 17B:
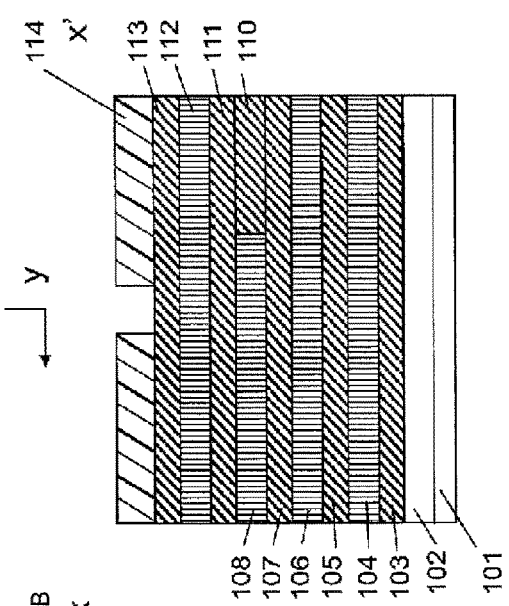
FIG. 17B is a sectional view taken along line x-x' in FIG. 17A.

As illustrated in FIGS. 17A to 17C, a second resist 114 is formed.

As illustrated in FIGS. 18A to 18C, the fifth insulating film 113, the tenth insulating film 112, the fourth insulating film 111, the eighth insulating film 108, the third insulating film 107, the seventh insulating film 106, the second insulating film 105, the sixth insulating film 104, and the first insulating film 103 are etched to form a contact hole 115.

Figures 19A, 19B, 19C:
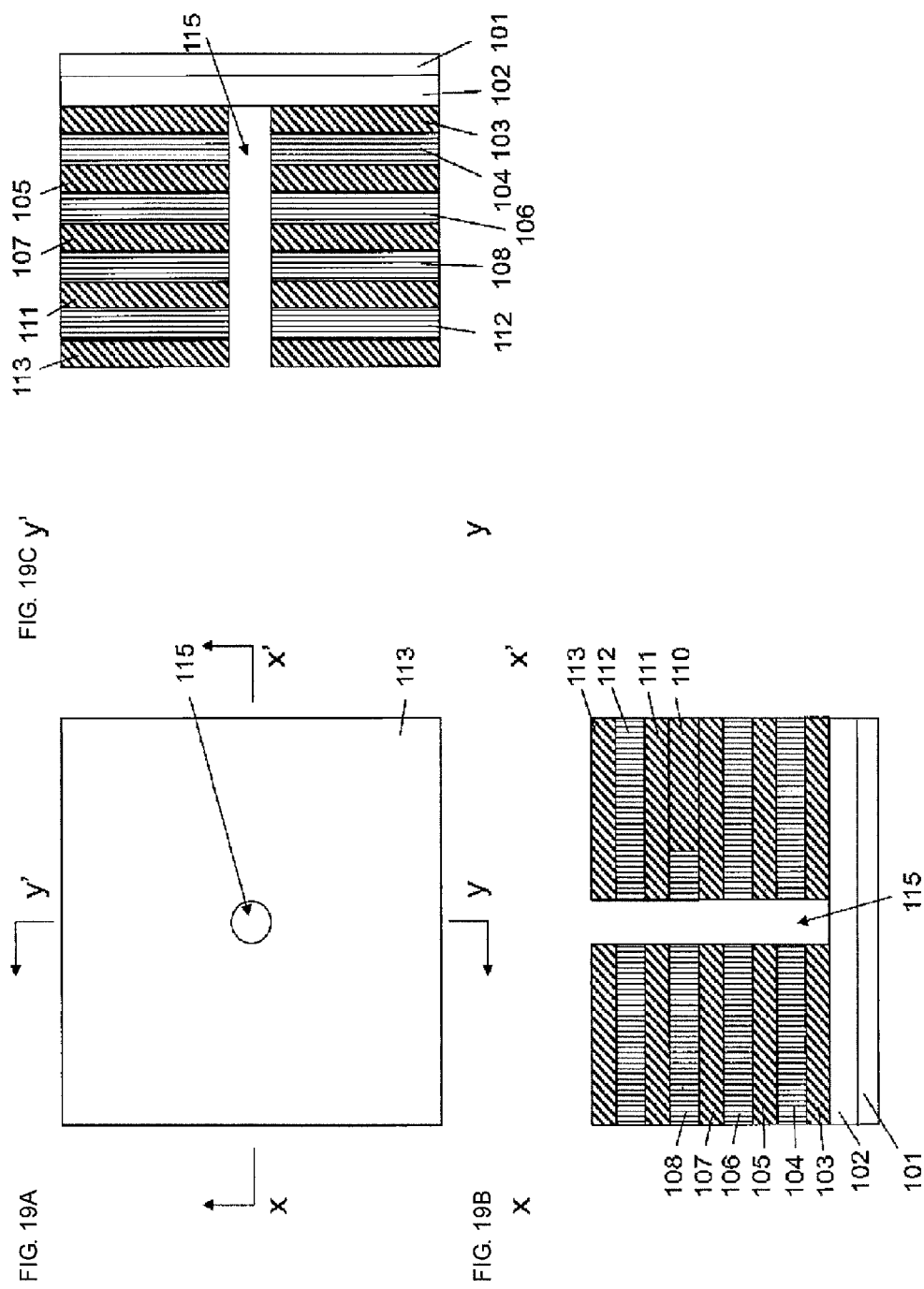
FIG. 19A is a plan view relating to a method for producing a semiconductor device according to an embodiment of the present invention.
FIG. 19B is a sectional view taken along line x-x' in FIG. 19A.
FIG. 19C is a sectional view taken along line y-y' in FIG. 19A.

As illustrated in FIGS. 19A to 19C, the second resist 114 is removed.

As illustrated in FIGS. 20A to 20C, epitaxial growth is carried out to form a first pillar-shaped silicon layer 116. Alternatively, the first pillar-shaped silicon layer 116 may be formed by depositing polysilicon.

As illustrated in FIGS. 21A to 21C, a boron impurity is introduced to form a third second-conductivity-type silicon layer 117.

As illustrated in FIGS. 22A to 22C, a polysilicon 118 is deposited. Although polysilicon is used here, another material that provides a hard mask can be used.

As illustrated in FIGS. 23A to 23C, an eleventh insulating film 119 is deposited. The eleventh insulating film 119 is preferably an oxide film.

As illustrated in FIGS. 24A to 24C, a third resist 120 is formed.

As illustrated in FIGS. 25A to 25C, the eleventh insulating film 119, the polysilicon 118, the fifth insulating film 113, the tenth insulating film 112, and the fourth insulating film 111 are etched.

As illustrated in FIGS. 26A to 26C, the third resist 120 is removed.

As illustrated in FIGS. 27A to 27C, a twelfth insulating film 121 is deposited. The twelfth insulating film 121 is preferably an oxide film.

As illustrated in FIGS. 28A to 28C, the twelfth insulating film 121 is etched such that side wall portions thereof are left.

As illustrated in FIGS. 29A to 29C, the eighth insulating film 108 is removed. This is preferably achieved by wet etching with hot phosphoric acid. Alternatively, dry etching may be employed.

As illustrated in FIGS. 30A to 30C, epitaxial growth of silicon is carried out to form an output terminal 122. Alternatively, the output terminal 122 may be formed of polysilicon.

Figure 31C:
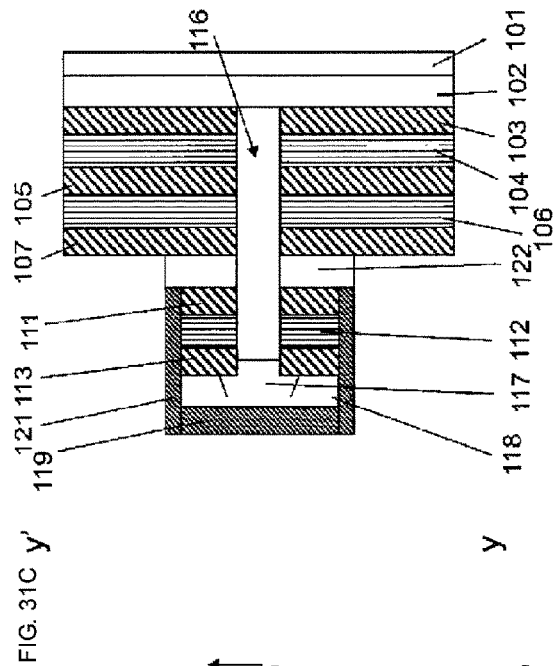
FIG. 31C is a sectional view taken along line y-y' in FIG. 31A.
Figure 31A:
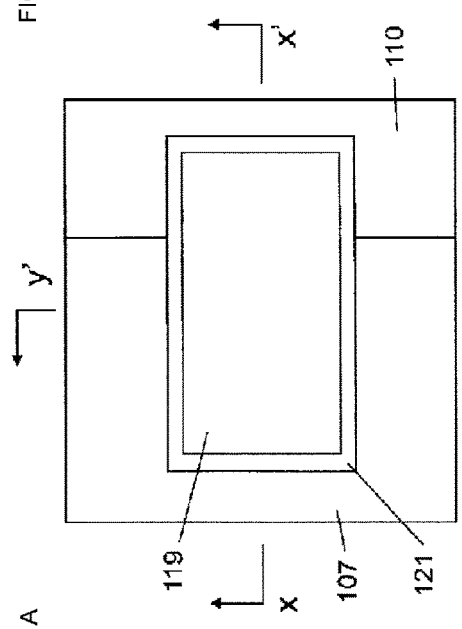
FIG. 31A is a plan view relating to a method for producing a semiconductor device according to an embodiment of the present invention.
Figure 31B:
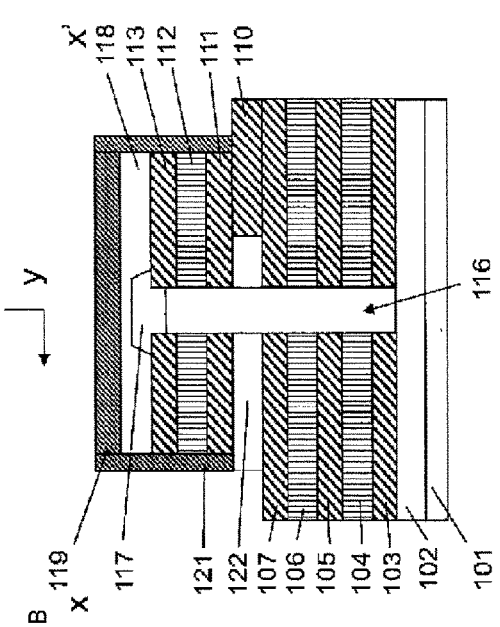
FIG. 31B is a sectional view taken along line x-x' in FIG. 31A.

As illustrated in FIGS. 31A to 31C, silicon etching is carried out to remove an unnecessary portion of the output terminal 122. The silicon etching is preferably carried out by dry etching.

As illustrated in FIGS. 32A to 32C, the ninth insulating film 110, the third insulating film 107, the seventh insulating film 106, and the second insulating film 105 are etched, preferably by dry etching. During this etching, the eleventh insulating film 119 and the twelfth insulating film 121 are also etched.

Figure 33A:
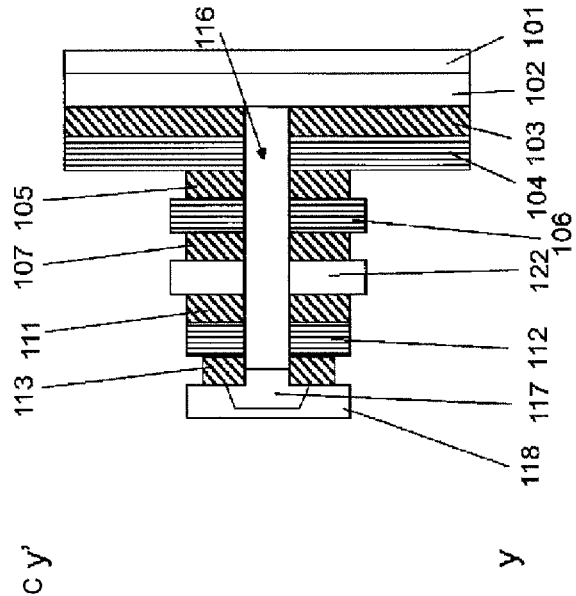
FIG. 33A is a plan view relating to a method for producing a semiconductor device according to an embodiment of the present invention.
Figure 33B:
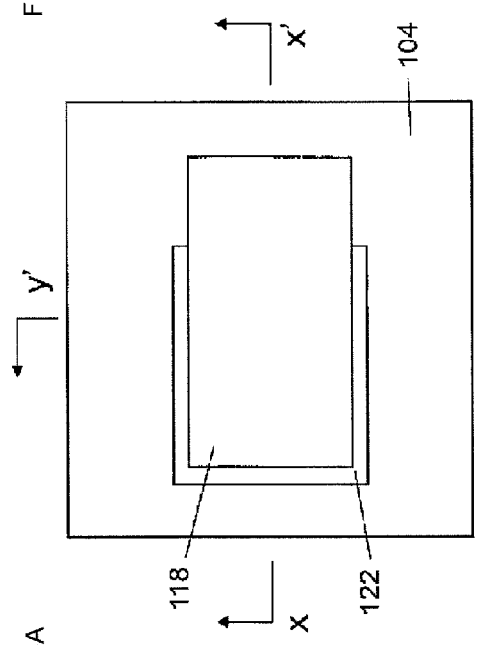
FIG. 33B is a sectional view taken along line x-x' in FIG. 33A.
Figure 33C:
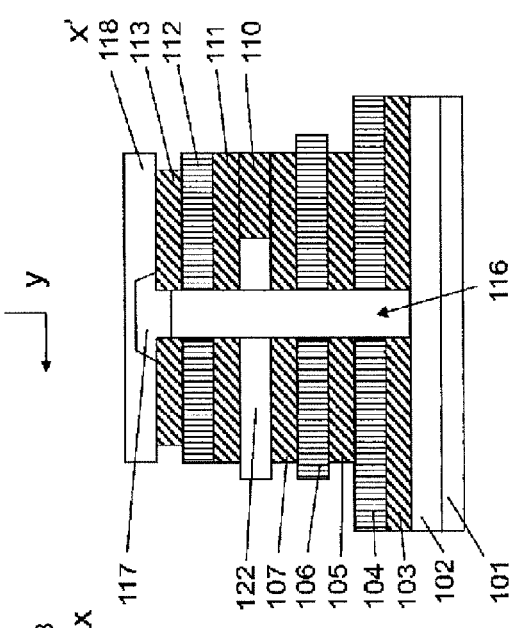
FIG. 33C is a sectional view taken along line y-y' in FIG. 33A.

As illustrated in FIGS. 33A to 33C, the twelfth insulating film 121 is removed, preferably by isotropic etching such as wet etching.

Figure 34C:
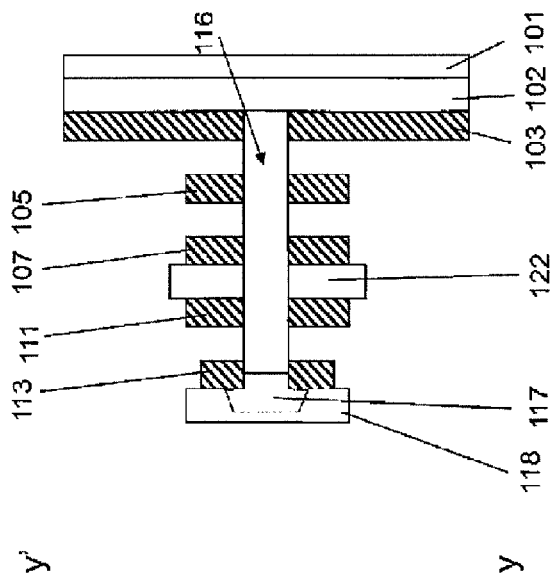
FIG. 34C is a sectional view taken along line y-y' in FIG. 34A.
Figure 34A:
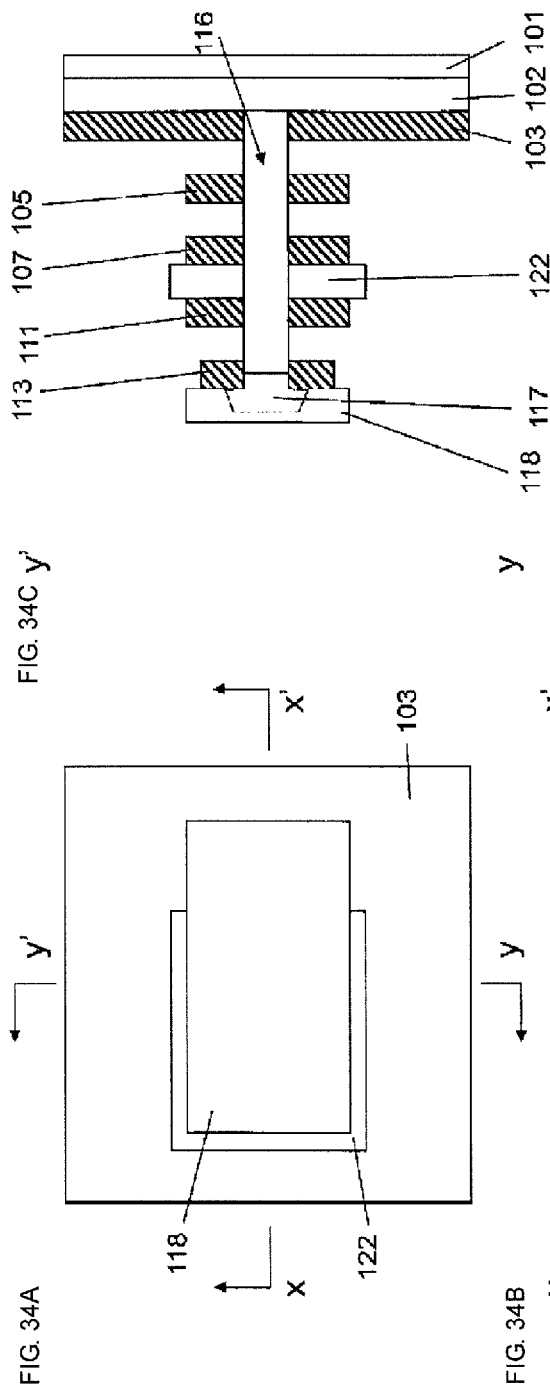
FIG. 34A is a plan view relating to a method for producing a semiconductor device according to an embodiment of the present invention.
Figure 34B:
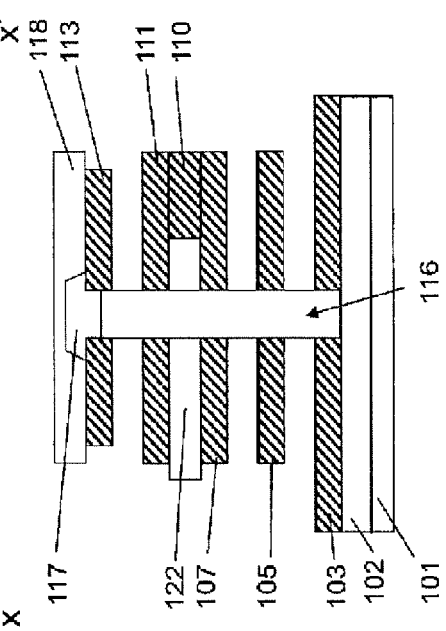
FIG. 34B is a sectional view taken along line x-x' in FIG. 34A.

As illustrated in FIGS. 34A to 34C, the tenth insulating film 112, the seventh insulating film 106, and the sixth insulating film 104 are removed, preferably by wet etching with hot phosphoric acid. Alternatively, dry etching may be employed. The output terminal, which is formed of silicon, is not etched off by hot phosphoric acid used for removing the nitride films.

Figure 35C:
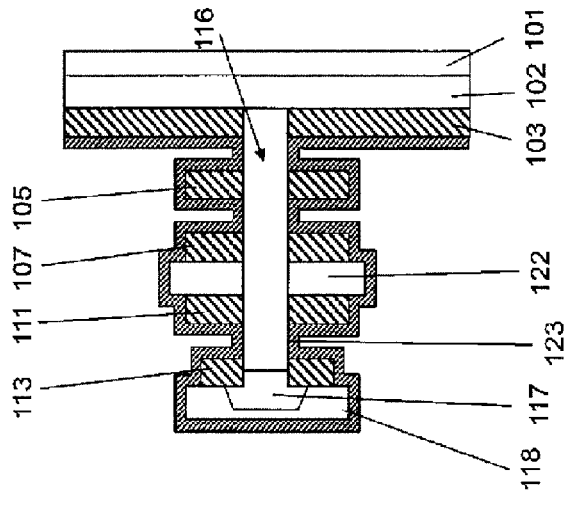
FIG. 35C is a sectional view taken along line y-y' in FIG. 35A.
Figure 35A:
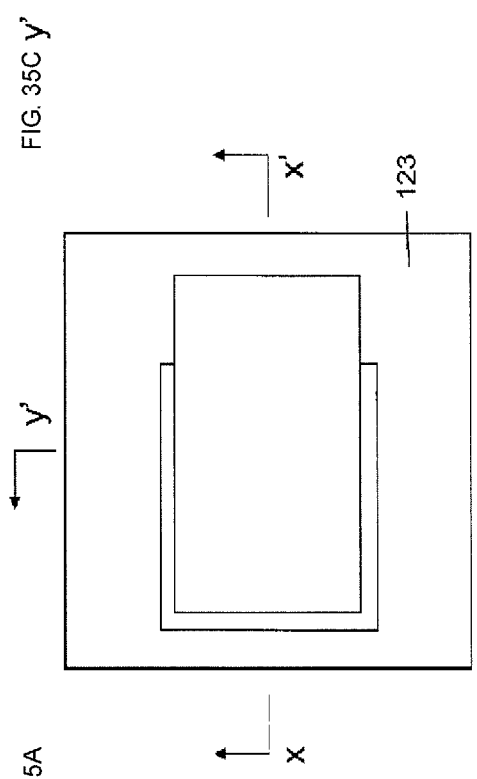
FIG. 35A is a plan view relating to a method for producing a semiconductor device according to an embodiment of the present invention.
Figure 35B:
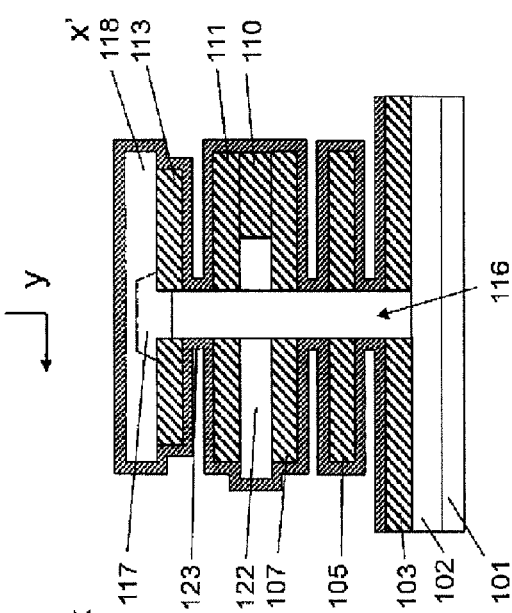
FIG. 35B is a sectional view taken along line x-x' in FIG. 35A.

As illustrated in FIGS. 35A to 35C, a gate insulating film 123 is formed. The gate insulating film 123 is preferably an oxide film, an oxynitride film, or a high-dielectric film.

As illustrated in FIGS. 36A to 36C, a metal 124 that is to provide gates is formed. The metal 124 is preferably formed of titanium nitride or titanium aluminum nitride. The metal 124 may be formed of titanium, tantalum, tungsten, or tantalum nitride, or may be constituted by a laminated structure including layers formed of the foregoing. The recess regions for gates can be designed so as to have relatively low heights. Thus, deposition of metal to a small thickness by atomic layer deposition will suffice, and the deposition time for atomic layer deposition can be shortened, which results in a decreased production time.

As illustrated in FIGS. 37A to 37C, the metal 124 is etched to form a first gate 124c, a second gate 124b, and a third gate 124a. At this time, the gate insulating film 123 includes a first gate insulating film 123c, a second gate insulating film 123b, and a third gate insulating film 123a. The metal is preferably etched by isotropic etching.

Figure 38A:
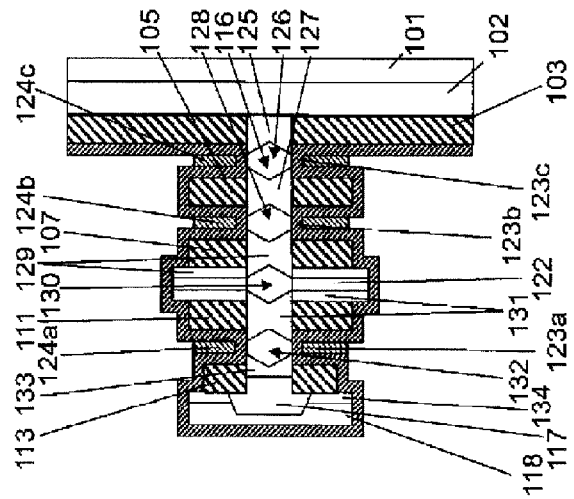
FIG. 38A is a plan view relating to a method for producing a semiconductor device according to an embodiment of the present invention.
Figure 38B:
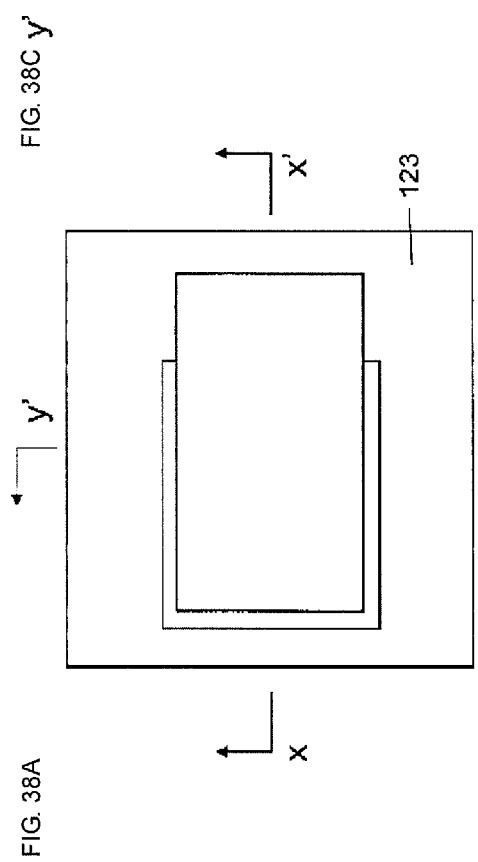
FIG. 38B is a sectional view taken along line x-x' in FIG. 38A.
Figure 38C:
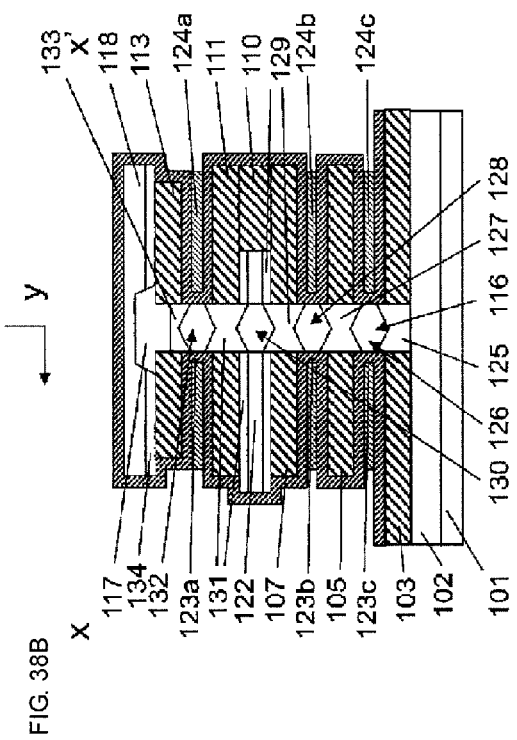
FIG. 38C is a sectional view taken along line y-y' in FIG. 38A.

As illustrated in FIGS. 38A to 38C, heat treatment is carried out to cause solid-phase diffusion to thereby form a first first-conductivity-type silicon layer 125, a second first-conductivity-type silicon layer 127, a third first-conductivity-type silicon layer 129, a first second-conductivity-type silicon layer 131, and a second second-conductivity-type silicon layer 133. The heat treatment may be carried out before the first gate 123c, the second gate 123b, and the third gate 123a are formed. In addition, in the output terminal 122, a third first-conductivity-type silicon layer 129 and a first second-conductivity-type silicon layer 131 are formed. In addition, a diffusion layer 134 is formed in the polysilicon 118.

As illustrated in FIGS. 39A to 39C, a first interlayer insulating film 135 is formed.

As illustrated in FIGS. 40A to 40C, the first interlayer insulating film 135 is planarized and subjected to etch back. At this time, an upper portion of the gate insulating film 123, the polysilicon 118, and an upper portion of the third second-conductivity-type silicon layer 117 are removed.

As illustrated in FIGS. 41A to 41C, a second interlayer insulating film 136 is deposited.

As illustrated in FIGS. 42A to 42C, a fourth resist 137 is formed.

As illustrated in FIGS. 43A to 43C, the second interlayer insulating film 136, the first interlayer insulating film 135, the fifth insulating film 113, the third gate insulating film 123a, the third gate 124a, the third gate insulating film 132a, and the fourth insulating film 111 are etched to form a contact hole 138.

Figure 44C:
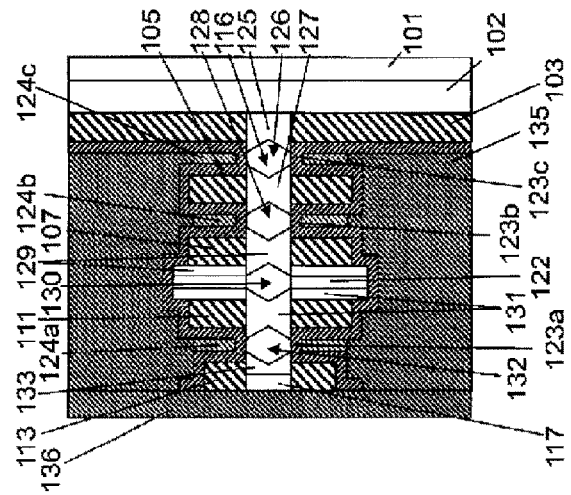
FIG. 44C is a sectional view taken along line y-y' in FIG. 44A.
Figure 44A:
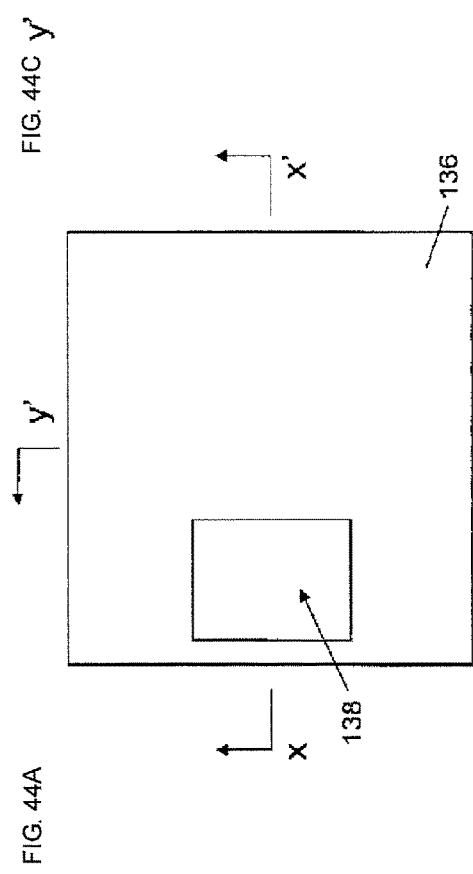
FIG. 44A is a plan view relating to a method for producing a semiconductor device according to an embodiment of the present invention.
Figure 44B:
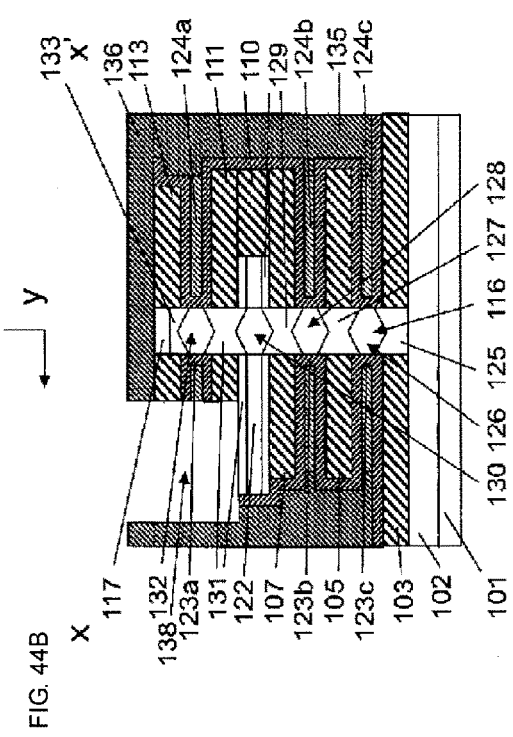
FIG. 44B is a sectional view taken along line x-x' in FIG. 44A.

As illustrated in FIGS. 44A to 44C, the fourth resist 137 is removed.

Figure 45C:
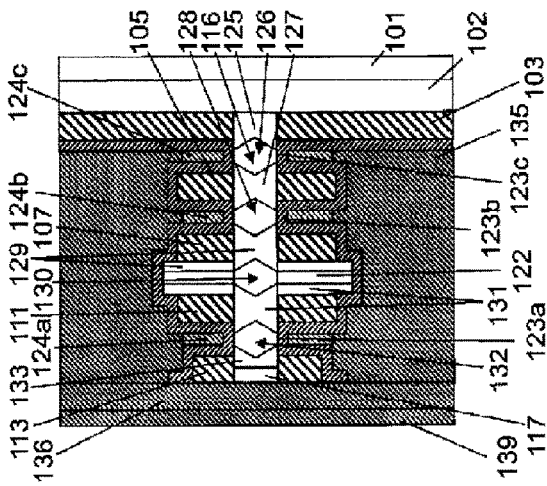
FIG. 45C is a sectional view taken along line y-y' in FIG. 45A.
Figure 45A:
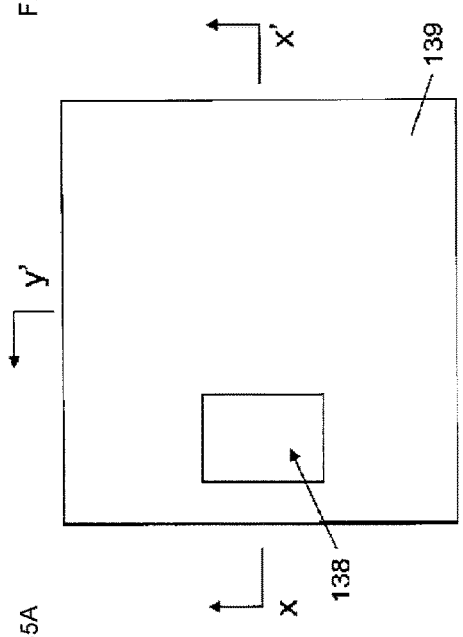
FIG. 45A is a plan view relating to a method for producing a semiconductor device according to an embodiment of the present invention.
Figure 45B:
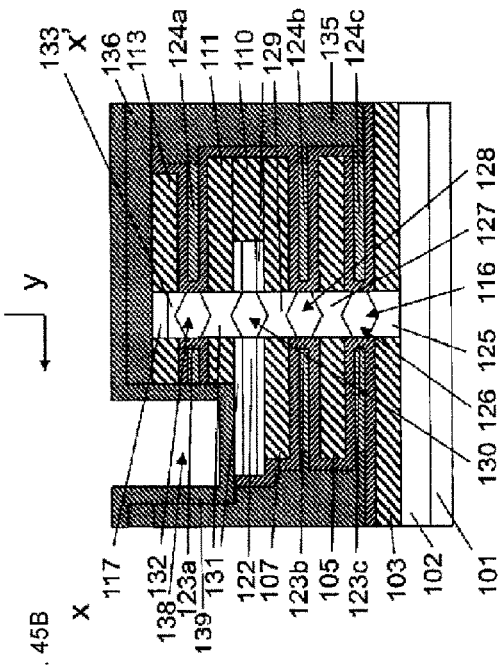
FIG. 45B is a sectional view taken along line x-x' in FIG. 45A.

As illustrated in FIGS. 45A to 45C, a thirteenth insulating film 139 is deposited. The thirteenth insulating film 139 is preferably an oxide film or a nitride film.

Figure 46C:
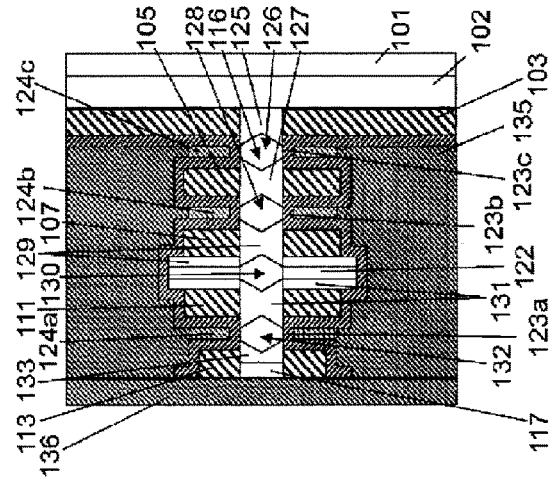
FIG. 46C is a sectional view taken along line y-y' in FIG. 46A.
Figure 46A:
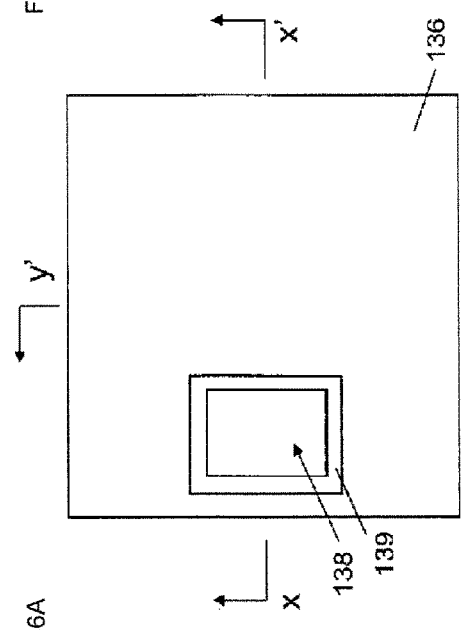
FIG. 46A is a plan view relating to a method for producing a semiconductor device according to an embodiment of the present invention.
Figure 46B:
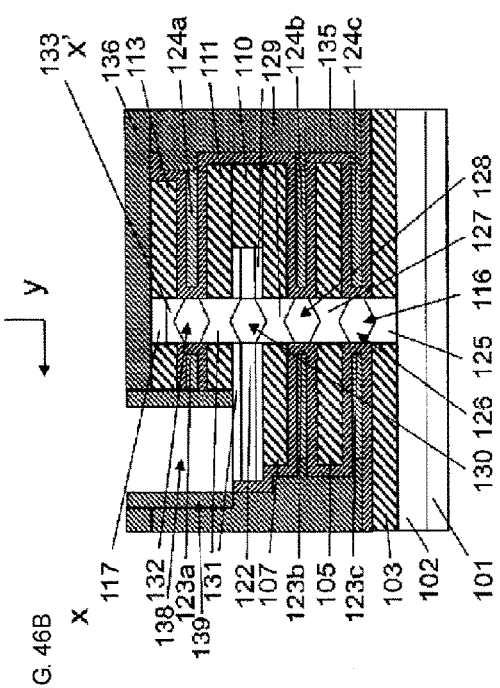
FIG. 46B is a sectional view taken along line x-x' in FIG. 46A.

As illustrated in FIGS. 46A to 46C, the thirteenth insulating film 139 is etched such that side wall portions thereof are left.

Figure 47C:
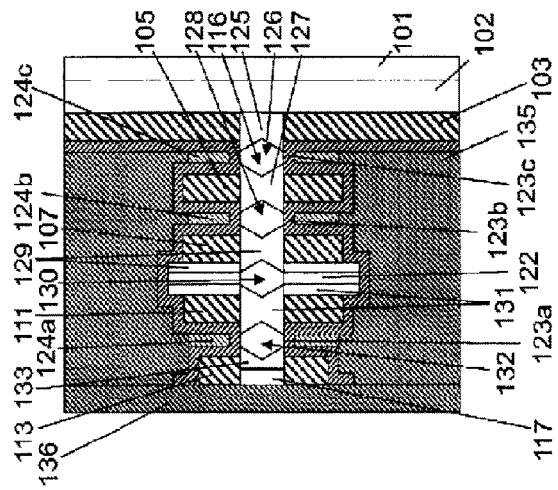
FIG. 47C is a sectional view taken along line y-y' in FIG. 47A.
Figure 47A:
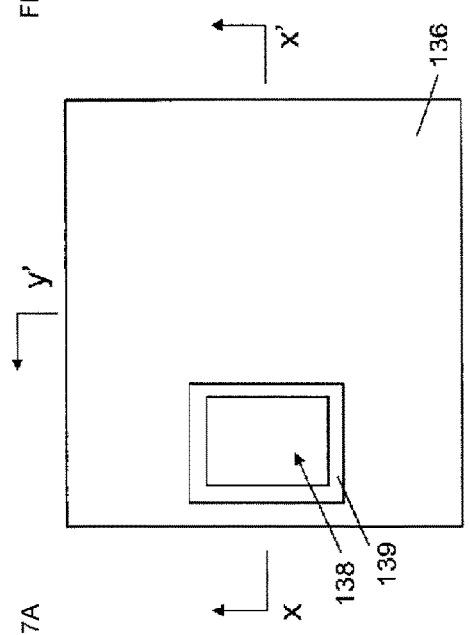
FIG. 47A is a plan view relating to a method for producing a semiconductor device according to an embodiment of the present invention.
Figure 47B:
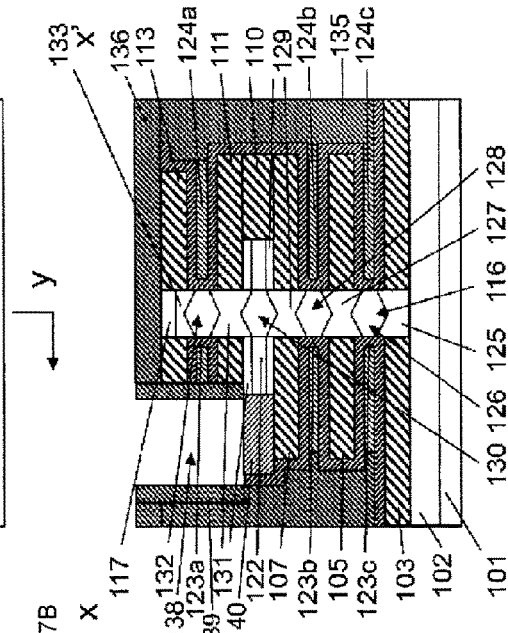
FIG. 47B is a sectional view taken along line x-x' in FIG. 47A.

As illustrated in FIGS. 47A to 47C, a silicide 140 is formed in the output terminal 122. Thus, the third first-conductivity-type silicon layer 129 and the first second-conductivity-type semiconductor layer 131 are mutually connected.

As illustrated in FIGS. 48A to 48C, metal is deposited to form a contact 200.

As illustrated in FIGS. 49A to 49C, a fifth resist 141 is formed.

As illustrated in FIGS. 50A to 50C, the second interlayer insulating film 136 and the first interlayer insulating film 135 are etched to form a contact hole 142.

As illustrated in FIGS. 51A to 51C, the fifth resist 141 is removed.

As illustrated in FIGS. 52A to 52C, a sixth resist 143 is formed.

As illustrated in FIGS. 53A to 53C, the second interlayer insulating film 136, the first interlayer insulating film 135, the fifth insulating film 113, the third gate insulating film 123a, the third gate 124a, the third gate insulating film 132a, the fourth insulating film 111, the ninth insulating film 110, the third insulating film 107, the second gate insulating film 123b, the second gate 124b, the second gate insulating film 123b, the second insulating film 105, and the first gate insulating film 123c are etched to form a contact hole 144.

As illustrated in FIGS. 54A to 54C, the sixth resist 143 is removed.

As illustrated in FIGS. 55A to 55C, metal is deposited to form a first contact 146 and a contact 145.

As illustrated in FIGS. 56A to 56C, the second interlayer insulating film 136 is etched to thereby expose the third second-conductivity-type silicon layer 117.

As illustrated in FIGS. 57A to 57C, a metal 147 is deposited.

As illustrated in FIGS. 58A to 58C, seventh resists 148, 149, 150, and 151 are formed.

As illustrated in FIGS. 59A to 59C, the metal 147 is etched to form metal wirings 147a, 147b, 147c, and 147d.

As illustrated in FIGS. 60A to 60C, the seventh resists 148, 149, 150, and 151 are removed.

Thus, a method for producing a semiconductor device according to an embodiment of the present invention has been described.

The present invention encompasses various embodiments and modifications without departing from the broad spirit and scope of the present invention. The above-described embodiments are used for explaining embodiments of the present invention and do not limit the scope of the present invention.

For example, a method for producing a semiconductor device in which the p type (including $p^+$ type) and the n type (including $n^+$ type) in the above-described embodiment are changed to the opposite conductivity types and a semiconductor device produced by this method are obviously within the technical scope of the present invention.

What is claimed is:

1. A semiconductor device comprising:
   a first pillar-shaped semiconductor on a semiconductor substrate;
   a first first-conductivity-type semiconductor layer in the first pillar-shaped semiconductor;
   a second first-conductivity-type semiconductor layer in the first pillar-shaped semiconductor;
   a third first-conductivity-type semiconductor layer in the first pillar-shaped semiconductor and located at a higher position than the first first-conductivity-type semiconductor layer;
   a first gate insulating film surrounding a first body region of the first pillar-shaped semiconductor, the first body region sandwiched between and in direct contact with the first first-conductivity-type semiconductor layer and the second first-conductivity-type semiconductor layer;
   a first gate surrounding the first gate insulating film;
   a second gate insulating film surrounding a second body region of the first pillar-shaped semiconductor, the second body region sandwiched between and in direct contact with the second first-conductivity-type semiconductor layer and the third first-conductivity-type semiconductor layer; and
   a second gate surrounding the second gate insulating film,
   wherein the first gate and the second gate are mutually connected.

2. The semiconductor device according to claim 1, further comprising:
   a fourth first-conductivity-type semiconductor layer on the semiconductor substrate;
   the first pillar-shaped semiconductor including, in sequence, the first first-conductivity-type semiconductor layer, the first body region, the second first- conductivity-type semiconductor layer, the second body region, the third first-conductivity-type semiconductor layer, a first second-conductivity-type semiconductor layer, a third body region, a second second-conductivity-type semiconductor layer, and a third second-conductivity-type semiconductor layer;
   a third gate insulating film surrounding the third body region;
   a third gate surrounding the third gate insulating film;
   an output terminal connected to the third first-conductivity-type semiconductor layer and the first second-conductivity-type semiconductor layer; and
   a first contact connecting the first gate, the second gate, and the third gate connected.

3. The semiconductor device according to claim 2, wherein the output terminal comprises a semiconductor and, the output terminal is integral with the third first-conductivity-type semiconductor layer and the first second-conductivity-type semiconductor layer.

4. The semiconductor device according to claim 2, wherein the first gate insulating film further overlies an upper surface and a lower surface of the first gate, the second gate insulating film further overlies an upper surface and a lower surface of the second gate, and the third gate insulating film further overlies an upper surface and a lower surface of the third gate.

5. The semiconductor device according to claim 2, further comprising a first connection region between the third first-conductivity-type semiconductor layer and the first second-conductivity-type semiconductor layer,
   wherein the first connection region is a semiconductor material in the first pillar-shaped semiconductor.

6. The semiconductor device according to claim 2, further comprising:
   a first insulating film surrounding the first first-conductivity-type semiconductor layer, a second insulating film surrounding the second first-conductivity-type semiconductor layer, and a third insulating film surrounding the third first-conductivity-type semiconductor layer,
   the first insulating film containing the same impurity as the first first-conductivity-type semiconductor layer,
   the second insulating film containing the same impurity as the second first-conductivity-type semiconductor layer,
   the third insulating film containing the same impurity as the third first-conductivity-type semiconductor layer; and
   a fourth insulating film surrounding the first second-conductivity-type semiconductor layer and a fifth insulating film surrounding the second second-conductivity-type semiconductor layer,
   the fourth insulating film containing the same impurity as the first second-conductivity-type semiconductor layer,
   the fifth insulating film containing the same impurity as the second second-conductivity-type semiconductor layer.

* * * * *